US012785661B2

(12) United States Patent
Kuroyanagi et al.

(10) Patent No.: US 12,785,661 B2
(45) Date of Patent: Nov. 3, 2026

(54) HIGH-FREQUENCY MODULE

(71) Applicant: Murata Manufacturing Co., Ltd., Kyoto (JP)

(72) Inventors: Takuma Kuroyanagi, Kyoto (JP); Takanori Ito, Kyoto (JP); Hidetaka Takahashi, Kyoto (JP); Hiroyuki Kani, Kyoto (JP)

(73) Assignee: Murata Manufacturing Co., Ltd., Kyoto (JP)

(*) Notice: Subject to any disclaimer, the term of this patent is extended or adjusted under 35 U.S.C. 154(b) by 98 days.

(21) Appl. No.: 18/960,361

(22) Filed: Nov. 26, 2024

(65) Prior Publication Data

US 2025/0112623 A1 Apr. 3, 2025

Related U.S. Application Data

(63) Continuation of application No. PCT/JP2023/015275, filed on Apr. 17, 2023.

(30) Foreign Application Priority Data

Jun. 2, 2022 (JP) ................................ 2022-090490

(51) Int. Cl.
*H03H 9/64* (2006.01)
*H03H 9/02* (2006.01)
*H03H 9/25* (2006.01)

(52) U.S. Cl.
CPC ...... *H03H 9/6483* (2013.01); *H03H 9/02574* (2013.01); *H03H 9/25* (2013.01)

(58) Field of Classification Search
CPC .......... H03H 9/02; H03H 9/0538; H03H 9/10; H03H 9/25; H03H 9/64; H03H 9/72
See application file for complete search history.

(56) References Cited

U.S. PATENT DOCUMENTS 7,453,703 B2 * 11/2008 Sugiyama ............ H03H 9/0542 257/E23.125
9,929,770 B2 * 3/2018 Onodera .............. H03H 9/6483
(Continued)

FOREIGN PATENT DOCUMENTS

JP 2018-107509 A 7/2018
JP 2019-186726 A 10/2019
(Continued)

OTHER PUBLICATIONS

International Search Report for PCT/JP2023/015275 dated Jun. 20, 2023.

*Primary Examiner* — Andrea Lindgren Baltzell
*Assistant Examiner* — Alan Wong
(74) *Attorney, Agent, or Firm* — McDonald Hopkins LLC

(57) ABSTRACT

In a high-frequency module, a first chip includes one of a plurality of first acoustic wave resonators of a first filter a mounting substrate. A second chip includes one of a plurality of second acoustic wave resonators of a second filter. The second chip is on a side of the first chip opposite to the mounting substrate side. The first chip has a first main surface on the second chip side and a second main surface on the mounting substrate side. The second chip includes a third main surface on the first chip side and a fourth main surface on a side opposite to the first chip side. A first circuit element related to the first filter is on the second main surface side of the first chip. A second circuit element related to the second filter is disposed on the fourth main surface side of the second chip.

20 Claims, 39 Drawing Sheets

(56) References Cited

U.S. PATENT DOCUMENTS

| | | | | |
|---|---|---|---|---|
| 9,948,726 | B2 * | 4/2018 | Narayanan | H04L 69/40 |
| 10,284,179 | B2 * | 5/2019 | Takamine | H03H 7/38 |
| 10,582,609 | B2 * | 3/2020 | Yun | H05K 3/32 |
| 10,743,416 | B2 * | 8/2020 | Ito | H03H 9/64 |
| 11,057,015 | B2 * | 7/2021 | Kawasaki | H03H 9/02543 |
| 11,264,968 | B2 * | 3/2022 | Sekine | H03H 3/08 |
| 11,437,563 | B2 * | 9/2022 | Park | H10N 30/20 |
| 12,290,000 | B2 * | 4/2025 | Hamasaki | H03H 3/08 |
| 12,395,195 | B2 * | 8/2025 | Uejima | H01F 17/00 |
| 2025/0247070 | A1 * | 7/2025 | Bader | H03H 3/02 |

FOREIGN PATENT DOCUMENTS

| | | | |
|---|---|---|---|
| JP | 2022-072241 | A | 5/2022 |
| WO | 2018/123447 | A1 | 7/2018 |
| WO | 2018/143044 | A1 | 8/2018 |
| WO | 2022/102197 | A1 | 5/2022 |

* cited by examiner

HIGH-FREQUENCY MODULE

CROSS REFERENCE TO RELATED APPLICATION

This is a continuation of International Application No. PCT/JP2023/015275 filed on Apr. 17, 2023 which claims priority from Japanese Patent Application No. 2022-090490 filed on Jun. 2, 2022. The contents of these applications are incorporated herein by reference in their entireties.

BACKGROUND OF THE DISCLOSURE

Field of the Disclosure

The present disclosure generally relates to a high-frequency module, and more specifically, to a high-frequency module including a plurality of chips.

Description of the Related Art

Japanese Unexamined Patent Application Publication No. 2018-107509 discloses an acoustic wave device (high-frequency module) including a multilayer substrate (mounting substrate), a first acoustic wave filter chip, a second acoustic wave filter chip, a first inductor, and a second inductor. The first inductor is provided corresponding to the first acoustic wave filter chip. The second inductor is provided corresponding to the second acoustic wave filter chip.

The first acoustic wave filter chip and the second acoustic wave filter chip are flip-chip mounted on the multilayer substrate. In the acoustic wave device, at least a part of the first inductor is formed on the first acoustic wave filter chip. In addition, in the acoustic wave device, at least a part of the second inductor is formed on the multilayer substrate.

BRIEF SUMMARY OF THE DISCLOSURE

In the high-frequency module, it is desired to suppress a deterioration in characteristics while achieving reduction in size.

A possible benefit of the present disclosure is to provide a high-frequency module capable of suppressing a deterioration in characteristics while achieving reduction in size.

A high-frequency module according to one aspect of the present disclosure includes a mounting substrate, a first chip, and a second chip. The mounting substrate has a main surface. The first chip includes at least one of a plurality of first acoustic wave resonators of a first filter. The first chip is disposed on the mounting substrate. The second chip includes at least one of a plurality of second acoustic wave resonators of a second filter. The second chip is disposed on a side of the first chip opposite to a mounting substrate side. The first chip has a first main surface on a second chip side and a second main surface on the mounting substrate side. The second chip has a third main surface on a first chip side and a fourth main surface on a side opposite to the first chip side. A first circuit element related to the first filter is disposed on a second main surface side of the first chip. A second circuit element related to the second filter is disposed on a fourth main surface side of the second chip.

A high-frequency module according to another aspect of the present disclosure includes a mounting substrate, a first chip, a second chip, an electronic component, a wiring portion, and a resin layer. The mounting substrate has a main surface. The first chip includes at least one of a plurality of first acoustic wave resonators of a first filter. The first chip is disposed on the main surface of the mounting substrate. The second chip includes at least one of a plurality of second acoustic wave resonators of a second filter. The second chip is disposed on a side of the first chip opposite to a mounting substrate side. The electronic component is disposed on the main surface of the mounting substrate. The electronic component has a first electrode that is located on a main surface side of the mounting substrate and a second electrode that is located on a side opposite to the main surface side. The wiring portion connects the second filter and the electronic component to each other. The first chip has a first main surface on a second chip side and a second main surface on the mounting substrate side. The second chip has a third main surface on a first chip side and a fourth main surface on a side opposite to the first chip side. A circuit element related to the first filter is disposed on the second main surface of the first chip. The resin layer is disposed on the main surface of the mounting substrate. The resin layer covers at least a part of an outer peripheral surface of the first chip, at least a part of an outer peripheral surface of the second chip, and at least a part of an outer peripheral surface of the electronic component. The wiring portion includes a conductor pattern portion. The conductor pattern portion is provided across the fourth main surface of the second chip, a main surface of the resin layer on a side opposite to the mounting substrate side, and the second electrode of the electronic component.

In the high-frequency module according to the above aspects of the present disclosure, it is possible to suppress the deterioration of the characteristics while achieving reduction in size.

DETAILED DESCRIPTION OF THE DISCLOSURE

Figure 1:
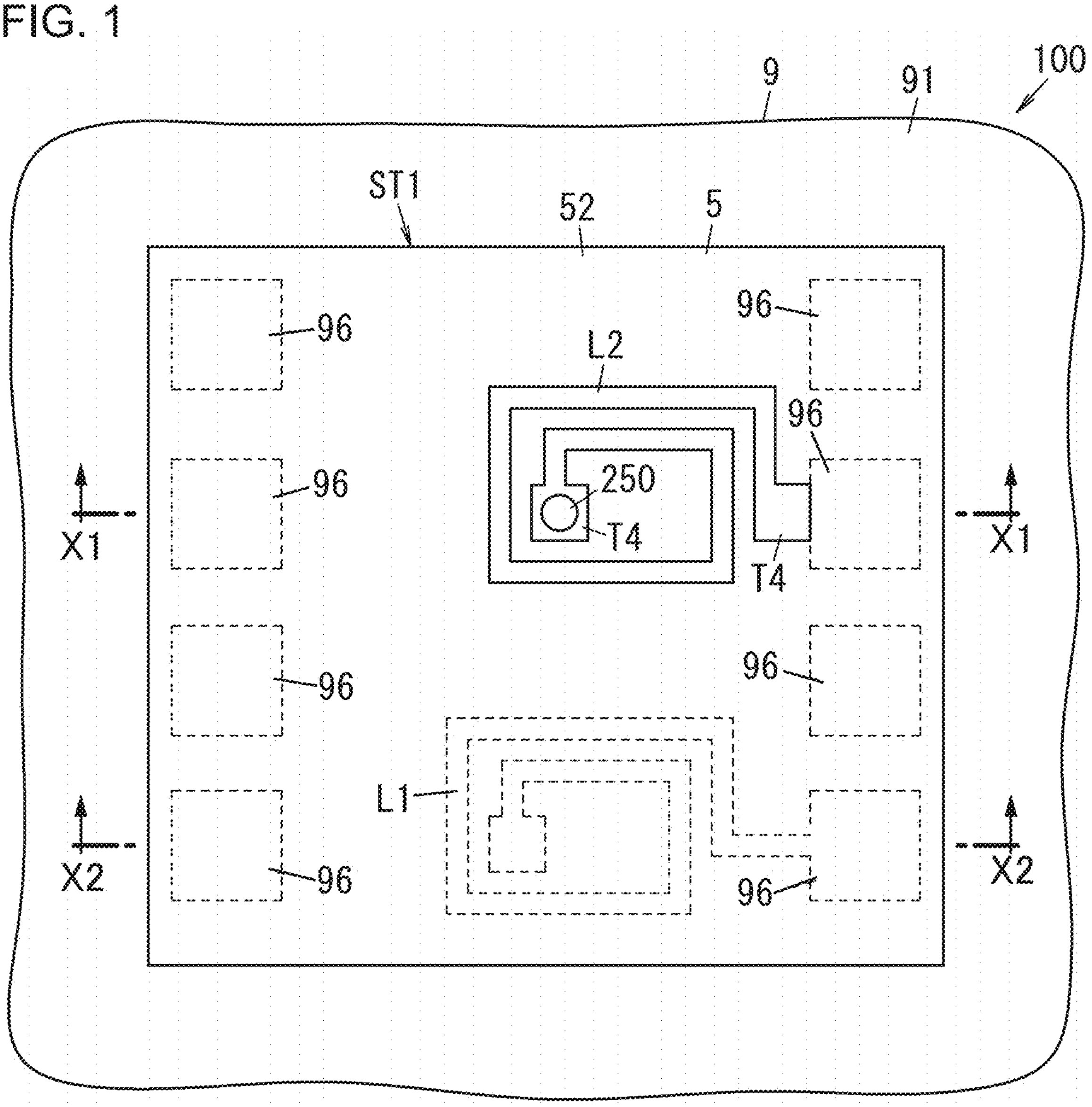
FIG. 1 is a plan view of a high-frequency module according to Embodiment 1.

The drawings referred to in Embodiments 1 to 19 and the like as follows are all schematic drawings, and the ratios of the respective sizes and thicknesses of the constituent elements in the drawings do not necessarily reflect the actual dimensional ratios.

Embodiment 1

Hereinafter, a high-frequency module 100 according to Embodiment 1 will be described with reference to FIGS. 1, 2, 3, 4A, and 4B.

(1) Outline

Figure 2:
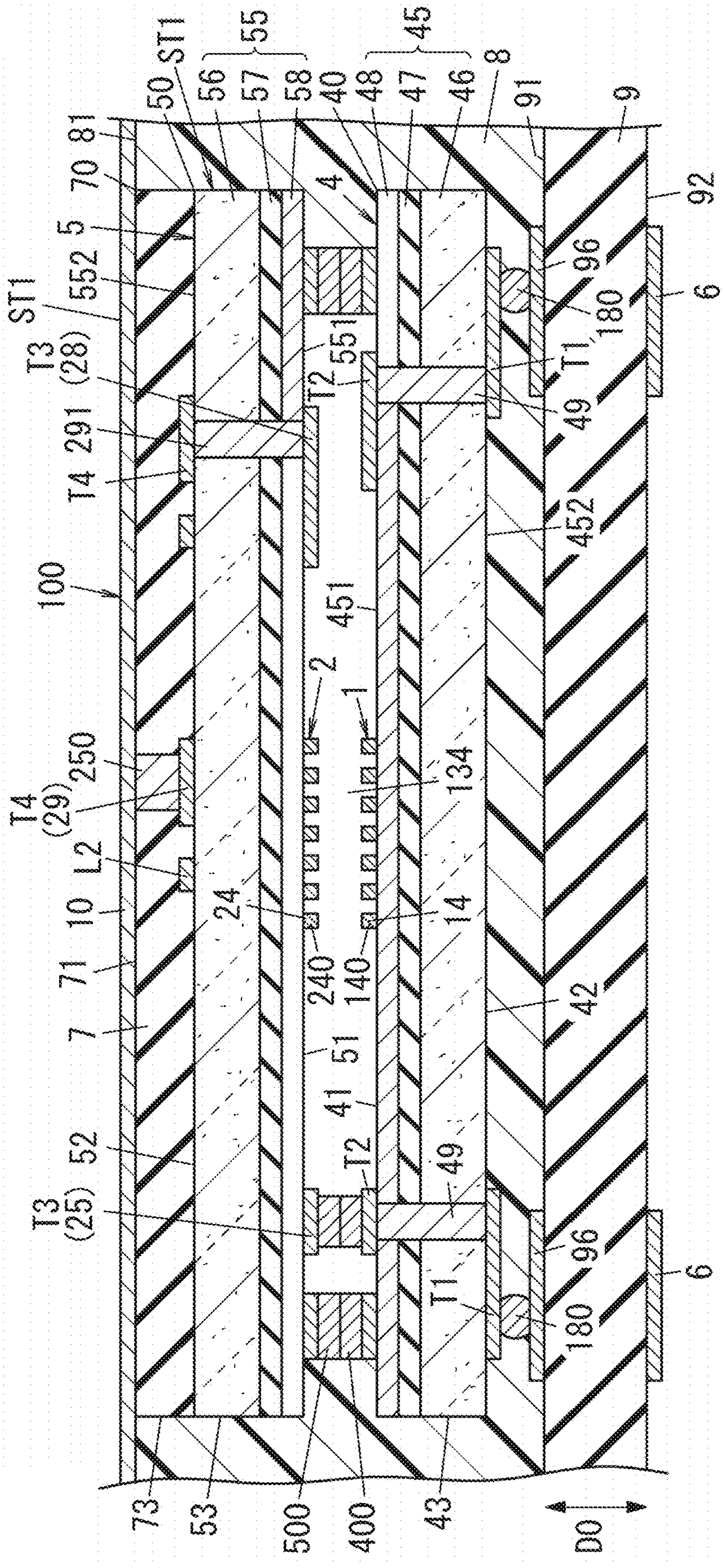
FIG. 2 is a cross-sectional view of the high-frequency module taken along line X1-X1 in FIG. 1.
Figure 3:
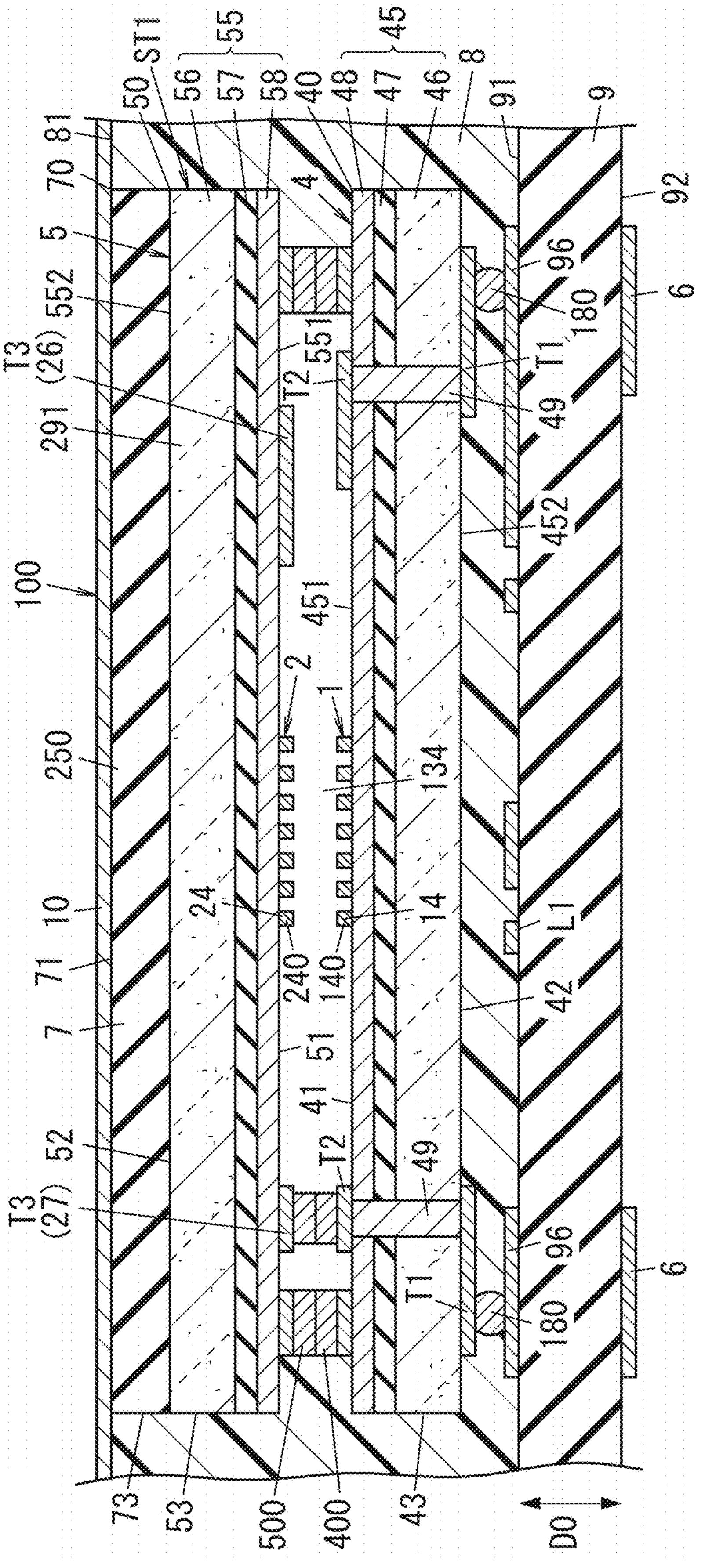
FIG. 3 is a cross-sectional view of the high-frequency module taken along line X2-X2 in FIG. 1.

As illustrated in FIGS. 2 and 3, the high-frequency module 100 according to Embodiment 1 includes a mounting substrate 9, a first chip 4, and a second chip 5. The mounting substrate 9 has a main surface 91. The first chip 4 includes a plurality of (for example, eight) first acoustic wave resonators 14 of a first filter 1 (see FIG. 4A). The first chip 4 is disposed on the main surface 91 of the mounting substrate 9. The second chip 5 includes a plurality (for example, eight) of second acoustic wave resonators 24 of a second filter 2 (see FIG. 4B) different from the first filter 1. The second chip 5 is disposed on a side of the first chip 4 opposite to the mounting substrate 9 side. That is, the high-frequency module 100 has a stack structure ST1 including the first chip 4 and the second chip 5 stacked on the first chip 4. The first chip 4 has a first main surface 41 on the second chip 5 side and a second main surface 42 on the mounting substrate 9 side. The second chip 5 has a third main surface 51 on the first chip 4 side and a fourth main surface 52 on a side opposite to the first chip 4 side. The first filter 1 and the second filter 2 are filters having different frequency bands as pass bands. Each of the first filter 1 and the second filter 2 is a transmission filter, a reception filter, or a transmission/reception filter. The pass band of the first filter 1 corresponds to a first communication band, and the pass band of the second filter 2 corresponds to a second communication band.

In addition, the high-frequency module 100 includes a plurality of external connection terminals 6, an insulating layer 7, a resin layer 8, and a metal electrode layer 10. In FIG. 1, the insulating layer 7, the resin layer 8, and the metal electrode layer 10 are not illustrated. In addition, the high-frequency module 100 may further include a plurality of electronic components (not illustrated) disposed on the first main surface 91 of the mounting substrate 9, in addition to the first chip 4. The plurality of electronic components include, for example, a power amplifier, a low noise amplifier, a switch, a controller, circuit elements of an output matching circuit (for example, a chip inductor and a chip capacitor), circuit elements of an input matching circuit (for example, a chip inductor and a chip capacitor), a multiplexer, and a coupler. The output matching circuit is connected to an output terminal of the power amplifier. The input matching circuit is connected to an input terminal of the low noise amplifier. The controller controls at least the power amplifier. In addition, the high-frequency module 100 further includes a plurality of filters other than the first filter 1 and the second filter 2. Each of the plurality of filters is, for example, a surface acoustic wave filter, a bulk acoustic wave filter, or an LC filter. The circuit element of the output matching circuit is not limited to the electronic component disposed on the first main surface 91 of the mounting substrate 9, and may be a circuit element incorporated in the mounting substrate 9. In addition, the circuit element of the input matching circuit is not limited to the electronic component disposed on the first main surface 91 of the mounting substrate 9, and may be a circuit element incorporated in the mounting substrate 9.

The plurality of external connection terminals 6 are disposed on a second main surface 92 of the mounting substrate 9 opposite to a main surface 91 (hereinafter, also referred to as a first main surface 91). The insulating layer 7 is disposed on the fourth main surface 52 of the second chip 5. The resin layer 8 is disposed on the first main surface 91 of the mounting substrate 9 and covers an outer peripheral surface 43 of the first chip 4, an outer peripheral surface 53 of the second chip 5, and an outer peripheral surface 73 of the insulating layer 7.

For example, the high-frequency module 100 is used in a communication device. For example, the communication device is a mobile phone (for example, a smart phone). Meanwhile, without being limited thereto, for example, the communication device may be a wearable terminal (for example, a smart watch). The high-frequency module 100 is, for example, a module that is compatible with a fourth generation mobile communication (4G) standard, a fifth generation mobile communication (5G) standard, or the like. For example, the 4G standard is a third generation partnership project (3GPP: registered trademark) long term evolution (LTE: registered trademark) standard. The 5G standard is, for example, a 5G new radio (NR). The high-frequency module 100 is, for example, a module that is compatible with carrier aggregation and dual connectivity. The high-frequency module 100 may also be compatible with two uplink carrier aggregation in which two frequency bands are used simultaneously in the uplink.

The communication device includes the high-frequency module 100 and a signal processing circuit to which the high-frequency module 100 is connected. The communication device further includes an antenna. The communication device further includes a circuit board (not illustrated) on which the high-frequency module 100 is mounted. The circuit board is, for example, a printed wiring board. The circuit board includes a ground electrode to which a ground potential is applied. The high-frequency module 100 is configured, for example, to be able to amplify a reception signal inputted from the antenna and output the amplified reception signal to the signal processing circuit. In addition, the high-frequency module 100 is configured to, for example, be able to amplify a transmission signal inputted from the signal processing circuit and output the amplified transmission signal to the antenna. The high-frequency module 100 is controlled by, for example, the signal processing circuit of the communication device.

(2) Details

Hereinafter, the high-frequency module 100 according to Embodiment 1 will be described in more detail with reference to FIGS. 1 to 3, 4A, and 4B.

Figure 4A:
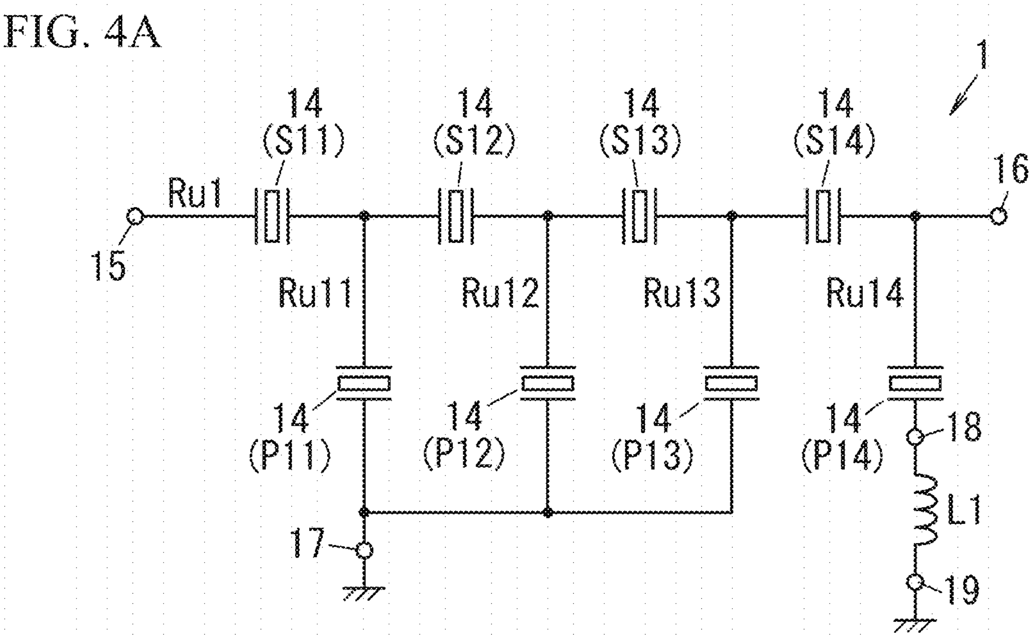
FIG. 4A is a circuit diagram of a first filter in the high-frequency module.

(2.1) Circuit Configuration of First Filter and Second Filter in High-Frequency Module As illustrated in FIG. 4A, the first filter 1 has a pair of input/output terminals (a first input/output terminal 15 and a second input/output terminal 16) and a plurality of (in the example of FIG. 4A, eight) first acoustic wave resonators 14. The first filter 1 is, for example, a ladder filter. The eight first acoustic wave resonators 14 include four series arm resonators (first series arm resonators) S11 to S14 and four parallel arm resonators (first parallel arm resonators) P11 to P14. The four series arm resonators S11 to S14 are provided on a signal path Ru1 (hereinafter, also referred to as a first signal path Ru1) between the first input/output terminal 15 and the second input/output terminal 16. The four series arm resonators S11 to S14 are connected in series on the first signal path Ru1. In the first filter 1, on the first signal path Ru1, the series arm resonator S11, the series arm resonator S12, the series arm resonator S13, and the series arm resonator S14 are arranged in the order of the series arm resonator S11, the series arm resonator S12, the series arm resonator S13, and the series arm resonator S14 from the first input/output terminal 15 side. The parallel arm resonator P11 is provided on a parallel arm path Ru11 between a path between the series arm resonator S11 and the series arm resonator S12 in the first signal path Ru1 and the ground. The parallel arm resonator P12 is provided on a parallel arm path Ru12 between a path between the series arm resonator S12 and the series arm resonator S13 in the first signal path Ru1 and the ground. The parallel arm resonator P13 is provided on a parallel arm path Ru13 between a path between the series arm resonator S13 and the series arm resonator S14 in the first signal path Ru1 and the ground. The parallel arm resonator P14 is provided on a parallel arm path Ru14 between a path between the series arm resonator S14 and the second input/output terminal 16 in the first signal path Ru1 and the ground.

In addition, the first filter 1 includes an inductor L1 (hereinafter, also referred to as a first inductor L1). The first inductor L1 is connected between the parallel arm resonator P14 and a ground (first ground). More specifically, the first inductor L1 is connected to a parallel arm resonator P14 closest to the second input/output terminal 16 among the plurality of parallel arm resonators P11 to P14, and the ground. The "parallel arm resonator P14 closest to the second input/output terminal 16" is a parallel arm resonator P14 connected to the second input/output terminal 16 without the other first acoustic wave resonators 14 interposed therebetween. In other words, the "parallel arm resonator P14 closest to the second input/output terminal 16" is an electrically parallel arm resonator P14 closest to the second input/output terminal 16 regardless of the physical distance.

The first filter 1 includes a plurality of circuit elements. The plurality of circuit elements include eight first acoustic wave resonators 14, a wiring portion corresponding to the first signal path Ru1, a plurality of wiring portions corresponding to four parallel arm paths Ru11 to Ru14, and a first inductor L1.

Figure 4B:
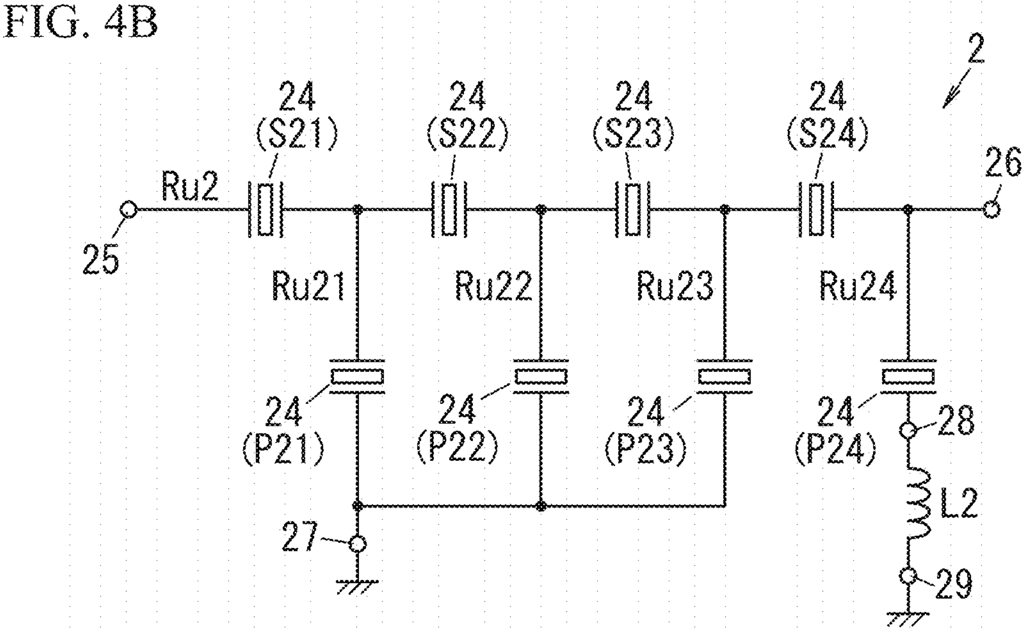
FIG. 4B is a circuit diagram of a second filter in the high-frequency module.

As illustrated in FIG. 4B, the second filter 2 has a pair of input/output terminals (a third input/output terminal 25 and a fourth input/output terminal 26) and a plurality of (in the illustrated example, eight) second acoustic wave resonators 24. The second filter 2 is, for example, a ladder filter. The eight second acoustic wave resonators 24 include four series arm resonators (second series arm resonators) S21 to S24 and four parallel arm resonators (second parallel arm resonators) P21 to P24. The four series arm resonators S21 to S24 are provided on a signal path Ru2 (hereinafter, also referred to as a second signal path Ru2) between the third input/output terminal 25 and the fourth input/output terminal 26. The four series arm resonators S21 to S24 are connected in series on the second signal path Ru2. In the second filter 2, on the second signal path Ru2, the series arm resonator S21, the series arm resonator S22, the series arm resonator S23, and the series arm resonator S24 are arranged in the order of the series arm resonator S21, the series arm resonator S22, the series arm resonator S23, and the series arm resonator S24 from the third input/output terminal 25 side. The parallel arm resonator P21 is provided on a parallel arm path Ru21 between a path between the series arm resonator S21 and the series arm resonator S22 in the second signal path Ru2 and the ground. The parallel arm resonator P22 is provided on a parallel arm path Ru22 between a path between the series arm resonator S22 and the series arm resonator S23 in the second signal path Ru2 and the ground. The parallel arm resonator P23 is provided on a parallel arm path Ru23 between a path between the series arm resonator S23 and the series arm resonator S24 in the second signal path Ru2 and the ground. The parallel arm resonator P24 is provided on a parallel arm path Ru24 between a path between the series arm resonator S24 and the fourth input/output terminal 26 in the second signal path Ru2 and the ground.

In addition, the second filter 2 includes an inductor L2 (hereinafter, also referred to as a second inductor L2). The second inductor L2 is connected between the parallel arm resonator P24 and a ground (second ground). More specifically, the second inductor L2 is connected between a parallel arm resonator P24 closest to the fourth input/output terminal 26 among the plurality of parallel arm resonators P21 to P24, and the ground. The "parallel arm resonator P24 closest to the fourth input/output terminal 26" is a parallel arm resonator P24 connected to the fourth input/output terminal 26 without the other second acoustic wave resonators 24 disposed therebetween. In other words, the "parallel arm resonator P24 closest to the fourth input/output terminal 26" is an electrically closest parallel arm resonator P24 to the fourth input/output terminal 26 regardless of the physical distance.

The second filter 2 includes a plurality of circuit elements. The plurality of circuit elements include eight second acoustic wave resonators 24, a wiring portion corresponding to the second signal path Ru2, a plurality of wiring portions corresponding to four parallel arm paths Ru21 to Ru24, and a second inductor L2.

(2.2) Structure of High-Frequency Module

Hereinafter, a structure of the high-frequency module 100 will be described with reference to FIGS. 1 to 3.

(2.2.1) Mounting Substrate

As illustrated in FIG. 2, the mounting substrate 9 has a first main surface 91 and a second main surface 92 facing each other in a thickness direction D0 of the mounting substrate 9. Here, "facing" means facing geometrically rather than physically. In a plan view from the thickness direction D0 of the mounting substrate 9, the outer edge of the mounting substrate 9 has, for example, a quadrangular shape. Further, the mounting substrate 9 has an outer peripheral surface. The outer peripheral surface of the mounting substrate 9 includes, for example, four side surfaces that connect an outer edge of the first main surface 91 and an outer edge of the second main surface 92 of the mounting substrate 9 to each other, and does not include the first main surface 91 and the second main surface 92. That is, the mounting substrate 9 is a multilayer substrate including a plurality of dielectric layers and a plurality of conductive layers. The plurality of dielectric layers and the plurality of conductive layers are laminated in the thickness direction D0 of the mounting substrate 9. The plurality of conductive layers are formed in a predetermined pattern determined for each layer. Each of the plurality of conductive layers includes one or a plurality of conductor portions in a plane perpendicular to the thickness direction D0 of the mounting substrate 9. A material of each conductive layer is, for example, copper. The plurality of conductive layers include a ground layer. In the high-frequency module 100, the ground layer of the mounting substrate 9 and the external ground terminal included in the plurality of external connection terminals 6 are electrically connected to each other with a via conductor or the like of the mounting substrate 9 interposed therebetween. The mounting substrate 9 is, for example, a low temperature co-fired ceramics (LTCC) substrate. The mounting substrate is not limited to the LTCC substrate, and may be, for example, a printed wiring board, a high temperature co-fired ceramics (HTCC) substrate, or a resin multilayer substrate.

Further, the mounting substrate 9 is not limited to the LTCC substrate, and may be, for example, a wiring structure. The wiring structure is, for example, a multilayer structure. The multilayer structure includes at least one insulating layer and at least one conductive layer. The insulating layer is formed in a predetermined pattern. In a case where a plurality of insulating layers are provided, the plurality of insulating layers are formed in a predetermined pattern determined for each layer. The conductive layer is formed in one or more predetermined patterns different from the predetermined pattern of the insulating layer. In a case where a plurality of conductive layers are provided, the plurality of conductive layers are formed in one or more predetermined pattern determined for each layer. The conductive layer may include one or a plurality of rewiring portions. In the wiring structure, a first surface of two surfaces facing each other in the thickness direction of the multilayer structure is the first main surface 91 of the mounting substrate 9, and a second surface is the second main surface 92 of the mounting substrate 9. The wiring structure may be, for example, an interposer. The interposer may be an interposer using a silicon substrate or may be a substrate having multiple layers.

The first main surface 91 and the second main surface 92 of the mounting substrate 9 are separated from each other in the thickness direction D0 of the mounting substrate 9, and intersect the thickness direction D0 of the mounting substrate 9. The first main surface 91 of the mounting substrate 9 is, for example, perpendicular to the thickness direction D0 of the mounting substrate 9, and may include, for example, a side surface or the like of a conductor portion as a surface that is not perpendicular to the thickness direction D0. In addition, for example, the second main surface 92 of the mounting substrate 9 is perpendicular to the thickness direction D0 of the mounting substrate 9, but may include, for example, a side surface of the conductor portion or the like, as a surface that is not perpendicular to the thickness direction D0. Further, the first main surface 91 and the second main surface 92 of the mounting substrate 9 may be formed with fine unevenness, a recess portion, or a projection portion. For example, when a recess portion is formed on the first main surface 91 of the mounting substrate 9, the inner surface of the recess portion is included in the first main surface 91.

(2.2.2) First Chip

As illustrated in FIGS. 2 and 3, the first chip 4 is disposed on the first main surface 91 of the mounting substrate 9. The expression "the first chip 4 is disposed on the first main surface 91 of the mounting substrate 9" includes that the first chip 4 is mounted (mechanically connected) on the first main surface 91 of the mounting substrate 9 and that the first chip 4 is electrically connected to the mounting substrate 9 (an appropriate conductor portion thereof). The first chip 4 has a plurality of (for example, eight) first terminal electrodes T1 connected to the mounting substrate 9 and a plurality of (for example, four) second terminal electrodes T2 connected to the second chip 5. The eight first terminal electrodes T1 include, for example, a first input/output terminal 15 (see FIG. 4A), a second input/output terminal 16

(see FIG. 4A), a first ground terminal 17 (see FIG. 4A), and a first connection terminal 18 (see FIG. 4A) of the first filter 1. In addition, the eight first terminal electrodes T1 include a first terminal, a second terminal, and a third terminal that are connected to the third input/output terminal 25, the fourth input/output terminal 26, and the second ground terminal 27 of the second filter 2, respectively. The first connection terminal 18 is a terminal to which one end of the first inductor L1 is connected. The other end of the first inductor L1 is connected to the first ground with a terminal 19 (see FIG. 4A) interposed therebetween. In the first chip 4, the eight first terminal electrodes T1 are joined to corresponding eight conductor portions 96 (see FIG. 1) of the plurality of conductor portions of the mounting substrate 9 by a joining portion 180. The material of the joining portion 180 is, for example, a solder.

In a plan view from the thickness direction D0 of the mounting substrate 9, an outer edge 40 of the first chip 4 has, for example, a quadrangular shape. The first chip 4 has a plurality of (eight) first acoustic wave resonators 14 of the first filter 1. The first filter 1 is a surface acoustic wave filter that uses surface acoustic waves. The first chip 4 includes a first substrate 45 and a plurality of first functional electrodes 140 that are provided on the first substrate 45 and that each form a part of the plurality of first acoustic wave resonators 14. In the high-frequency module 100, each of the plurality of first functional electrodes 140 is an interdigital transducer (IDT) electrode. Therefore, each of the plurality of first acoustic wave resonators 14 is a surface acoustic wave (SAW) resonator.

The first substrate 45 includes a first piezoelectric layer 48 and a first high acoustic velocity member 46. The first high acoustic velocity member 46 is a high acoustic velocity support substrate located on a side opposite to the first functional electrode 140 with the first piezoelectric layer 48 interposed therebetween. In the first high acoustic velocity member 46, an acoustic velocity of a bulk wave propagating through the first high acoustic velocity member 46 is faster than an acoustic velocity of an acoustic wave propagating through the first piezoelectric layer 48. In this case, the bulk wave propagating through the first high acoustic velocity member 46 is a bulk wave having the lowest acoustic velocity among the plurality of bulk waves propagating through the first high acoustic velocity member 46. The first substrate 45 further includes a first low acoustic velocity film 47 interposed between the first high acoustic velocity member 46 and the first piezoelectric layer 48. The first low acoustic velocity film 47 is a film in which the acoustic velocity of the bulk wave propagating through the first low acoustic velocity film 47 is slower than the acoustic velocity of the bulk wave propagating through the first piezoelectric layer 48.

The material of the first piezoelectric layer 48 includes, for example, lithium tantalate or lithium niobate.

The material of the first high acoustic velocity member 46 includes, for example, at least one material selected from the group consisting of silicon, aluminum nitride, aluminum oxide, silicon carbide, silicon nitride, sapphire, lithium tantalate, lithium niobate, crystal, alumina, zirconia, cordierite, mullite, steatite, forsterite, magnesia, and diamond. The first high acoustic velocity member 46 is, for example, a silicon substrate.

The material of the first low acoustic velocity film 47 includes, for example, silicon oxide. The material of the first low acoustic velocity film 47 is not limited to silicon oxide. The material of the first low acoustic velocity film 47 may be, for example, glass, silicon oxynitride, tantalum oxide, a compound in which fluorine, carbon, or boron is added to silicon oxide, or a material having each of the above materials as a main component.

In the first chip 4, the first substrate 45 has a first main surface 451 and a second main surface 452. In the first chip 4, a plurality of first functional electrodes 140 are disposed on a first main surface 451 of the first substrate 45. In the first chip 4, a plurality of first terminal electrodes T1 are disposed on the second main surface 452 of the first substrate 45. That is, in the first chip 4, the first input/output terminal 15 (see FIG. 4A), the second input/output terminal 16 (see FIG. 4A), the first ground terminal 17 (see FIG. 4A), and the first connection terminal 18 (see FIG. 4A) of the first filter 1 are disposed on the second main surface 452 of the first substrate 45. In addition, in the first chip 4, a first terminal connected to the third input/output terminal 25 of the second filter 2, a second terminal connected to the fourth input/output terminal 26, and a third terminal connected to the second ground terminal 27 are disposed on the second main surface 452 of the first substrate 45.

The first chip 4 has a plurality of through-wiring portions 49. The plurality of through-wiring portions 49 include a first through-wiring portion, a second through-wiring portion, a first ground through-wiring portion, and a first connection through-wiring portion. For example, in a case where the material of the first high acoustic velocity member 46 is silicon, the first chip 4 may have an insulating film interposed between the plurality of through-wiring portions 49 and the first substrate 45. The material of the insulating film includes, for example, silicon oxide. The first chip 4 includes a first through-wiring portion connected to the first input/output terminal 15 and a first wiring portion between the first through-wiring portion and the series arm resonator S11, as a wiring portion between the first input/output terminal 15 and the series arm resonator S11. The first through-wiring portion penetrates the first substrate 45 in the thickness direction. The first wiring portion is disposed on a first main surface 451 of the first substrate 45. A part of the first wiring portion overlaps the first through-wiring portion. In addition, the first chip 4 includes a second through-wiring portion connected to the second input/output terminal 16, and a second wiring portion between the second through-wiring portion and the series arm resonator S14, as a wiring portion between the second input/output terminal 16 and the series arm resonator S14. The second through-wiring portion penetrates in the thickness direction of the first substrate 45. The second wiring portion is disposed on the first main surface 451 of the first substrate 45. A part of the second wiring portion overlaps the second through-wiring portion. In addition, the first chip 4 includes, as a wiring portion between the first ground terminal 17 and the connection points of the three parallel arm resonators P11, P12, and P13, a first ground through-wiring portion connected to the first ground terminal 17, and a first ground wiring portion between the first ground through-wiring portion and the connection points of the three parallel arm resonators P11, P12, and P13. The first ground through-wiring portion penetrates the first substrate 45 in the thickness direction. The first ground wiring portion is disposed on the first main surface 451 of the first substrate 45. A part of the first ground through-wiring portion overlaps the first ground through-via wiring portion. In addition, the first chip 4 includes a first connection through-wiring portion connected to the first connection terminal 18, and a first connection wiring portion between the first connection through-wiring portion and the parallel arm resonator P14, as a wiring portion between the first connection terminal 18 and the parallel arm resonator P14. The first connection through-wiring portion penetrates in a thickness direction of the first substrate 45. The first connection wiring portion is disposed on the first main surface 451 of the first substrate 45. A part of the first connection wiring portion overlaps the first connection through-wiring portion.

(2.2.3) Second Chip

As illustrated in FIGS. 2 and 3, the second chip 5 is disposed on a side of the first chip 4 opposite to the mounting substrate 9 side. In other words, the second chip 5 is stacked on the first chip 4. More specifically, the second chip 5 is stacked on the first main surface 41 of the first chip 4.

In a plan view from the thickness direction D0 of the mounting substrate 9, the outer edge 50 of the second chip 5 has, for example, a quadrangular shape. The second chip 5 has a plurality (eight) of second acoustic wave resonators 24 of the second filter 2. The second filter 2 is a surface acoustic wave filter that uses a surface acoustic wave. The second chip 5 includes a second substrate 55 and a plurality of second functional electrodes 240 that are provided on the second substrate 55 and that constitute a part of each of the plurality of second acoustic wave resonators 24. In the high-frequency module 100, each of the plurality of second functional electrodes 240 is an IDT electrode. Therefore, each of the plurality of second acoustic wave resonators 24 is a SAW resonator.

The second substrate 55 includes a second piezoelectric layer 58 and a second high acoustic velocity member 56. The second high acoustic velocity member 56 is a high acoustic velocity support substrate located on a side opposite to the second functional electrode 240 with the second piezoelectric layer 58 interposed therebetween. In the second high acoustic velocity member 56, an acoustic velocity of a bulk wave propagating through the second high acoustic velocity member 56 is faster than an acoustic velocity of an acoustic wave propagating through the second piezoelectric layer 58. In this case, the bulk wave propagating through the second high acoustic velocity member 56 is a bulk wave having the lowest acoustic velocity among the plurality of bulk waves propagating through the second high acoustic velocity member 56. The second substrate 55 further includes a second low acoustic velocity film 57 interposed between the second high acoustic velocity member 56 and the second piezoelectric layer 58. The second low acoustic velocity film 57 is a film in which the acoustic velocity of the bulk wave propagating through the second low acoustic velocity film 57 is slower than the acoustic velocity of the bulk wave propagating through the second piezoelectric layer 58.

The material of the second piezoelectric layer 58 is the same as the material of the first piezoelectric layer 48. In addition, the material of the second high acoustic velocity member 56 is the same as the material of the first high acoustic velocity member 46. The second high acoustic velocity member 56 is, for example, a silicon substrate. The material of the second low acoustic velocity film 57 is the same as the material of the first low acoustic velocity film 47.

In the second chip 5, the second substrate 55 has a third main surface 551 and a fourth main surface 552. The second chip 5 has a plurality (for example, four) of third terminal electrodes T3 disposed on a third main surface 551 of the second substrate 55 and two fourth terminal electrodes T4 disposed on a fourth main surface 552 of the second substrate 55. The four third terminal electrodes T3 include a third input/output terminal 25, a fourth input/output terminal 26, a second ground terminal 27, and a second connection terminal 28 of the second filter. The four third terminal electrodes T3 are connected to the first chip 4. The second connection terminal 28 is connected to the second inductor L2 with the through-wiring portion 291 and the fourth terminal electrode T4 interposed therebetween. The two fourth terminal electrodes T4 include a terminal connected to the second connection terminal 28 and a connection terminal 29 connected to the metal electrode layer 10. For example, in a case where the material of the second high acoustic velocity member 56 is silicon, the second chip 5 may have an insulating film interposed between the through-wiring portion 291 and the second substrate 55. The material of the insulating film includes, for example, silicon oxide. The second inductor L2 is connected to the metal electrode layer 10 with a via conductor 250 interposed therebetween which penetrates the insulating layer 7.

(2.2.4) Stack Structure Including First Chip and Second Chip

In the stack structure ST1, in a plan view from the thickness direction D0 of the mounting substrate 9, the outer edge 40 of the first chip 4 and the outer edge 50 of the second chip 5 have the same shape. As illustrated in FIGS. 2 and 3, the stack structure ST1 has a hollow space 134 formed between the first chip 4 and the second chip 5. In the stack structure ST1, for example, the first chip 4 has a frame-shaped (for example, rectangular frame-shaped) first joining metal layer 400 disposed on the first main surface 451 of the first substrate 45, and the second chip 5 has a frame-shaped (for example, rectangular frame-shaped) second joining metal layer 500 disposed on the third main surface 551 of the second substrate 55. In a plan view from the thickness direction D0 of the mounting substrate 9, the first joining metal layer 400 and the second joining metal layer 500 overlap each other. In the stack structure ST1, the first joining metal layer 400 and the second joining metal layer 500 are joined to each other, so that the hollow space 134 is formed between the first substrate 45 of the first chip 4 and the second substrate 55 of the second chip 5. That is, in the stack structure ST1, a spacer portion including the first joining metal layer 400 and the second joining metal layer 500 is interposed between the first substrate 45 and the second substrate 55. The materials of the first joining metal layer 400 and the second joining metal layer 500 include, for example, metals such as Au, Al, and Cu. In the spacer portion, the first joining metal layer 400 and the second joining metal layer 500 are directly joined to each other, but the present disclosure is not limited thereto. For example, the first joining metal layer 400 and the second joining metal layer 500 may be joined to each other by solder. In addition, in the stack structure ST1, the material of the spacer portion is not limited to metal and may be, for example, a resin.

In the first chip 4, the first functional electrode 140 is located closer to the second chip 5 side than the first substrate 45. In the second chip 5, the second functional electrode 240 is located closer to the first chip 4 side than the second substrate 55.

In the stack structure ST1, the third input/output terminal 25, the fourth input/output terminal 26, and the second ground terminal 27 of the second filter 2 are connected to the first terminal, the second terminal, and the third terminal of the first chip 4, respectively.

(2.2.5) First Inductor

In the high-frequency module 100 according to Embodiment 1, the first inductor L1, which is the first circuit element related to the first filter 1, is disposed on the second main surface 42 side of the first chip 4 as illustrated in FIGS. 1 and 3. The "first circuit element related to the first filter 1" means a circuit element included in the first filter 1, a wiring portion included in the first filter 1, or a circuit element directly connected to the first filter 1. The "circuit element directly connected to the first filter 1" means a circuit element connected to the first filter 1 without another circuit element disposed therebetween, and is, for example, an inductor or a capacitor of a matching circuit connected to the first filter 1. In the high-frequency module 100 according to Embodiment 1, the "first circuit element related to the first filter 1" is the first inductor L1, which is a circuit element included in the first filter 1.

In the high-frequency module 100 according to Embodiment 1, the first inductor L1 is disposed on the mounting substrate 9 on the second main surface 42 side of the first chip 4. The first inductor L1 is configured with a planar spiral conductor pattern portion disposed on the first main surface 91 of the mounting substrate 9. The first inductor L1 overlaps the first chip 4 in the thickness direction D0 of the mounting substrate 9. More specifically, in the thickness direction D0 of the mounting substrate 9, the entire first inductor L1 overlaps a part of the first chip 4, but the present disclosure is not limited to this, and at least a part of the first inductor L1 may overlap the first chip 4. The first inductor L1 is separated from the second main surface 42 of the first chip 4 in the thickness direction D0 of the mounting substrate 9.

(2.2.6) Second Inductor

In the high-frequency module 100 according to Embodiment 1, the second inductor L2, which is the second circuit element related to the second filter 2, is disposed on the fourth main surface 52 of the second chip 5 as illustrated in FIGS. 1 and 2. The "second circuit element related to the second filter 2" means a circuit element included in the second filter 2, a wiring portion included in the second filter 2, or a circuit element directly connected to the second filter 2. The "circuit element directly connected to the second filter 2" means a circuit element connected to the second filter 2 without another circuit element disposed therebetween, and is, for example, an inductor or a capacitor of a matching circuit connected to the second filter 2. In the high-frequency module 100 according to Embodiment 1, the "second circuit element related to the second filter 2" is the second inductor L2, which is a circuit element included in the second filter 2.

The second inductor L2 overlaps the second chip 5 in the thickness direction D0 of the mounting substrate 9. More specifically, in the thickness direction D0 of the mounting substrate 9, the entire second inductor L2 overlaps a part of the second chip 5.

(2.2.7) External Connection Terminal

The plurality of external connection terminals 6 (refer to FIGS. 1 and 2) are disposed on the second main surface 92 of the mounting substrate 9. The expression "the external connection terminals 6 are disposed on the second main surface 92 of the mounting substrate 9" means that the external connection terminals 6 are mechanically connected to the second main surface 92 of the mounting substrate 9 and the external connection terminals 6 are electrically connected to the (appropriate conductor portion of) mounting substrate 9.

The plurality of external connection terminals 6 include an antenna terminal, a signal input terminal, a signal output terminal, and a plurality of external ground terminals. The plurality of external ground terminals are electrically connected to a ground layer of the mounting substrate 9. The ground layer is a circuit ground of the high-frequency module 100.

Materials of the plurality of external connection terminals 6 are, for example, metal (for example, copper, copper alloy, or the like). The plurality of external connection terminals 6 are not constituent elements of the mounting substrate 9, but may be constituent elements of the mounting substrate 9. In a plan view from the thickness direction D0 of the mounting substrate 9, each of the plurality of external connection terminals 6 has a quadrangular shape, but the present disclosure is not limited to this, and for example, may have a circular shape. The thickness of each of the plurality of external connection terminals 6 is less than the thickness of the mounting substrate 9.

(2.2.8) Insulating Layer

As illustrated in FIGS. 2 and 3, the insulating layer 7 is disposed on the fourth main surface 52 of the second chip 5. The insulating layer 7 covers the fourth main surface 52 and the second inductor L2 of the second chip 5. The material of the insulating layer 7 includes, for example, polyimide. The material of the insulating layer 7 is not limited to polyimide, and may be, for example, a polyimide-based resin, a phenol-based resin, an epoxy-based resin, polytetrafluoroethylene, or polyethylene terephthalate (PET).

In a plan view from the thickness direction D0 of the mounting substrate 9, the outer edge 70 of the insulating layer 7 has, for example, a quadrangular shape. In a plan view from the thickness direction D0 of the mounting substrate 9, the outer edge 70 of the insulating layer 7 has the same shape as the outer edge 50 of the second chip 5.

(2.2.9) Resin Layer

As illustrated in FIGS. 2 and 3, the resin layer 8 is disposed on the first main surface 91 of the mounting substrate 9. The resin layer 8 contains resin (for example, epoxy resin). The resin layer 8 may contain a filler in addition to the resin. The resin layer 8 has electric insulation.

The resin layer 8 covers the outer peripheral surface 43 of the first chip 4, the outer peripheral surface 53 of the second chip 5, and the outer peripheral surface 73 of the insulating layer 7, which are disposed on the first main surface 91 of the mounting substrate 9. The outer peripheral surface 43 of the first chip 4 includes, for example, four side surfaces that connect the first main surface 41 and the second main surface 42 of the first chip 4, and does not include the first main surface 41 and the second main surface 42. The outer peripheral surface 53 of the second chip 5 includes, for example, four side surfaces that connect the third main surface 51 and the fourth main surface 52 of the second chip 5, and does not include the third main surface 51 and the fourth main surface 52.

(2.2.10) Metal Electrode Layer

As illustrated in FIGS. 2 and 3, the metal electrode layer 10 covers a part of the insulating layer 7 and a part of the resin layer 8. More specifically, the metal electrode layer 10 covers a main surface 71 of the insulating layer 7 on a side opposite to the second chip 5 side, a main surface 81 of the resin layer 8 on a side opposite to the mounting substrate 9 side, an outer peripheral surface of the resin layer 8, and an outer peripheral surface of the mounting substrate 9.

The metal electrode layer 10 has conductivity. The metal electrode layer 10 is, for example, a shield layer provided for the purpose of shielding the inside and outside of the high-frequency module 100 from electromagnetic waves. The metal electrode layer 10 is in contact with at least a part of an outer peripheral surface of the ground layer of the mounting substrate 9. As a result, it is possible to set a potential of the metal electrode layer 10 to be the same as a potential of the ground layer. The metal electrode layer 10 has a multilayer structure in which a plurality of metal layers are laminated, but, the present disclosure is not limited to this, and may be one metal layer. The metal layer contains one type or a plurality of types of metals. In a case where the metal electrode layer 10 has a multilayer structure in which a plurality of metal layers are laminated, for example, a first metal layer (for example, a first stainless steel layer), a second metal layer (for example, a Cu layer) on the first metal layer, and a third metal layer (for example, a second stainless steel layer) on the second metal layer. A material of each of the first stainless steel layer and the second stainless steel layer is an alloy including Fe, Ni, and Cr. In addition, the metal electrode layer 10 is, for example, a Cu layer when the metal electrode layer is formed of one metal layer.

(2.2.11) Layout of First Inductor and Second Inductor

In the high-frequency module 100, the first inductor L1 and the second inductor L2 do not overlap each other in a plan view from the thickness direction D0 of the mounting substrate 9 as illustrated in FIG. 1. The expression "the first inductor L1 and the second inductor L2 do not overlap each other in the plan view from the thickness direction D0 of the mounting substrate 9" means that the first inductor L1 and the second inductor L2 do not completely overlap each other in a plan view from the thickness direction D0 of the mounting substrate 9, that is, a part of the first inductor L1 and a part of the second inductor L2 do not overlap each other. Therefore, in the high-frequency module 100 according to Embodiment 1, the first inductor L1 of the first filter 1 (see FIGS. 2 and 3) and the second inductor L2 of the second filter 2 (see FIGS. 2 and 3) do not completely overlap each other.

(2.3) Manufacturing Method of High-Frequency Module

A manufacturing method of the high-frequency module 100 includes a pre-step, a mounting step, a molding step, a polishing step, a dicing step, and a metal electrode layer forming step.

In the pre-step, a first wafer serving as a base of a plurality of first chips 4 and a second wafer serving as a base of a plurality of second chips 5 are joined, and then, for example, a plurality of first structures are formed by using techniques such as polishing, etching, plating, photolithography, vapor deposition, lift-off, laser processing, coating, and cutting with a dicing machine. Each of the plurality of first structures includes the stack structure ST1 and a protective resin layer serving as a base of the insulating layer 7. In the mounting step, the plurality of first structures are disposed on a base substrate serving as a base of the plurality of mounting substrates 9. In the molding step, a mold layer serving as a base of the plurality of resin layers 8 is formed. The mold layer covers the plurality of first structures disposed on the main surface of the base substrate. In the polishing step, the resin layer 8 and the insulating layer 7 are formed by polishing the mold layer and the protective resin layer. As a result, the second structure serving as the base of the plurality of high-frequency modules 100 is formed. In the dicing step, the second structure serving as the base of the plurality of high-frequency modules 100 is divided into individual third structures corresponding to the plurality of high-frequency modules 100. In the metal electrode layer forming step, for example, the metal electrode layer 10 covering the main surface 81 and the outer peripheral surface of the resin layer 8, the main surface 71 of the insulating layer 7, and the outer peripheral surface of the mounting substrate 9 in the third structure is formed by a sputtering method.

(3) Effect

The high-frequency module 100 according to Embodiment 1 includes the mounting substrate 9, the first chip 4, and the second chip 5. The mounting substrate 9 has the main surface 91. The first chip 4 includes the plurality of first acoustic wave resonators 14 of the first filter 1. The first chip 4 is disposed on a main surface 91 of the mounting substrate 9. The second chip 5 includes the plurality of second acoustic wave resonators 24 of the second filter 2. The second chip 5 is disposed on the side of the first chip 4 opposite to the mounting substrate 9 side. The first chip 4 has the first main surface 41 on the second chip 5 side and a second main surface 42 on the mounting substrate 9 side. The second chip 5 has the third main surface 51 on the first chip 4 side and the fourth main surface 52 on the side opposite to the first chip 4 side. The first inductor L1, which is the first circuit element related to the first filter 1, is disposed on the second main surface 42 side of the first chip 4. The second inductor L2, which is the second circuit element related to the second filter 2, is disposed on the fourth main surface 52 side of the second chip 5.

According to the high-frequency module 100 of Embodiment 1, it is possible to suppress the deterioration of the characteristics while achieving reduction in size. More specifically, according to the high-frequency module 100, the second chip 5 is disposed on the side of the first chip 4 opposite to the mounting substrate 9 side, so that the size can be reduced. In addition, according to the high-frequency module 100, it is possible to shorten the wiring length between the second inductor L2 and the second acoustic wave resonator 24 to which the second inductor L2 is connected in the second chip 5, and it is possible to suppress the deterioration of the characteristics of the second filter 2. In addition, according to the high-frequency module 100, the first inductor L1 related to the first filter 1 is disposed on the second main surface 42 side of the first chip 4, and the second inductor L2 included in the second filter 2 is disposed on the fourth main surface 52 of the second chip 5, so that isolation between the first inductor L1 and the second inductor L2 can be improved. Accordingly, the high-frequency module 100 can suppress the deterioration of the characteristics of each of the first filter 1 and the second filter 2.

In addition, in the high-frequency module 100, the first inductor L1 is provided on the mounting substrate 9. Accordingly, the high-frequency module 100 can further improve the isolation between the first inductor L1 and the second inductor L2, compared to a case where the first inductor L1 is disposed on the second main surface 42 of the first chip 4.

In addition, in the high-frequency module 100, the metal electrode layer 10 covers at least a part of the resin layer 8, and the second inductor L2 is connected to the second ground with the metal electrode layer 10 interposed therebetween. Accordingly, the high-frequency module 100 can reduce the parasitic inductance between the second inductor L2 and the second ground.

Modification Example 1 of Embodiment 1

Figure 5:
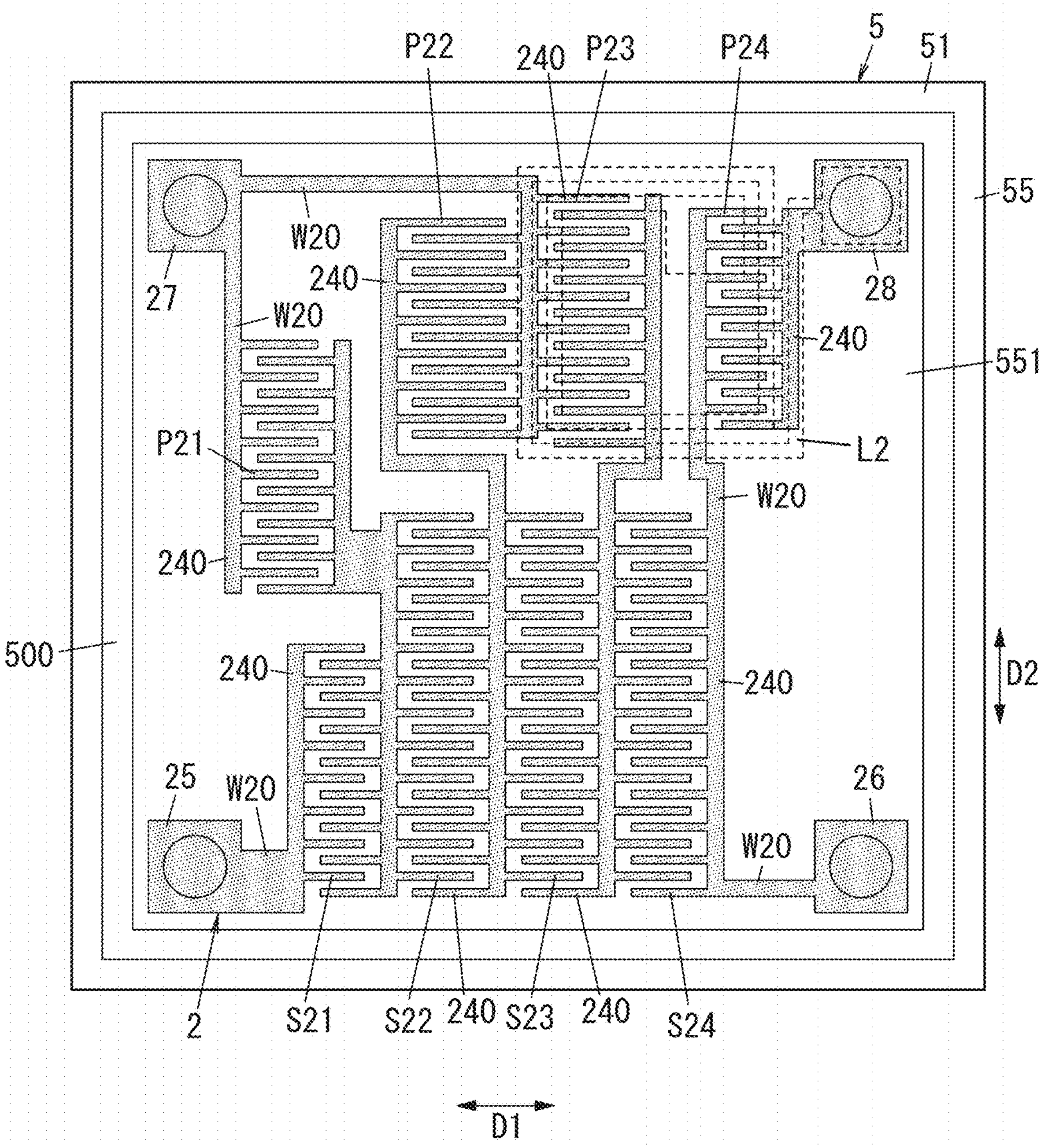
FIG. 5 is a bottom view of a second chip in a high-frequency module according to Modification Example 1 of Embodiment 1.

A high-frequency module 100 according to Modification Example 1 of Embodiment 1 includes a second chip 5 illustrated in FIG. 5 instead of the second chip 5 in the stack structure ST1 (see FIG. 2) of Embodiment 1.

In the second chip 5 in Modification Example 1, as illustrated in FIG. 5, in a first direction D1, the series arm resonator S21, the series arm resonator S22, the series arm resonator S23, and the series arm resonator S24 are arranged in the order of the series arm resonator S21, the series arm resonator S22, the series arm resonator S23, and the series arm resonator S24. The first direction D1 is orthogonal to the thickness direction D0 of the mounting substrate 9 (see FIG. 2). In addition, in the second chip 5, in the first direction D1, the parallel arm resonator P21, the parallel arm resonator P22, the parallel arm resonator P23, and the parallel arm resonator P24 are arranged in the order of the parallel arm resonator P21, the parallel arm resonator P22, the parallel arm resonator P23, and the parallel arm resonator P24. The parallel arm resonator P21, the parallel arm resonator P22, the parallel arm resonator P23, and the parallel arm resonator P24 are separated from the series arm resonator S21, the series arm resonator S22, the series arm resonator S23, and the series arm resonator S24 in a second direction D2 orthogonal to the first direction D1. In addition, the second chip 5 includes a plurality of wiring portions W20 and the second joining metal layer 500 disposed on the third main surface 551 of the second substrate 55. In FIG. 5, the functional electrodes 240, the respective wiring portions W20, the third input/output terminal 25, the fourth input/output terminal 26, the second ground terminal 27, and the second connection terminal 28 of the series arm resonators S21 to S24 and the parallel arm resonators P21 to P24 are hatched with dots. These hatching lines do not represent a cross section, and are merely added to make the drawing easier to see.

In the high-frequency module 100 according to Modification Example 1 of Embodiment 1, in a plan view from the thickness direction D0 of the mounting substrate 9, the second inductor L2 of the second filter 2 overlaps one or more (three in the example of FIG. 4) parallel arm resonators P22 to P24 among the plurality (four) of parallel arm resonators P21 to P24 of the second filter 2 and does not overlap any of the plurality (four) of series arm resonators S21 to S24. Accordingly, in the high-frequency module 100 according to Modification Example 1, attenuation characteristics of the second filter 2 can be improved as compared with a case where the second inductor L2 of the second filter 2 overlaps at least one of the plurality of series arm resonators S21 to S24 in the plan view from the thickness direction D0 of the mounting substrate 9.

Modification Example 2 of Embodiment 1

Figure 6:
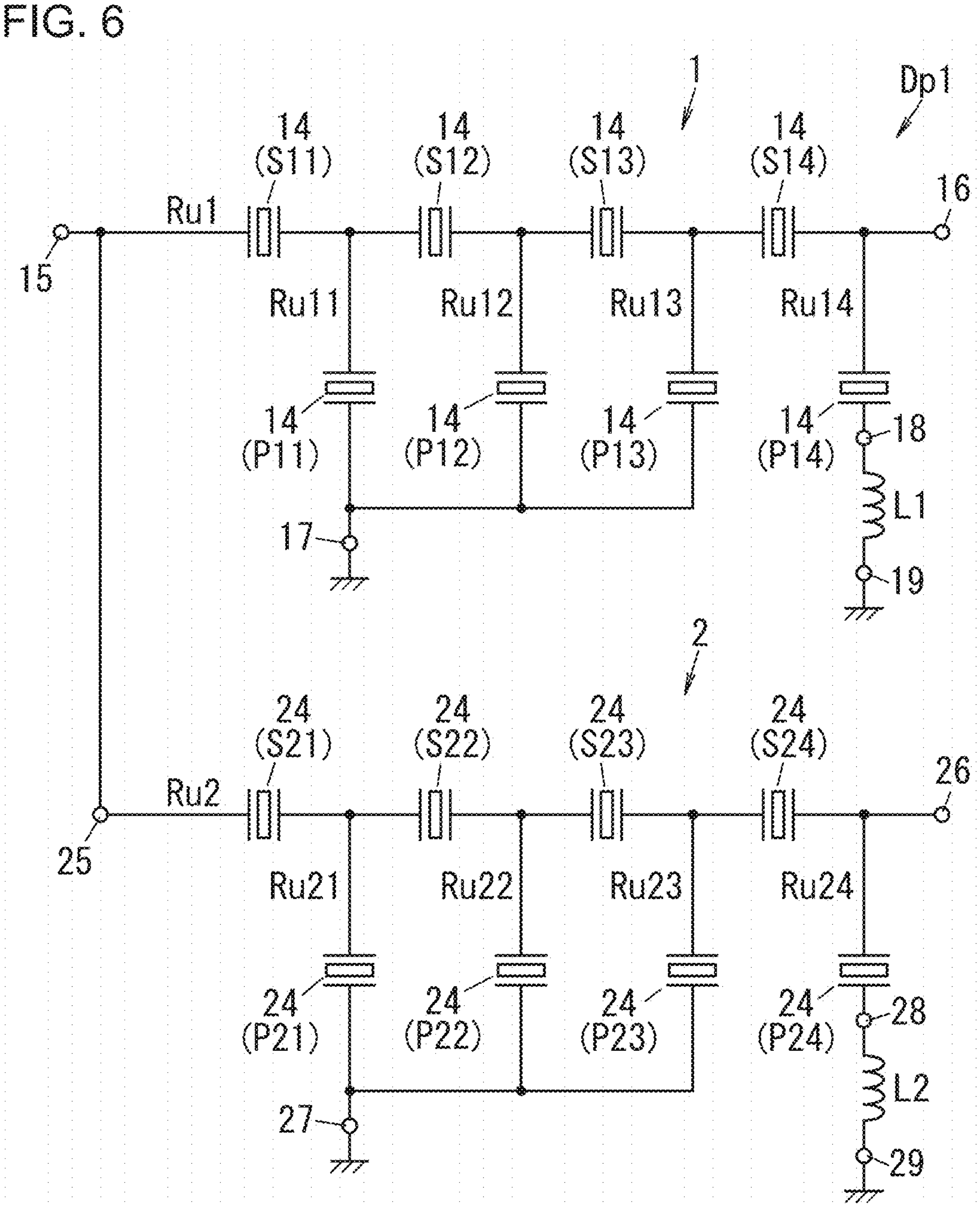
FIG. 6 is a circuit diagram of a main portion of a high-frequency module according to Modification Example 2 of Embodiment 1.

A high-frequency module 100 according to Modification Example 2 of Embodiment 1 is different from the high-frequency module 100 according to Embodiment 1 in that the third input/output terminal 25 of the second filter 2 is connected to the first input/output terminal 15 of the first filter 1, and a duplexer Dp1 including the first filter 1 and the second filter 2 is provided, as illustrated in FIG. 6.

Embodiment 2

Figure 7:
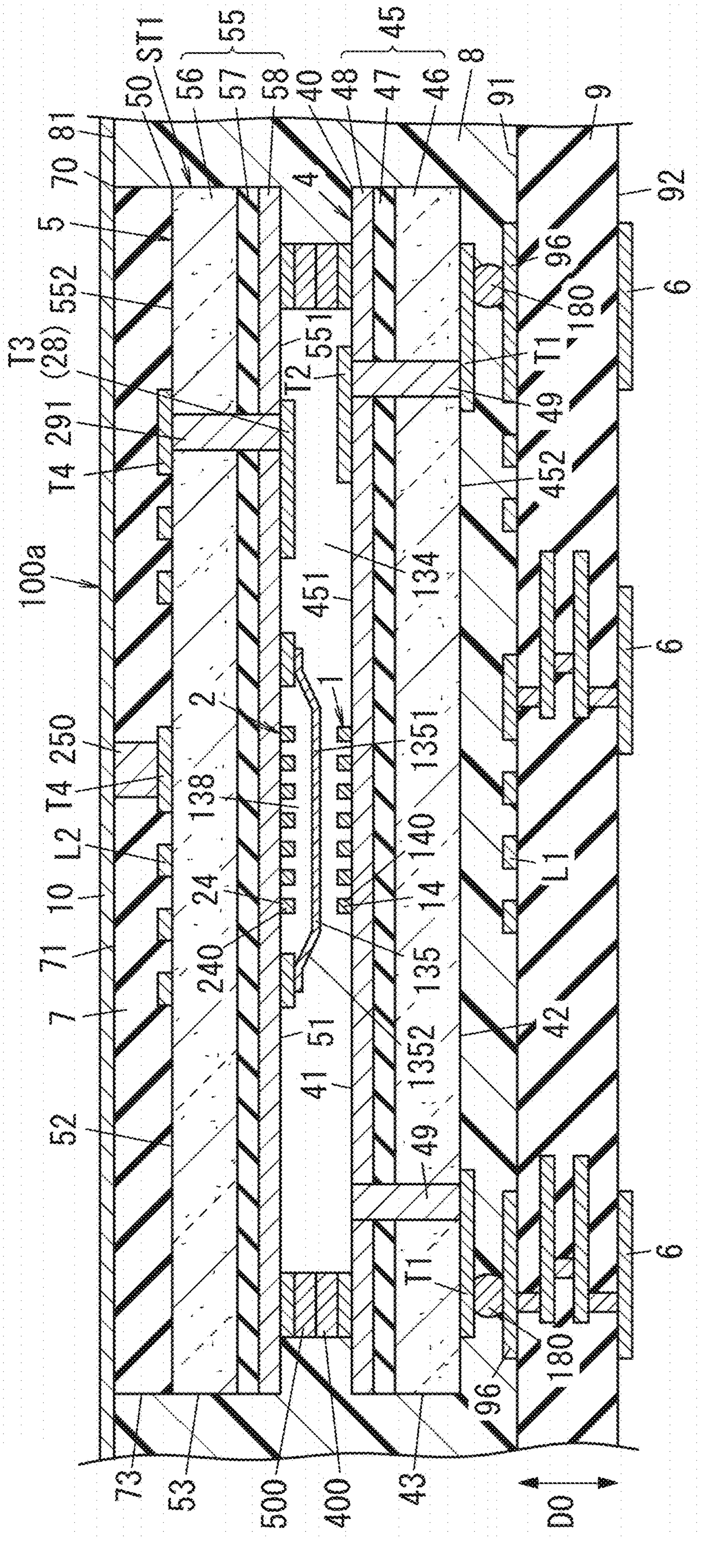
FIG. 7 is a cross-sectional view of a high-frequency module according to Embodiment 2.
Figure 8:
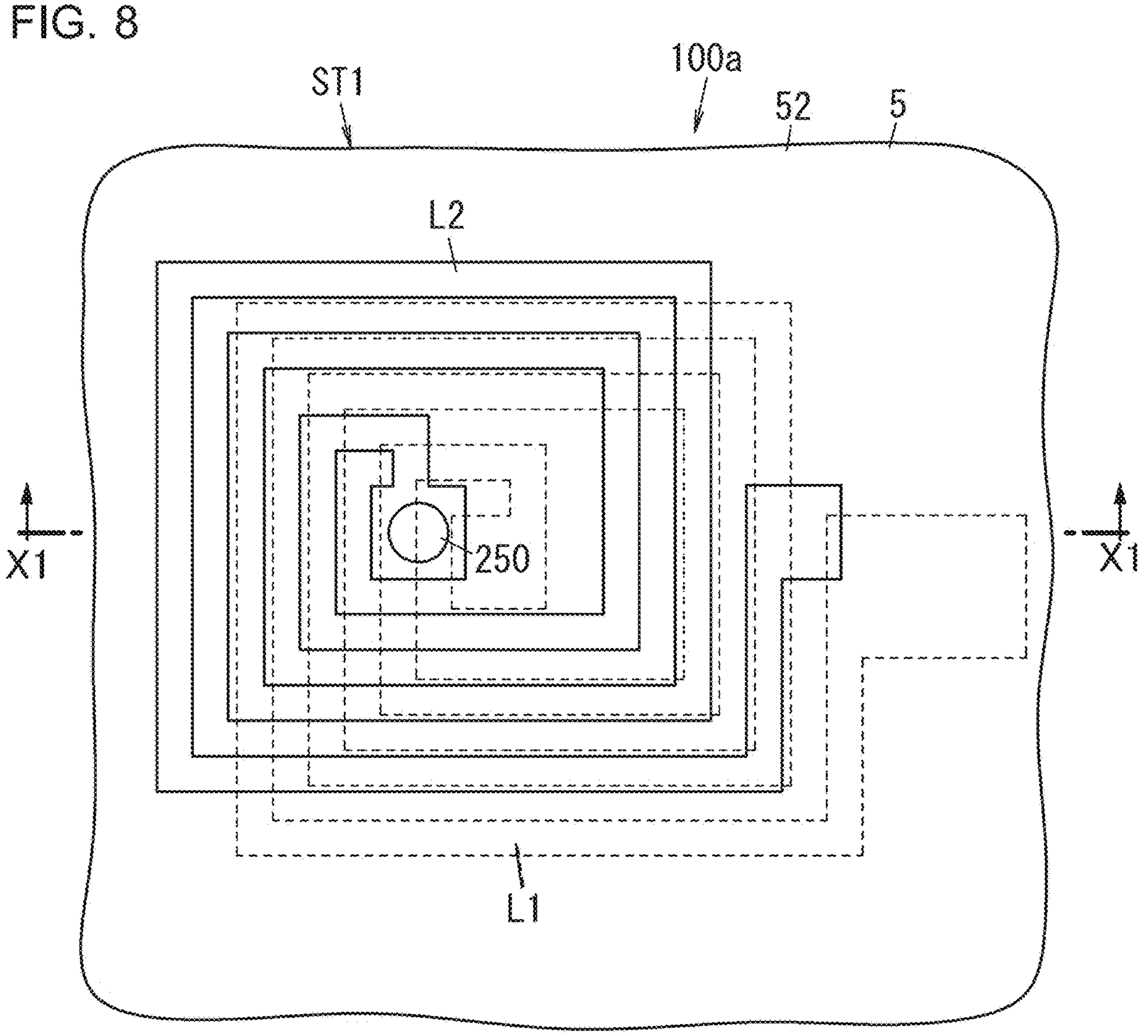
FIG. 8 is a plan view of a main portion of the high-frequency module.

A high-frequency module 100*a* according to Embodiment 2 will be described with reference to FIGS. 7 and 8. Regarding the high-frequency module 100*a* according to Embodiment 2, the same components as the high-frequency module 100 (see FIG. 2) according to Embodiment 1 are attached with the same reference numerals, and the description thereof will be omitted. In FIG. 8, the metal electrode layer 10 and the insulating layer 7 are not illustrated. FIG. 7 is a cross-sectional view corresponding to a cross section taken along line X1-X1 of FIG. 8.

(1) Configuration

The high-frequency module 100*a* according to Embodiment 2 is different from the high-frequency module 100 according to Embodiment 1 in that the second inductor L2 and the first inductor L1 overlap each other in a plan view from the thickness direction D0 of the mounting substrate 9. In addition, the high-frequency module 100*a* according to Embodiment 2 is different from the high-frequency module 100 according to Embodiment 1 in that a shield electrode 135 is further provided.

In the high-frequency module 100*a* according to Embodiment 2, in a plan view from the thickness direction D0 of the mounting substrate 9, as illustrated in FIG. 8, a part of the second inductor L2 and a part of the first inductor L1 overlap each other. In the high-frequency module 100*a*, a part of the second inductor L2 may overlap the entire first inductor L1, the entire second inductor L2 may overlap a part of the first inductor L1, or the entire second inductor L2 may overlap the entire first inductor L1.

As illustrated in FIG. 7, the shield electrode 135 is disposed between the first chip 4 and the second chip 5. More specifically, the shield electrode 135 is disposed in the hollow space 134 surrounded by the first substrate 45 of the first chip 4, the second substrate 55 of the second chip 5, and the spacer portion between the first substrate 45 and the second substrate 55. The spacer portion includes the first joining metal layer 400 and a second joining metal layer 500.

The shield electrode 135 is disposed between at least one of the plurality of first functional electrodes 140 and at least one of the plurality of second functional electrodes 240 in the thickness direction D0 of the mounting substrate 9. Therefore, the shield electrode 135 overlaps at least one of the plurality of first functional electrodes 140 and at least one of the plurality of second functional electrodes 240 in the thickness direction D0 of the mounting substrate 9. The mounting substrate 9 further includes a ground electrode (not illustrated) to which the shield electrode 135 is connected.

The shield electrode 135 has a first shield portion 1351 that is separated from the second chip 5 in the thickness direction D0 of the mounting substrate 9, and a second shield portion 1352 that connects the second chip 5 and the first shield portion 1351. The first shield portion 1351 and the second shield portion 1352 are integrated. The material of the shield electrode 135 includes a metal. The high-frequency module 100*a* has a cavity 138 formed between the shield electrode 135, the third main surface 551 of the second substrate 55, and the at least one second functional electrode 240. The cavity 138 can be formed, for example, by using a sacrificial layer etching technique.

In a plan view from the thickness direction D0 of the mounting substrate 9, the first inductor L1 and the second inductor L2 overlap the shield electrode 135. In addition, in the high-frequency module 100*a*, in a plan view from the thickness direction D0 of the mounting substrate 9, the entire first inductor L1 and a part of the shield electrode 135 overlap each other. In the high-frequency module 100*a*, a part of the first inductor L1 may overlap a part of the shield electrode 135 in a plan view from the thickness direction D0 of the mounting substrate 9. In the high-frequency module 100*a*, in a plan view from the thickness direction D0 of the mounting substrate 9, the entire second inductor L2 and a part of the shield electrode 135 overlap each other. In the high-frequency module 100*a*, a part of the second inductor L2 may overlap a part of the shield electrode 135 in a plan view from the thickness direction D0 of the mounting substrate 9.

(2) Effects

The high-frequency module 100*a* according to Embodiment 2 includes the shield electrode 135 that is disposed in the hollow space 134 between the first chip 4 and the second chip 5. In addition, in the high-frequency module 100*a* according to Embodiment 2, the first inductor L1 and the second inductor L2 overlap the shield electrode 135 in a plan view from the thickness direction D0 of the mounting substrate 9. Accordingly, in the high-frequency module 100*a* according to Embodiment 2, it is possible to improve the isolation between the first inductor L1 and the second inductor L2.

Embodiment 3

Figure 9:
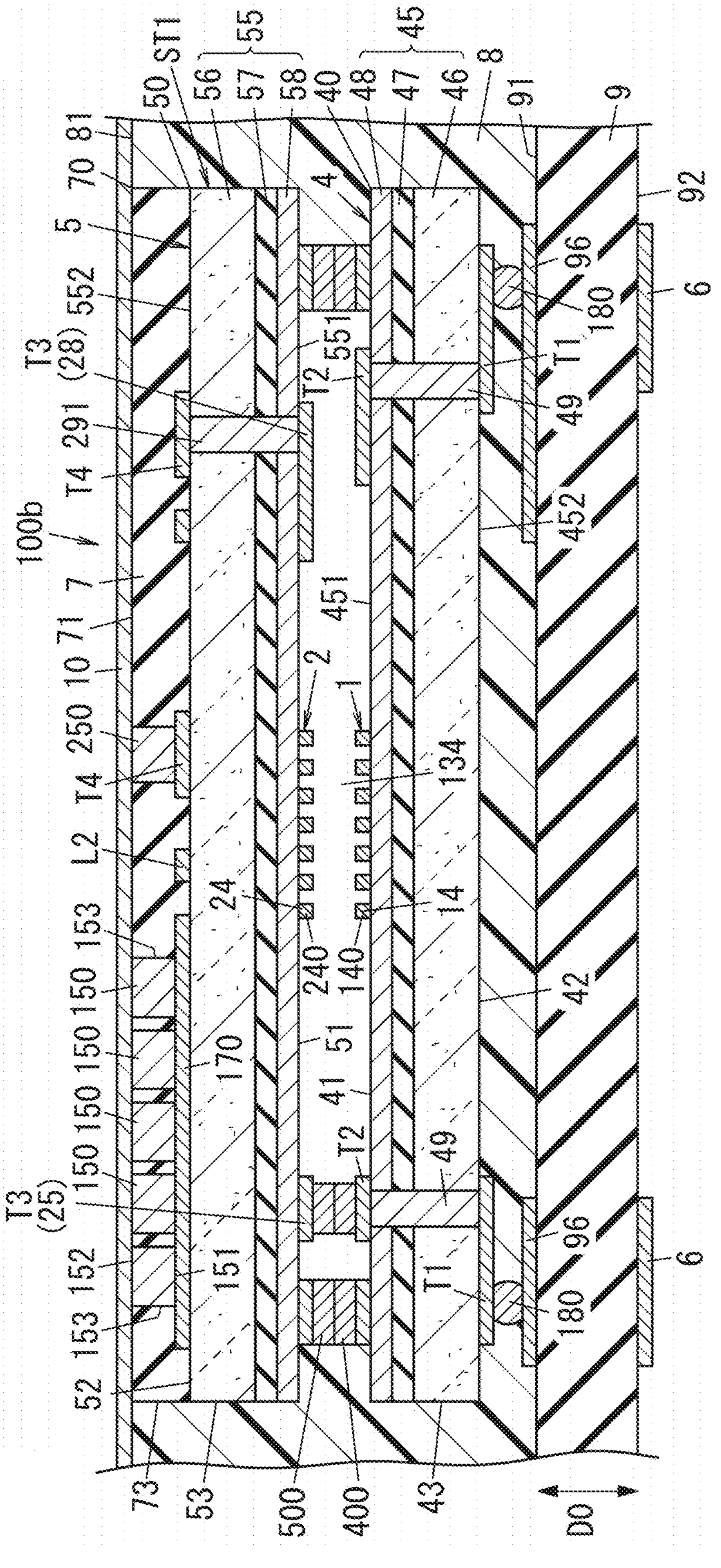
FIG. 9 is a cross-sectional view of a high-frequency module according to Embodiment 3.
Figure 10:
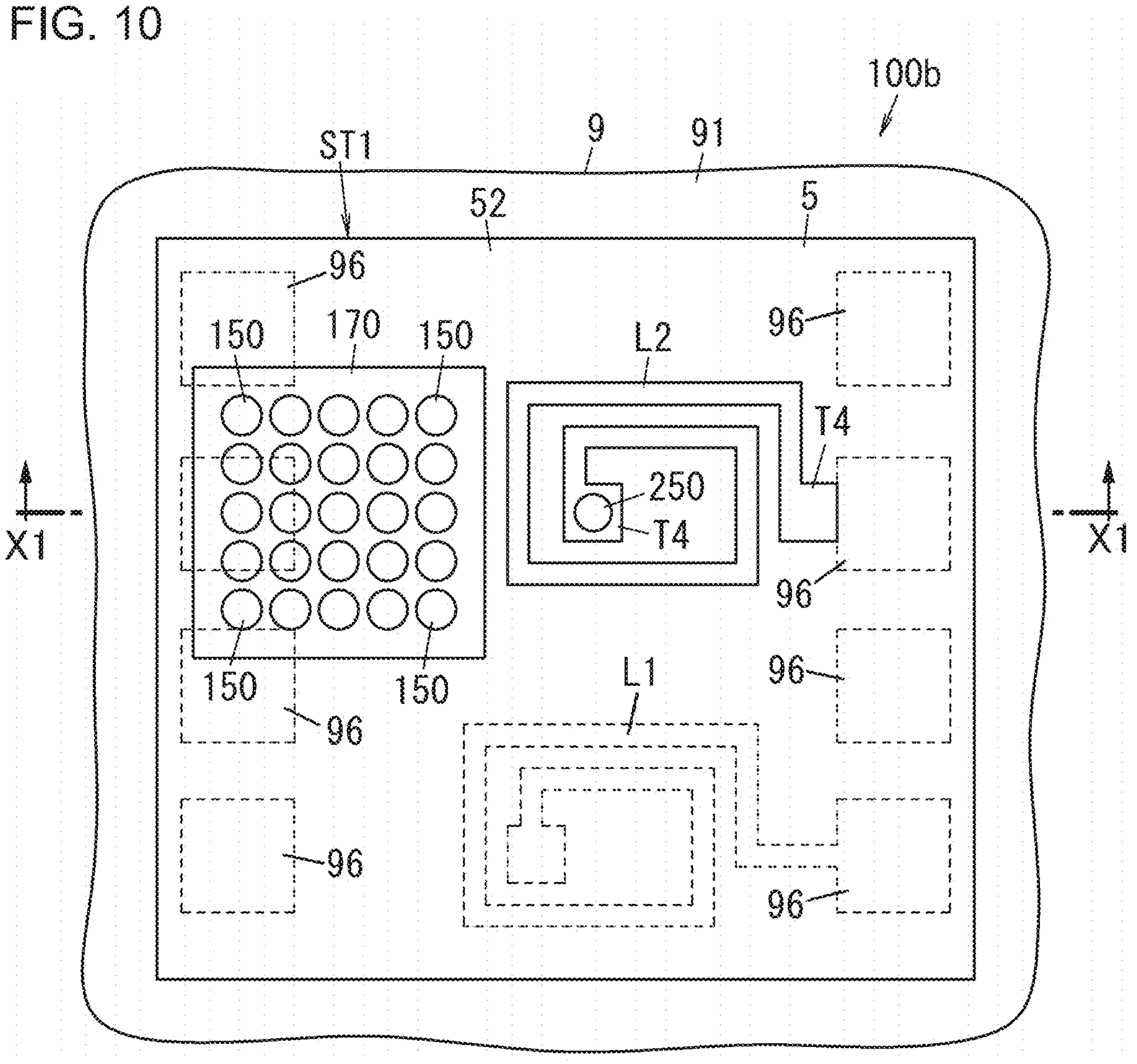
FIG. 10 is a plan view of a main portion of the high-frequency module.

A high-frequency module 100*b* according to Embodiment 3 will be described with reference to FIGS. 9 and 10. Regarding the high-frequency module 100*b* according to Embodiment 3, the same components as the high-frequency module 100 (see FIGS. 1 to 3) according to Embodiment 1 are attached with the same reference numerals, and the description thereof will be omitted. In FIG. 10, the metal electrode layer 10, the insulating layer 7, and the resin layer 8 are not illustrated. FIG. 9 is a cross-sectional view corresponding to a cross section taken along line X1-X1 of FIG. 10.

(1) Configuration

The high-frequency module 100*b* according to Embodiment 3 is different from the high-frequency module 100 according to Embodiment 1 in that a plurality (for example, 25) of metal members 150 are further provided. The plurality of metal members 150 are in contact with the metal electrode layer 10.

The plurality of metal members 150 are disposed on the fourth main surface 52 of the second chip 5. The high-frequency module 100*b* further includes a conductor pattern portion 170 that is interposed between the plurality of metal members 150 and the fourth main surface 52 of the second chip 5. That is, the plurality of metal members 150 are disposed on the fourth main surface 52 of the second chip 5 with the conductor pattern portion 170 interposed therebetween. Each of the plurality of metal members 150 is a via conductor. The materials of the plurality of metal members 150 include, for example, copper. The material of the conductor pattern portion 170 includes, for example, copper.

In a plan view from the thickness direction D0 of the mounting substrate 9, the plurality of metal members 150 are disposed in a two-dimensional array. In a plan view from the thickness direction D0 of the mounting substrate 9, each of the plurality of metal members 150 has a circular shape. In a plan view from the thickness direction D0 of the mounting substrate 9, the plurality of metal members 150 are separated from each other.

The conductor pattern portion 170 has, for example, a quadrangular shape in a plan view from the thickness direction D0 of the mounting substrate 9, but is not limited thereto, and may have, for example, a circular shape. In a plan view from the thickness direction D0 of the mounting substrate 9, the conductor pattern portion 170 overlaps all the plurality of metal members 150. In addition, the conductor pattern portion 170 overlaps a part of at least one second functional electrode 240 among the plurality of second functional electrodes 240 of the second chip 5 in a plan view from the thickness direction D0 of the mounting substrate 9.

In the high-frequency module 100*b*, the insulating layer 7 covers at least a part of the outer peripheral surface 153 of each metal member 150 and the second inductor L2.

Each metal member 150 has a first end face 151 on the second chip 5 side and a second end face 152 on a side opposite to the second chip 5 side. In each metal member 150, the first end face 151 is in contact with the conductor pattern portion 170, and the second end face 152 is in contact with the metal electrode layer 10.

(2) Effects

According to the high-frequency module 100*b* of Embodiment 3, since the plurality of metal members 150 are in contact with the metal electrode layer 10, it is possible to improve the heat dissipation properties. Accordingly, in the high-frequency module 100*b* according to Embodiment 3, it is possible to suppress deterioration in the power capacity of the second filter 2 and to suppress a change in characteristics due to an increase in temperature. The number of the metal members 150 is not limited to a plurality of members and may be one.

Embodiment 4

Figure 11:
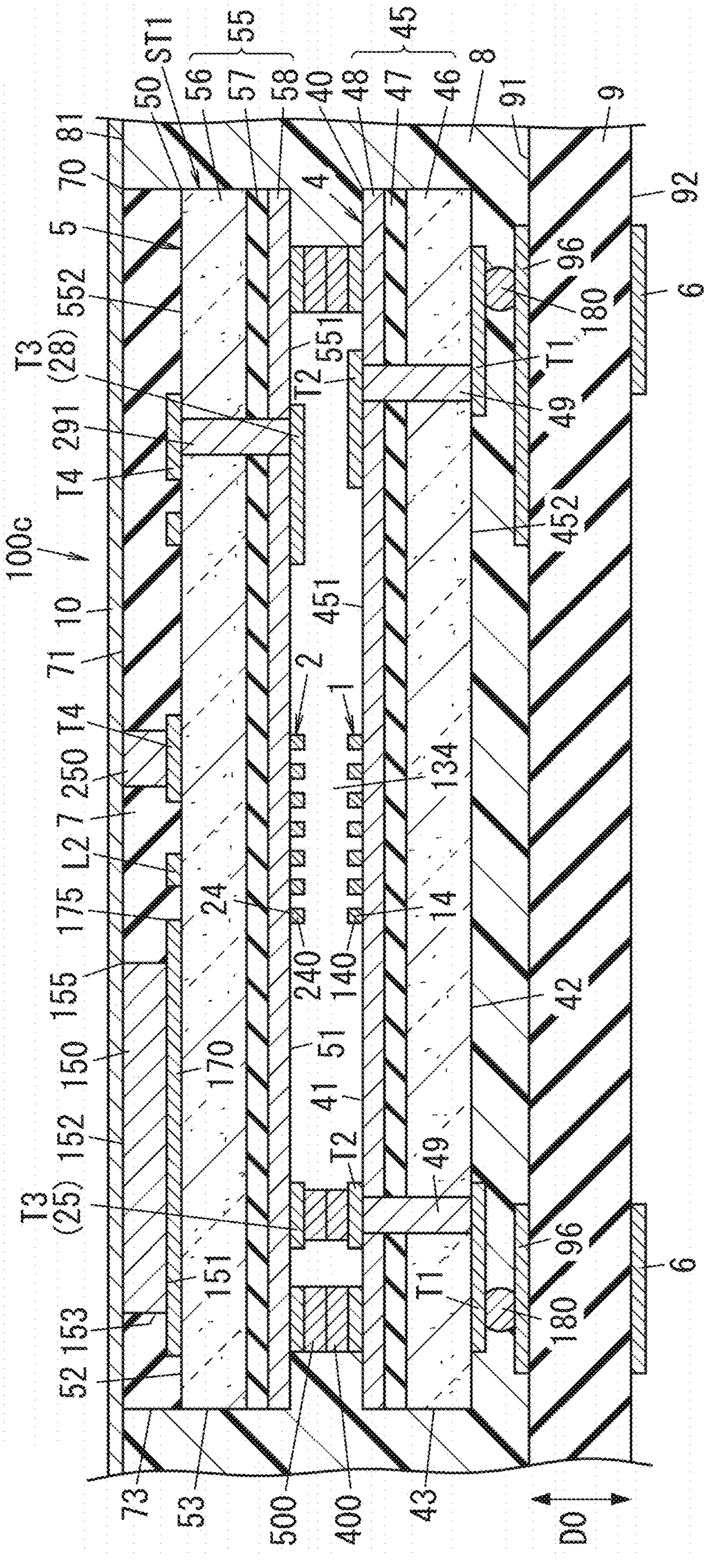
FIG. 11 is a cross-sectional view of a high-frequency module according to Embodiment 4.
Figure 12:
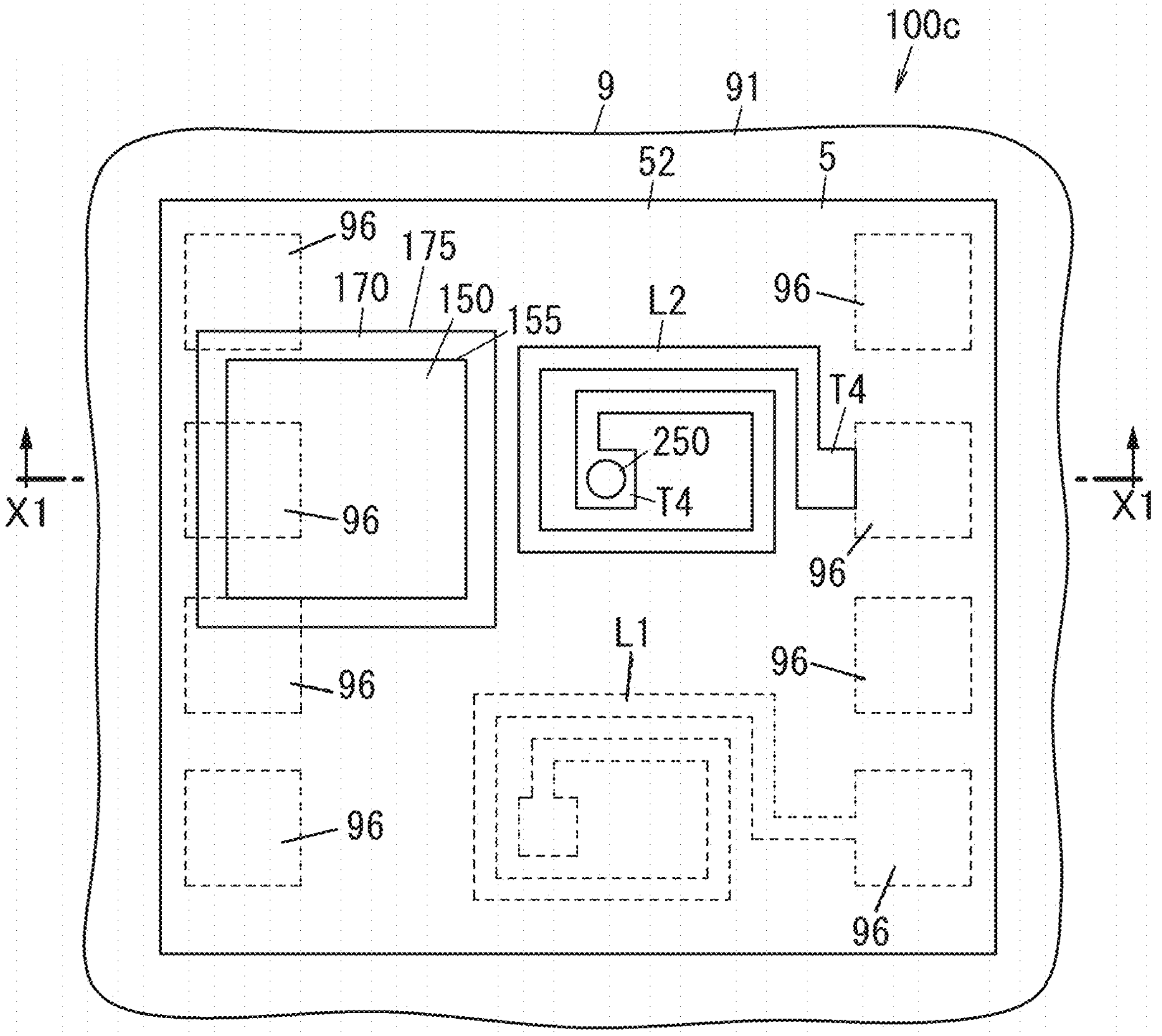
FIG. 12 is a plan view of a main portion of the high-frequency module.

A high-frequency module 100*c* according to Embodiment 4 will be described with reference to FIGS. 11 and 12. Regarding the high-frequency module 100*c* according to Embodiment 4, the same components as the high-frequency module 100*b* (see FIGS. 9 and 10) according to Embodiment 3 are attached with the same reference numerals, and the description thereof will be omitted. In FIG. 12, the metal electrode layer 10, the insulating layer 7, and the resin layer 8 are not illustrated. FIG. 11 is a cross-sectional view corresponding to a cross section taken along line X1-X1 of FIG. 12.

(1) Configuration

In the high-frequency module 100*c* according to Embodiment 4, one metal member 150 is disposed on the conductor pattern portion 170. In a plan view from the thickness direction D0 of the mounting substrate 9, the metal member 150 has, for example, a quadrangular shape, but is not limited thereto, and may have a circular shape. In a plan view from the thickness direction D0 of the mounting substrate 9, an outer edge 155 of the metal member 150 is positioned inside an outer edge 175 of the conductor pattern portion 170. In a plan view from the thickness direction D0 of the mounting substrate 9, the metal member 150 is larger than each of the plurality of third terminal electrodes T3.

In addition, the metal member 150 overlaps a part of at least one second functional electrode 240 among the plurality of second functional electrodes 240 of the second chip 5 in a plan view from the thickness direction D0 of the mounting substrate 9.

(2) Effects

According to the high-frequency module 100*c* of Embodiment 4, the metal member 150 is larger than each of the plurality of third terminal electrodes T3 in the plan view from the thickness direction D0 of the mounting substrate 9, so that heat dissipation properties can be further improved as compared with the high-frequency module 100*b* of Embodiment 3.

Embodiment 5

Figure 13:
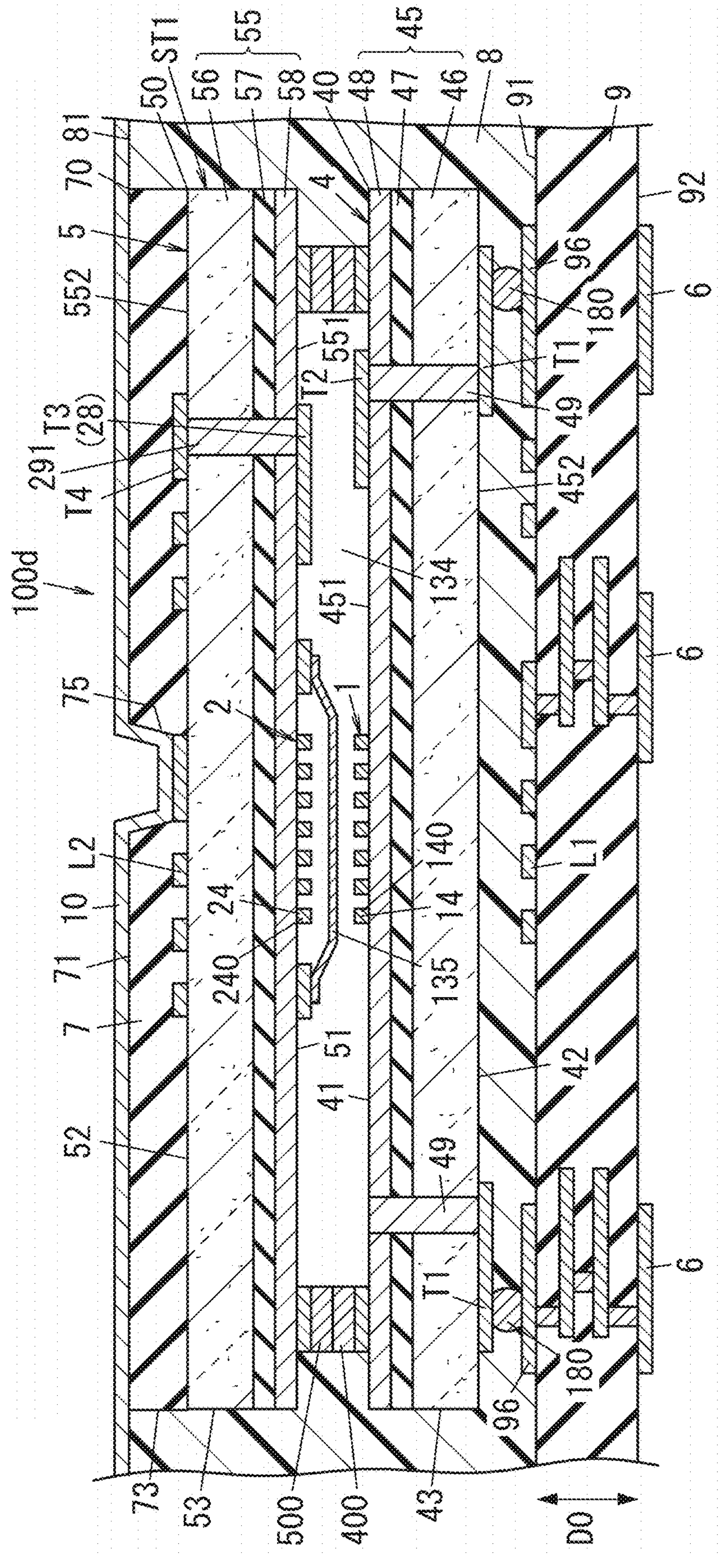
FIG. 13 is a cross-sectional view of a high-frequency module according to Embodiment 5.

A high-frequency module 100*d* according to Embodiment 5 will be described with reference to FIG. 13. Regarding the high-frequency module 100*d* according to Embodiment 5, the same components as the high-frequency module 100*a* (see FIG. 7) according to Embodiment 2 are attached with the same reference numerals, and the description thereof will be omitted.

(1) Configuration

The high-frequency module 100*d* according to Embodiment 5 is different from the high-frequency module 100*a* according to Embodiment 2 in that a part of the metal electrode layer 10 penetrates the insulating layer 7 and is connected to the second inductor L2. More specifically, in the high-frequency module 100*d*, the insulating layer 7 has a cavity 75 formed on the second inductor L2, and a part of the metal electrode layer 10 is in contact with the second inductor L2 through the cavity 75.

(2) Effects

In the high-frequency module 100*d* according to Embodiment 5, since a part of the metal electrode layer 10 penetrates the insulating layer 7 and is connected to the second inductor L2, a parasitic inductance can be reduced, and the deterioration of the characteristics of the second filter 2 can be suppressed.

Embodiment 6

Figure 14:
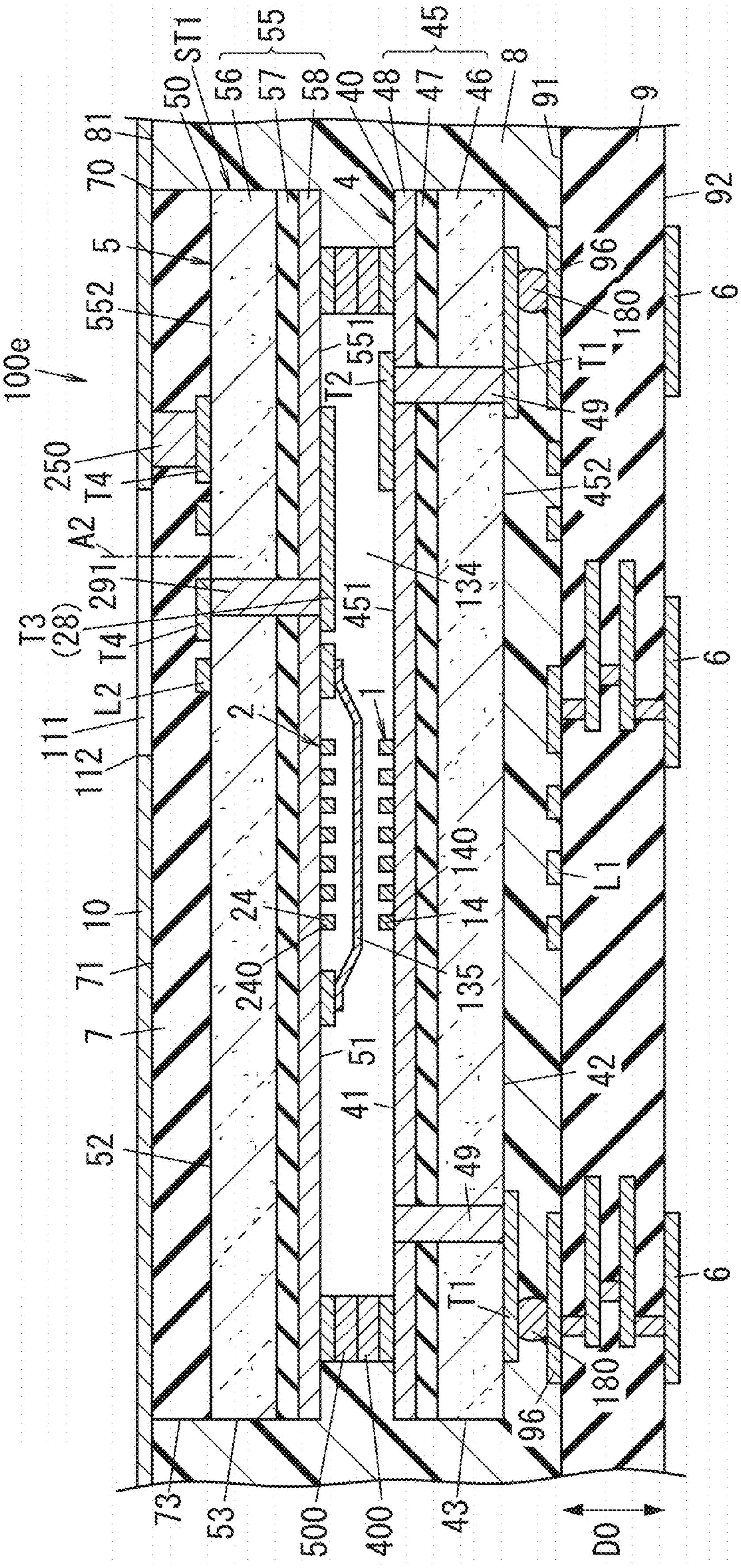
FIG. 14 is a cross-sectional view of a high-frequency module according to Embodiment 6.

A high-frequency module 100*e* according to Embodiment 6 will be described with reference to FIG. 14. Regarding the high-frequency module 100*e* according to Embodiment 6, the same components as the high-frequency module 100*a* (see FIG. 7) according to Embodiment 2 are attached with the same reference numerals, and the description thereof will be omitted.

(1) Configuration

The high-frequency module 100*e* according to Embodiment 6 is different from the high-frequency module 100 according to Embodiment 1 in that the metal electrode layer 10 has a cavity 111 that exposes a part of the main surface 71 of the insulating layer 7. In a plan view from the thickness direction D0 of the mounting substrate 9, the opening shape of the cavity 111 of the metal electrode layer 10 is a rectangular shape, but is not limited thereto, and may be, for example, a circular shape.

In a plan view from the thickness direction D0 of the mounting substrate 9, an opening edge 112 of the cavity 111 of the metal electrode layer 10 is positioned inside the outer edge 70 of the insulating layer 7 and the outer edge 50 of the second chip 5. The cavity 111 of the metal electrode layer 10 is formed such that the metal electrode layer 10 does not overlap at least a part of the second inductor L2 and the metal electrode layer 10 does not overlap a winding axis A2 of the second inductor L2 in a plan view from the thickness direction D0 of the mounting substrate 9.

In the high-frequency module 100*e* according to Embodiment 6, the second inductor L2 has the winding axis A2 of the second inductor L2 parallel to the thickness direction D0 of the mounting substrate 9, and the metal electrode layer 10 does not overlap the winding axis A2 of the second inductor L2. The expression "the winding axis A2 of the second inductor L2 is parallel to the thickness direction D0 of the mounting substrate 9" is not limited to a case where the winding axis A2 is strictly parallel to the thickness direction D0, and an angle formed by the winding axis A2 of the second inductor L2 and the thickness direction D0 of the mounting substrate 9 may be 10 degrees or less.

(2) Effects

In the high-frequency module 100*e* according to Embodiment 6, since the metal electrode layer 10 does not overlap the winding axis A2 of the second inductor L2, it is possible to suppress deterioration in the Q value (quality factor) of the second inductor L2, and it is possible to suppress deterioration in the characteristics of the second filter 2.

Embodiment 7

Figure 15:
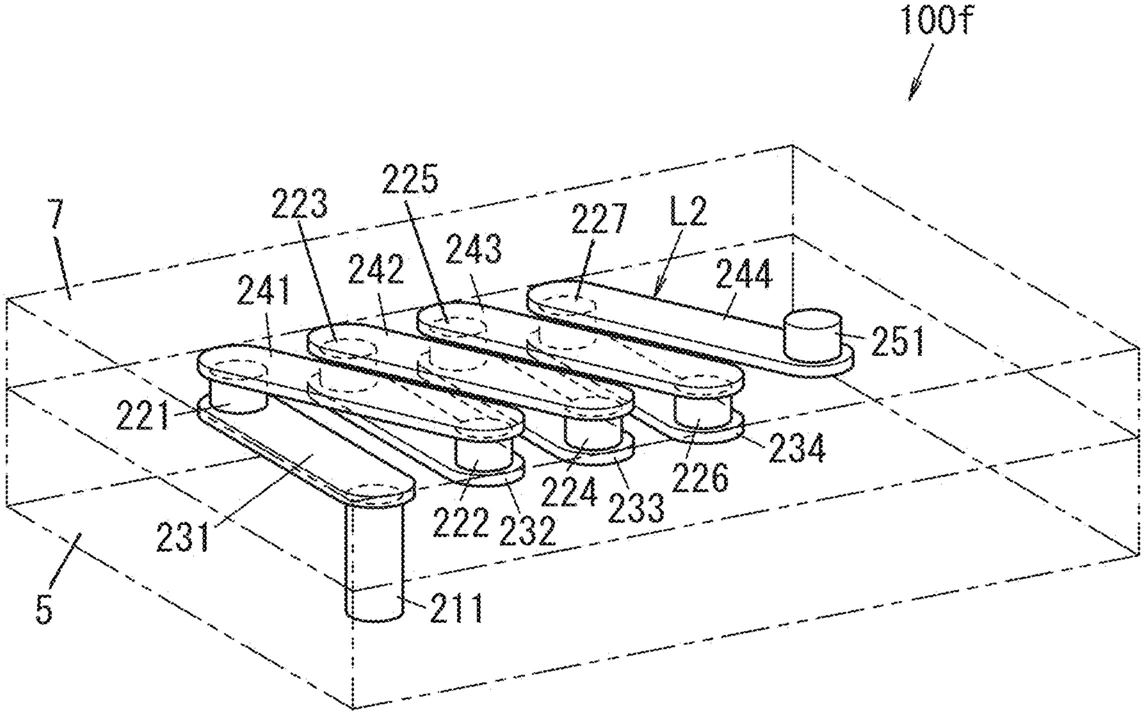
FIG. 15 is a perspective view of a main portion of a high-frequency module according to Embodiment 7.
Figure 16A:
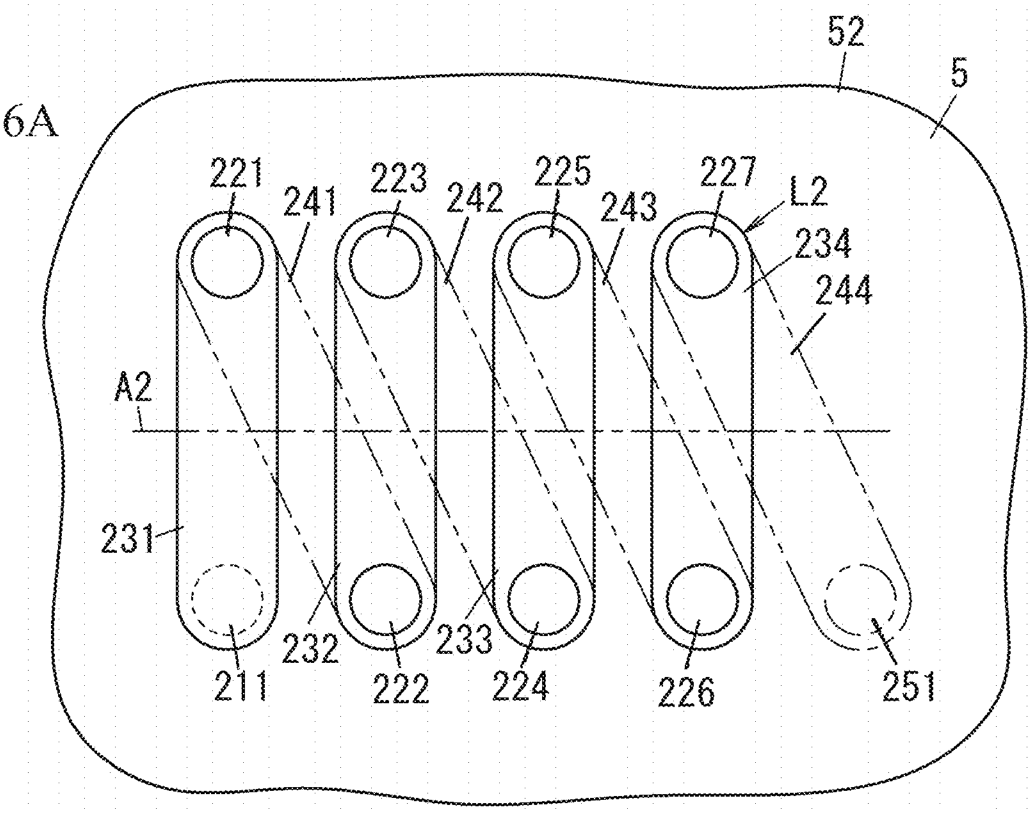
FIG. 16A is a plan view of a main portion of the high-frequency module.
Figure 16B:
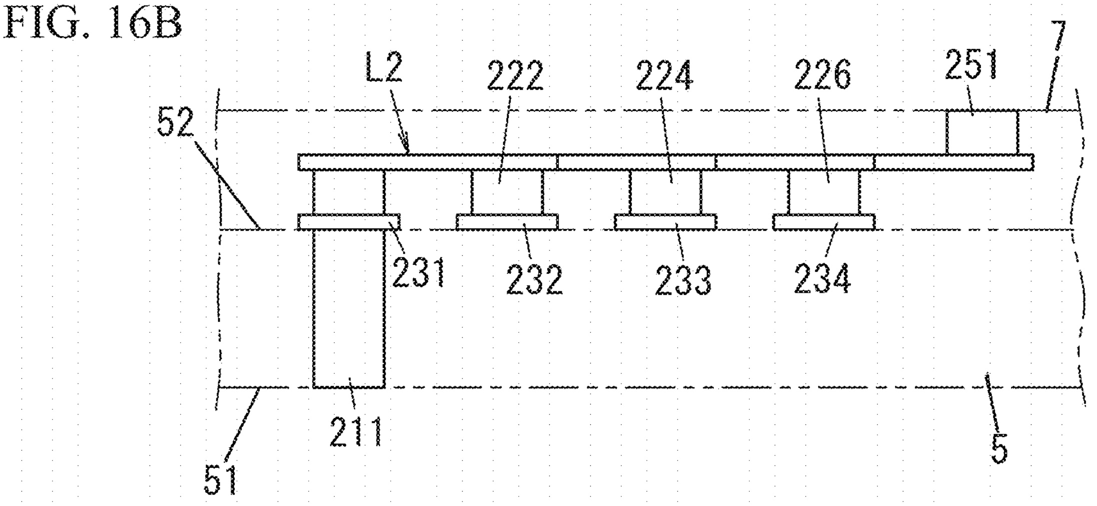
FIG. 16B is a perspective side view of a main portion of the high-frequency module.

A high-frequency module 100*f* according to Embodiment 7 will be described with reference to FIGS. 15, 16A, and 16B. Regarding the high-frequency module 100*f* according to Embodiment 7, the same components as the high-frequency module 100 (see FIGS. 1 to 3) according to Embodiment 1 are attached with the same reference numerals, and the description thereof will be omitted. In FIGS. 15, 16A, and 16B, the second chip 5, the insulating layer 7, and the second inductor L2 are illustrated, and the other components are not illustrated.

(1) Configuration

In the high-frequency module 100*f* according to Embodiment 7, the winding axis A2 (see FIG. 16A) of the second inductor L2 is parallel to the fourth main surface 52 of the second chip 5. The expression "the winding axis A2 of the second inductor L2 is parallel to the fourth main surface 52 of the second chip 5" is not limited to a case where the winding axis A2 is strictly parallel to the fourth main surface 52, and an angle formed by the winding axis A2 of the second inductor L2 and the fourth main surface 52 of the second chip 5 may be 10 degrees or less.

In the second inductor L2, a first end of the second inductor L2 is connected to the parallel arm resonator P14 (see FIG. 4A) with a through-wiring portion 211, which penetrates the second substrate 55 of the second chip 5 in the thickness direction, interposed therebetween, and a second end of the second inductor L2 is connected to the metal electrode layer 10 (see FIG. 2) with a connection via conductor 251 interposed therebetween.

The second inductor L2 includes a plurality (for example, four) of first conductor portions 231 to 234, a plurality (for example, seven) of via conductors 221 to 227, and a plurality (for example, four) of second conductor portions 241 to 244. A plurality of (for example, four) first conductor portions 231 to 234 are disposed on the fourth main surface 52 of the second chip 5. The plurality of second conductor portions 241 to 244 are disposed away from the fourth main surface 52 of the second chip 5. In a plan view from the thickness direction D0 of the mounting substrate 9 (see FIG. 2), each of the plurality of (for example, four) first conductor portions 231 to 234 has, for example, an elongated shape. The elongated shape is a shape in which a length in the one direction is longer than a length in the other direction intersecting the one direction. Each of the plurality of via conductors 221 to 227 has, for example, a circular shape. In a plan view from the thickness direction D0 of the mounting substrate 9, each of a plurality of (for example, four) second conductor portions 241 to 244 has, for example, a rectangular shape and has a first end and a second end. The plurality of first conductor portions 231 to 234 and the plurality of second conductor portions 241 to 244 are appropriately connected to each other by the plurality of via conductors 221 to 227. More specifically, in the second inductor L2, the first end of the first conductor portion 231 is connected to the through-wiring portion 211, and the second end of the first conductor portion 231 is connected to the first end of the second conductor portion 241 with the via conductor 221 interposed therebetween. In addition, the second end of the second conductor portion 241 is connected to the first end of the first conductor portion 232 with the via conductor 222 interposed therebetween, and the second end of the first conductor portion 232 is connected to the first end of the second conductor portion 242 with the via conductor 223 interposed therebetween. In addition, the second end of the second conductor portion 242 is connected to the first end of the first conductor portion 233 with the via conductor 224 interposed therebetween, and the second end of the first conductor portion 233 is connected to the first end of the second conductor portion 243 with the via conductor 225 interposed therebetween. In addition, the second end of the second conductor portion 243 is connected to the first end of the first conductor portion 234 with the via conductor 226 interposed therebetween. In addition, the second end of the first conductor portion 234 is connected to the first end of the second conductor portion 244 with the via conductor 227 interposed therebetween. In addition, in the second inductor L2, the second end of the second conductor portion 244 is connected to the metal electrode layer 10 with the connection via conductor 251 interposed therebetween.

The materials of the plurality of first conductor portions 231 to 234, the plurality of via conductors 221 to 227, and the plurality of second conductor portions 241 to 244 include, for example, copper.

(2) Effects

According to the high-frequency module 100*f* according to Embodiment 7, since the winding axis A2 of the second inductor L2 is parallel to the fourth main surface 52 of the second chip 5, a magnetic flux generated in the second inductor L2 is less likely to be blocked by the metal electrode layer 10. Accordingly, in the high-frequency module 100*f* according to Embodiment 7, it is possible to suppress deterioration in a Q value (quality factor) of the second inductor L2, and it is possible to suppress deterioration in the characteristics of the second filter 2.

Embodiment 8

Figure 17:
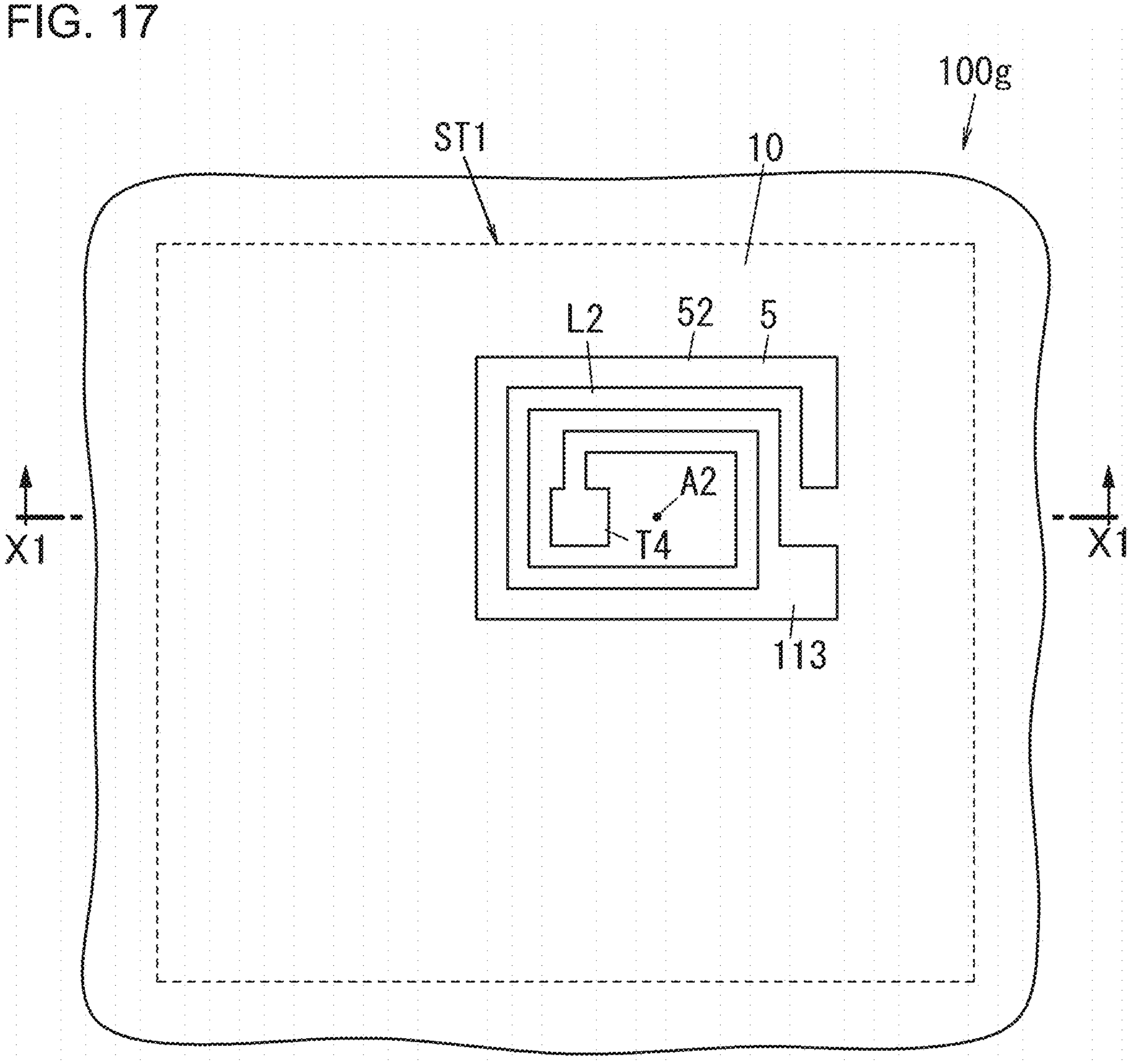
FIG. 17 is a plan view of a high-frequency module according to Embodiment 8.
Figure 18:
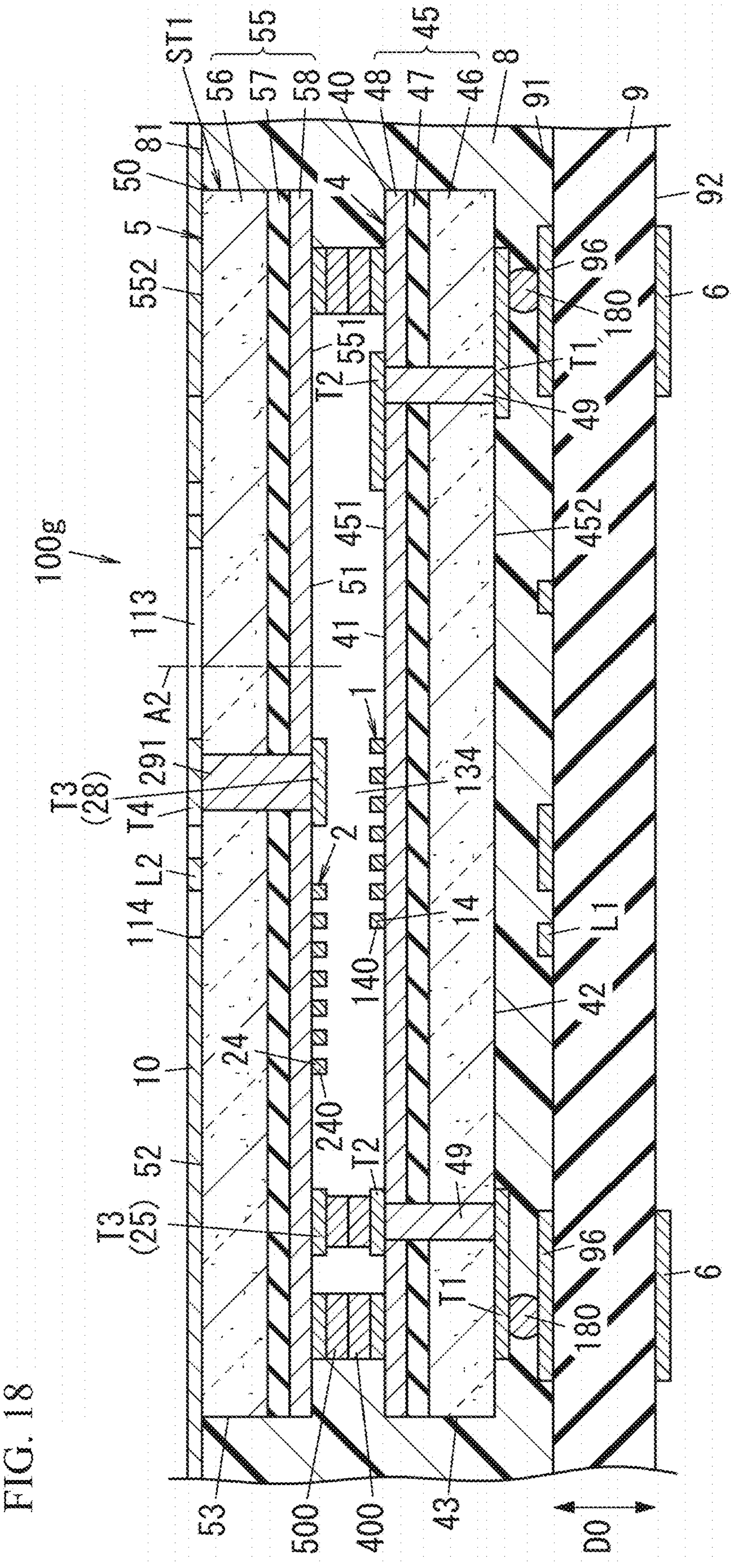
FIG. 18 is a cross-sectional view of the high-frequency module taken along line X1-X1 in FIG. 17.

A high-frequency module 100*g* according to Embodiment 8 will be described with reference to FIGS. 17 and 18. Regarding the high-frequency module 100*g* according to Embodiment 8, the same components as the high-frequency module 100 (see FIGS. 1 to 3) according to Embodiment 1 are attached with the same reference numerals, and the description thereof will be omitted.

(1) Configuration

The high-frequency module 100*g* according to Embodiment 8 is different from the high-frequency module 100 according to Embodiment 1 in that the insulating layer 7 in the high-frequency module 100 according to Embodiment 1 is not provided. In addition, the high-frequency module 100*g* according to Embodiment 8 is different from the high-frequency module 100 according to Embodiment 1 in that a part of the first inductor L1 and a part of the second inductor L2 overlap each other in a plan view from the thickness direction D0 of the mounting substrate 9.

In the high-frequency module 100*g*, the metal electrode layer 10 covers the main surface 81 and the outer peripheral surface of the resin layer 8 and a part of the fourth main surface 52 of the second chip 5. In a plan view from the thickness direction D0 of the mounting substrate 9, the metal electrode layer 10 has a cavity 113 smaller than the second chip 5. In a plan view from the thickness direction D0 of the mounting substrate 9, the opening shape of the cavity 113 of the metal electrode layer 10 is a rectangular shape, but is not limited thereto, and may be, for example, a circular shape. In a plan view from the thickness direction D0 of the mounting substrate 9, the opening edge 114 of the cavity 113 of the metal electrode layer 10 is positioned inside the outer edge 50 of the second chip 5.

In the high-frequency module 100*g*, the material of the conductor pattern portion constituting the second inductor L2 is the same as the material of the metal electrode layer 10. In addition, the thickness of the conductor pattern portion constituting the second inductor L2 is the same as the thickness of the portion of the metal electrode layer 10 disposed on the fourth main surface 52 of the second chip 5.

The cavity 113 of the metal electrode layer 10 is formed such that the metal electrode layer 10 does not overlap the second inductor L2 in a plan view from the thickness direction D0 of the mounting substrate 9. Therefore, the cavity 113 of the metal electrode layer 10 is formed such that the metal electrode layer 10 does not overlap the winding axis A2 of the second inductor L2.

(2) Effects

According to the high-frequency module 100*g* of Embodiment 8, since the metal electrode layer 10 is in contact with a part of the fourth main surface 52 of the second chip 5, the heat dissipation properties can be improved, and the deterioration of the characteristics can be suppressed. In addition, in the high-frequency module 100*g*, since the second inductor L2 is disposed on the fourth main surface 52 of the second chip 5 and is connected to the ground with the metal electrode layer 10 interposed therebetween, the parasitic inductance can be reduced, and the deterioration of the characteristics can be suppressed.

Embodiment 9

Figure 19:
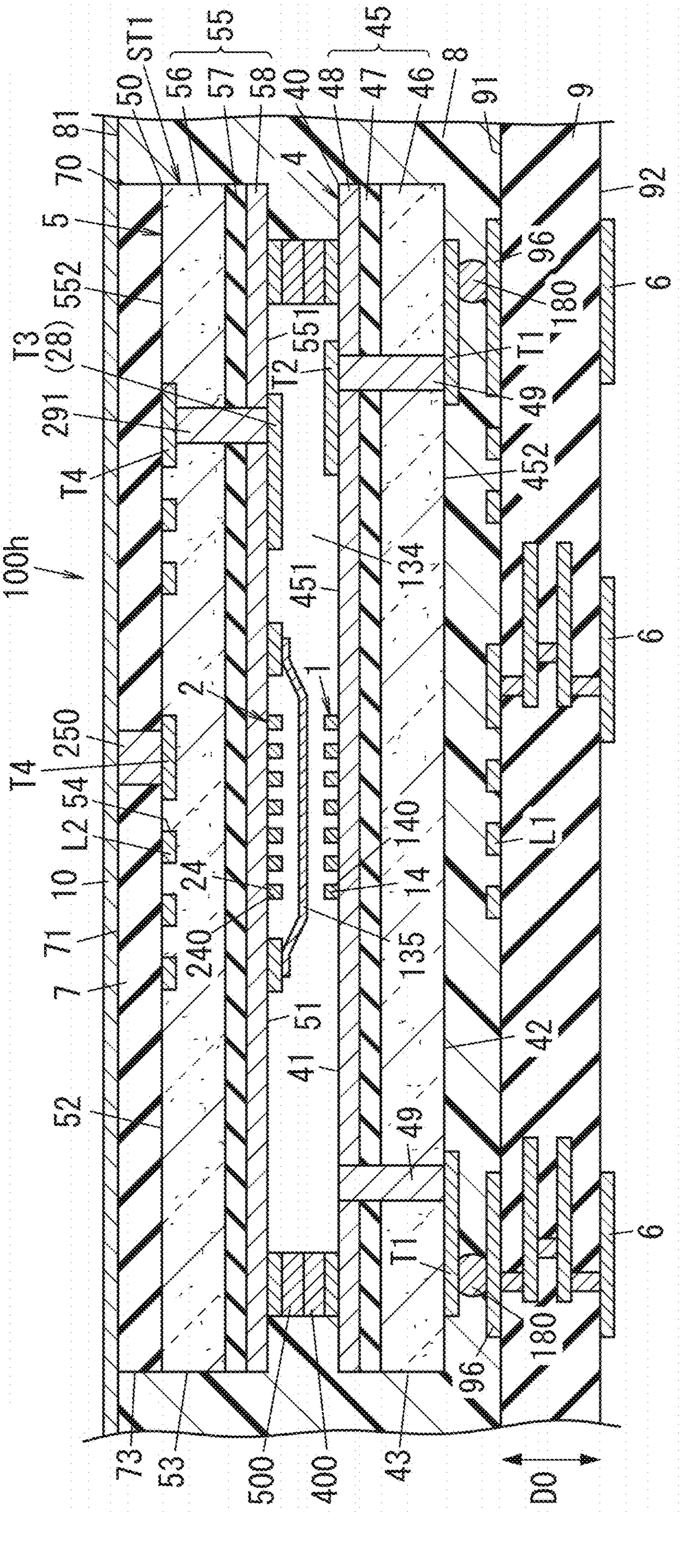
FIG. 19 is a cross-sectional view of a high-frequency module according to Embodiment 9.

A high-frequency module 100*h* according to Embodiment 9 will be described with reference to FIG. 19. Regarding the high-frequency module 100*h* according to Embodiment 9, the same components as the high-frequency module 100*a* (see FIG. 7) according to Embodiment 2 are attached with the same reference numerals, and the description thereof will be omitted.

(1) Configuration

The high-frequency module 100*h* according to Embodiment 9 is different from the high-frequency module 100*a* according to Embodiment 2 in that the second inductor L2 is disposed in the recess portion 54 formed in the fourth main surface 52 of the second chip 5.

In a plan view from the thickness direction D0 of the mounting substrate 9, the recess portion 54 has a spiral shape. The second inductor L2 is configured with a conductor pattern portion (conductor layer) embedded in the recess portion 54. Therefore, the second inductor L2 has a spiral shape in a plan view from the thickness direction D0 of the mounting substrate 9.

(2) Manufacturing Method

A manufacturing method of the high-frequency module 100*h* according to Embodiment 9 is substantially the same as the manufacturing method of the high-frequency module 100 (refer to FIGS. 1 to 3) according to Embodiment 1.

In the manufacturing method of the high-frequency module 100*h*, for example, the recess portion 54 can be formed by forming a resist layer having an opening for forming the recess portion 54 on the fourth main surface 552 of the second substrate 55 during the manufacturing of the second chip 5 and etching the second substrate 55 from the fourth main surface 552 side using the resist layer as a mask. In addition, the second inductor L2 consisting of a conductor layer embedded in the recess portion 54 can be formed by vapor-depositing a conductor layer including a material of the second inductor L2 in the recess portion 54 using the resist layer as a mask and lifting off the resist layer and the unnecessary conductor layer on the resist layer. In addition, in a case where the material of the second high acoustic velocity member 56 is, for example, silicon, the second chip 5 may have an insulating film between the inner surface of the recess portion 54 and the second inductor L2. The material of the insulating film includes, for example, silicon oxide.

(3) Effect

In the high-frequency module 100*h* according to Embodiment 9, the second inductor L2, which is the second circuit element, is disposed in the recess portion 54 formed in the fourth main surface 52 of the second chip 5. Accordingly, the high-frequency module 100*h* can achieve reduction in height.

Embodiment 10

Figure 20:
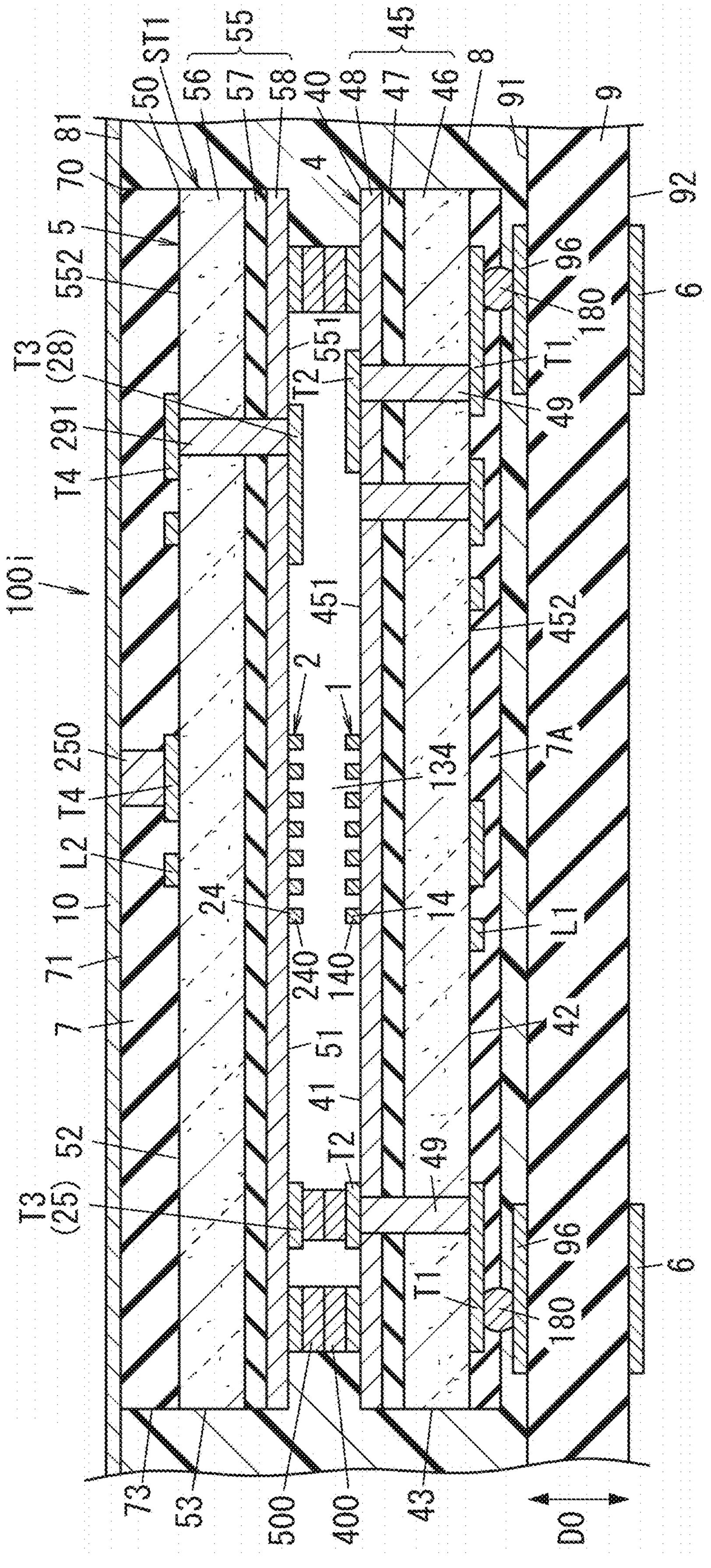
FIG. 20 is a cross-sectional view of a high-frequency module according to Embodiment 10.

A high-frequency module 100*i* according to Embodiment 10 will be described with reference to FIG. 20. Regarding the high-frequency module 100*i* according to Embodiment 10, the same components as the high-frequency module 100 (see FIGS. 1 to 4B) according to Embodiment 1 are attached with the same reference numerals, and the description thereof will be omitted.

(1) Configuration

The high-frequency module 100*i* according to Embodiment 10 is different from the high-frequency module 100 according to Embodiment 1 in that the first inductor L1 of the first filter 1 is disposed on the second main surface 42 of the first chip 4. In addition, the high-frequency module 100*i* according to Embodiment 10 is different from the high-frequency module 100 according to Embodiment 1 in that a part of the first inductor L1 and a part of the second inductor L2 overlap each other in a plan view from the thickness direction D0 of the mounting substrate 9. In addition, the high-frequency module 100*i* further includes an insulating layer 7A that is disposed on the second main surface 42 of the first chip 4 and covers the first inductor L1, in addition to the insulating layer 7 that is disposed on the fourth main surface 52 of the second chip 5 and covers the second inductor L2.

(2) Effects

In the high-frequency module 100*i* according to Embodiment 10, a wiring length between the parallel arm resonator P14 of the first filter 1 and the first inductor L1 can be shortened as compared with a case where the first inductor L1 is provided on the mounting substrate 9, and it is possible to suppress a deterioration in characteristics.

Embodiment 11

Figure 21:
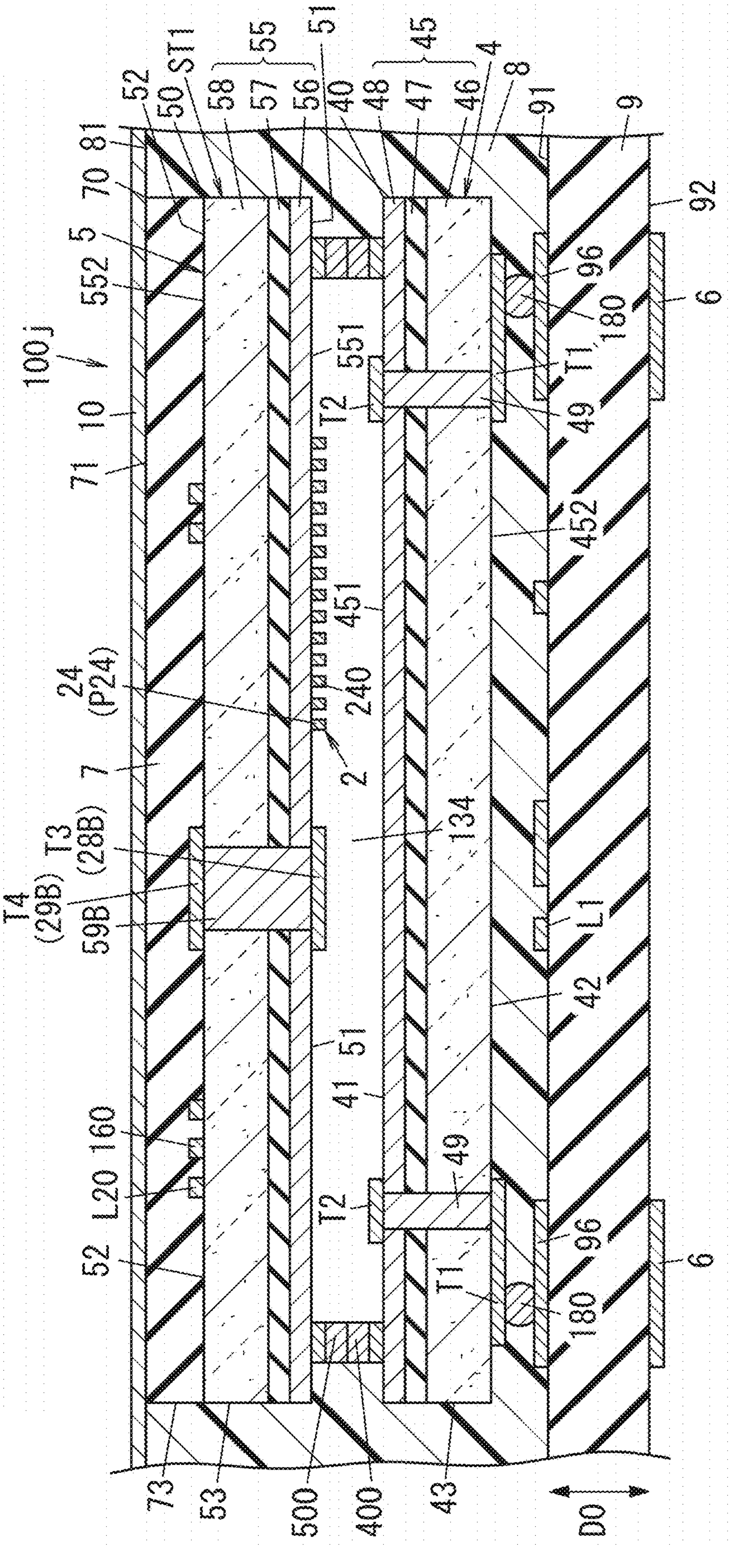
FIG. 21 is a cross-sectional view of a high-frequency module according to Embodiment 11.
Figure 22:
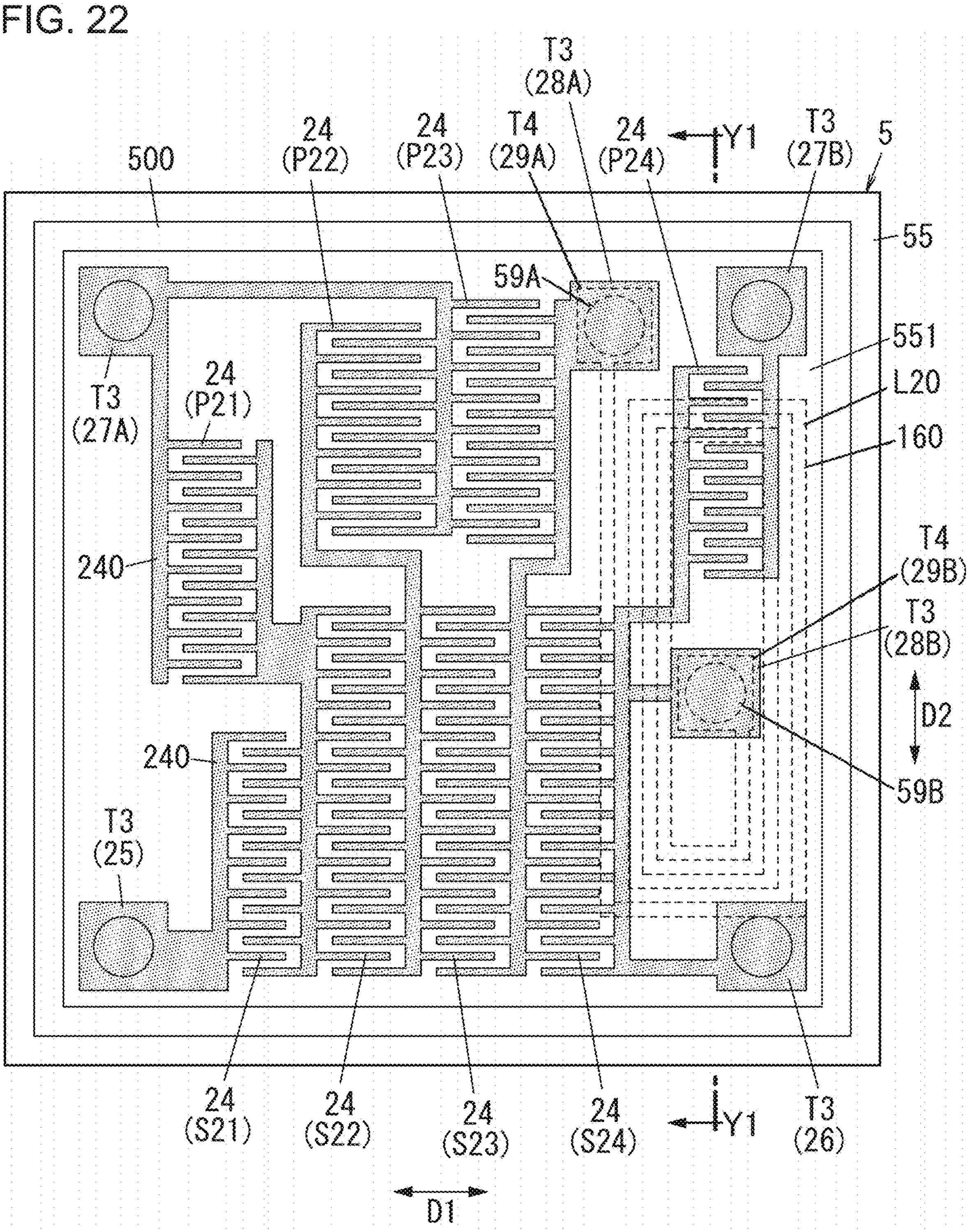
FIG. 22 is a bottom view of a second chip in the high-frequency module.

A high-frequency module 100*j* according to Embodiment 11 will be described with reference to FIGS. 21 to 23. Regarding the high-frequency module 100*j* according to Embodiment 11, the same components as the high-frequency module 100 (see FIGS. 1 to 4B) according to Embodiment 1 are attached with the same reference numerals, and the description thereof will be omitted. FIG. 21 is a cross-sectional view of the high-frequency module 100*j* corresponding to a cross section taken along line Y1-Y1 of FIG. 22. In FIG. 22, the first direction D1 and the second direction D2 are illustrated as in FIG. 5 described in Modification Example 1 of Embodiment 1. In addition, in FIG. 22, the hatching of dots is also provided as in FIG. 5, but the hatching of dots in FIG. 22 is not intended to represent a cross section, but is merely provided to make the drawing easy to see.

(1) Configuration

Figure 23:
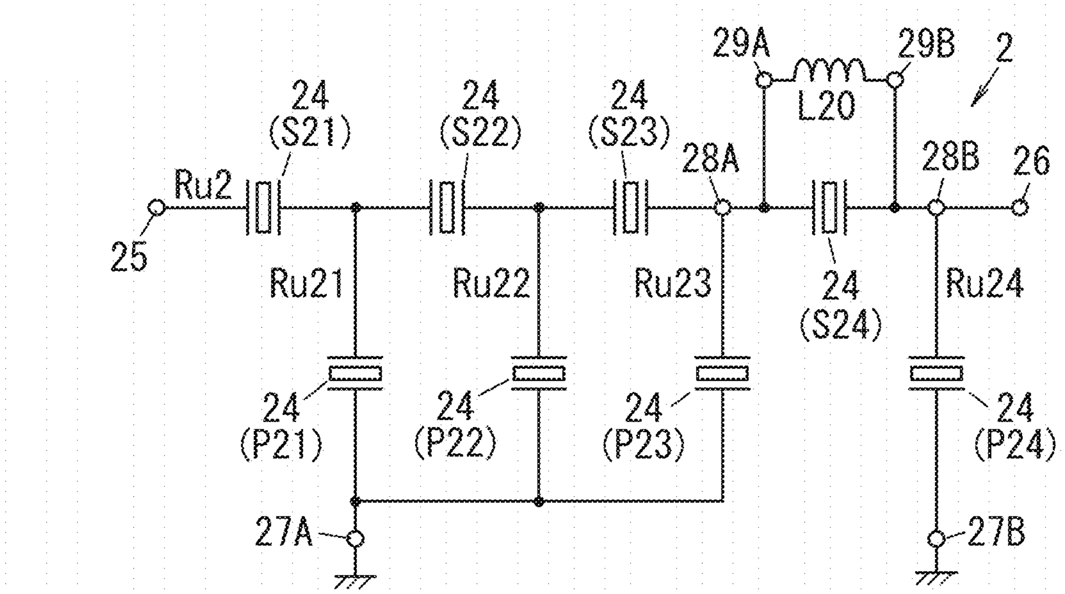
FIG. 23 is a circuit diagram of the second filter in the high-frequency module.

The high-frequency module 100*j* according to Embodiment 11 is different from the high-frequency module 100 according to Embodiment 1 in that an inductor L20 is provided instead of the second inductor L2 of the second filter 2 (see FIG. 4B) in the high-frequency module 100 according to Embodiment 1, as illustrated in FIG. 23. In the high-frequency module 100*j*, the second circuit element related to the second filter 2 includes an inductor L20 that is connected in parallel to one (the series arm resonator S24) of the plurality of series arm resonators S21 to S24.

The inductor L20 is directly connected to two parallel arm resonators P23 and P24 among the plurality (four) of parallel arm resonators P21 to P24. The inductor L20 is connected to two remaining parallel arm resonators P21 and P22 of the plurality of parallel arm resonators P21 to P24 with at least one other second acoustic wave resonator 24 interposed therebetween. More specifically, the parallel arm resonator P22 is connected to the inductor L20 with one series arm resonator S23 interposed therebetween, and the parallel arm resonator P21 is connected to the inductor L20 with two series arm resonators S22 and S23 interposed therebetween. In addition, the series arm resonator S22 is connected to the inductor L20 with one series arm resonator S23 interposed therebetween, and the series arm resonator S21 is connected to the inductor L20 with two series arm resonators S22 and S23 interposed therebetween.

The inductor L20 is disposed on the fourth main surface 52 of the second chip 5 as illustrated in FIG. 21. The inductor L20 is covered with the insulating layer 7. As illustrated in FIG. 22, the inductor L20 includes a spiral conductor pattern portion 160. The material of the conductor pattern portion 160 includes, for example, copper.

In the high-frequency module 100*j*, the plurality of third terminal electrodes T3 included in the second chip 5 include a third input/output terminal 25, a fourth input/output terminal 26, a second ground terminal 27A, a second ground terminal 27B, a second connection terminal 28A, and a second connection terminal 28B. The second connection terminal 28A is a terminal to which two series arm resonators S23 and S24 and one parallel arm resonator P23 are connected. The second connection terminal 28B is a terminal to which the fourth input/output terminal 26, one series arm resonator S24, and one parallel arm resonator P24 are connected. In addition, in the high-frequency module 100*j*, the plurality of fourth terminal electrodes T4 included in the second chip 5 include a first connection electrode 29A to which the first end of the inductor L20 is connected, and a second connection electrode 29B to which the second end of the inductor L20 is connected. The second chip 5 has a through-wiring portion 59A that connects the second connection terminal 28A and the first connection electrode 29A to each other, and a through-wiring portion 59B that connects the second connection terminal 28B and the second connection electrode 29B to each other.

In the plan view from the thickness direction D0 of the mounting substrate 9, as illustrated in FIG. 22, the inductor L20 overlaps at least one of two parallel arm resonators P23 and P24 directly connected to the inductor L20 among the plurality of parallel arm resonators P21 to P24 and the series arm resonator S24 to which the inductor L20 is connected in parallel among the plurality of series arm resonators S21 to S24, and does not overlap any of the remaining second acoustic wave resonators 24 (in the example of FIG. 22, three series arm resonators S21 to S23 and three parallel arm resonators P21 to P23) among the plurality of second acoustic wave resonators 24. The inductor L20 may overlap both of the two parallel arm resonators P23 and P24 in a plan view from the thickness direction D0 of the mounting substrate 9.

(2) Effects

In the high-frequency module 100*j* according to Embodiment 11, in a plan view from the thickness direction D0 of the mounting substrate 9, the inductor L20 overlaps the parallel arm resonator P24 and the series arm resonator S24 and does not overlap any of the remaining second acoustic wave resonators 24 among the plurality of second acoustic wave resonators 24. Therefore, it is possible to suppress the deterioration of attenuation while achieving reduction in size.

Embodiment 12

Figure 24:
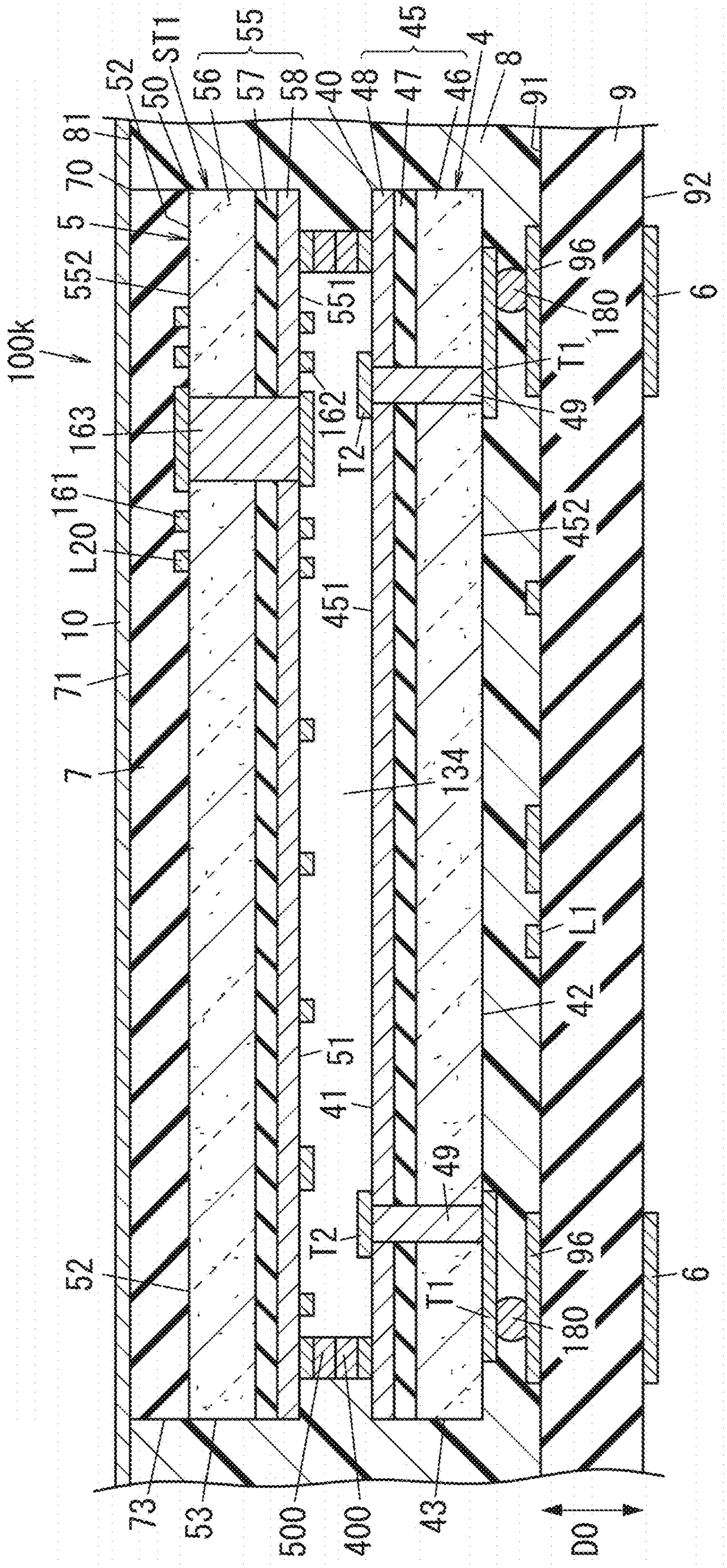
FIG. 24 is a cross-sectional view of a high-frequency module according to Embodiment 12.
Figure 25:
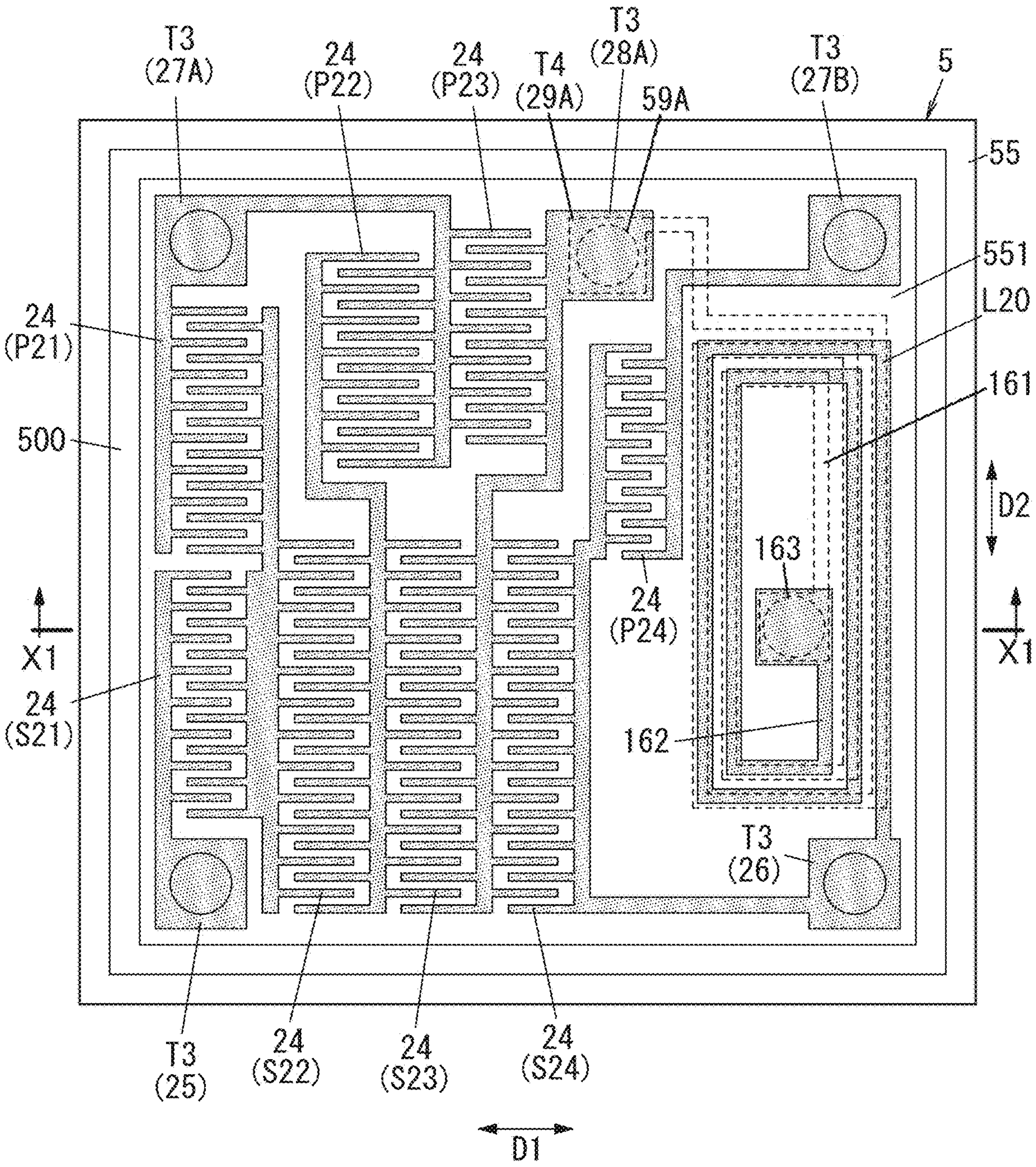
FIG. 25 is a bottom view of a second chip in the high-frequency module.

A high-frequency module 100*k* according to Embodiment 12 will be described with reference to FIGS. 24 to 26. Regarding the high-frequency module 100*k* according to Embodiment 12, the same components as the high-frequency module 100 (see FIGS. 2 and 3) according to Embodiment 1 are attached with the same reference numerals, and the description thereof will be omitted. FIG. 24 is a cross-sectional view of the high-frequency module 100*k* corresponding to the cross section taken along line X1-X1 of FIG. 25. In FIG. 25, the first direction D1 and the second direction D2 are illustrated as in FIG. 5 described in Modification Example 1 of Embodiment 1. In addition, in FIG. 25, the hatching of dots is also provided as in FIG. 5, but the hatching of dots in FIG. 25 is not intended to represent a cross section, but is merely provided to make the drawing easier to see.

(1) Configuration

Figure 26:
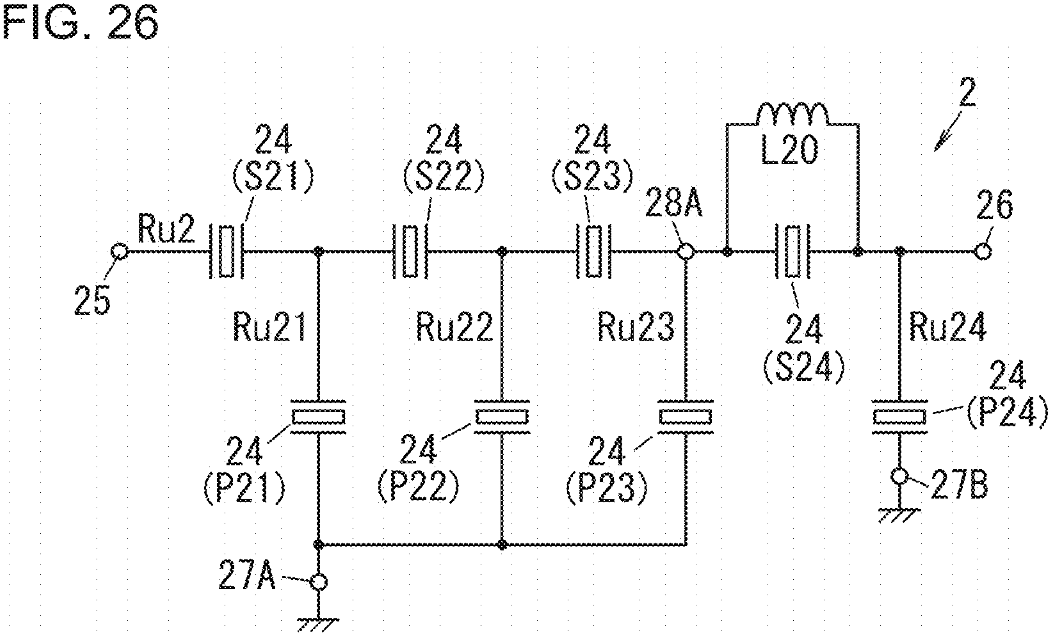
FIG. 26 is a circuit diagram of a second filter in the high-frequency module.

The high-frequency module 100*k* according to Embodiment 12 is different from the high-frequency module 100 according to Embodiment 1 in that an inductor L20 is provided instead of the second inductor L2 of the second filter 2 (see FIG. 4B) in the high-frequency module 100 according to Embodiment 1, as illustrated in FIG. 26.

The inductor L20 is directly connected to two parallel arm resonators P23 and P24 among the plurality (four) of parallel arm resonators P21 to P24. The inductor L20 is connected to two remaining parallel arm resonators P21 and P22 of the plurality of parallel arm resonators P21 to P24 with at least one other second acoustic wave resonator 24 interposed therebetween. More specifically, the parallel arm resonator P22 is connected to the inductor L20 with one series arm resonator S23 interposed therebetween, and the parallel arm resonator P21 is connected to the inductor L20 with two series arm resonators S22 and S23 interposed therebetween. In addition, the series arm resonator S22 is connected to the inductor L20 with one series arm resonator S23 interposed therebetween, and the series arm resonator S21 is connected to the inductor L20 with two series arm resonators S22 and S23 interposed therebetween.

In the high-frequency module 100*k*, the second circuit element related to the second filter 2 includes a first conductor pattern portion 161 (see FIGS. 24 and 25) that is a part of an inductor L20 connected in parallel to one (the series arm resonator S24) of the plurality of series arm resonators S21 to S24. The remaining portion of the inductor L20 includes a second conductor pattern portion 162 that is disposed on the third main surface 51 of the second chip 5, and a conductor portion 163 that penetrates the second chip 5 in the thickness direction and connects the first conductor pattern portion 161 and the second conductor pattern portion 162 to each other. In a plan view from the thickness direction D0 of the mounting substrate 9, the first conductor pattern portion 161 has a spiral shape. In addition, in a plan view from the thickness direction D0 of the mounting substrate 9, the second conductor pattern portion 162 has a spiral shape. The materials of the first conductor pattern portion 161, the second conductor pattern portion 162, and the conductor portion 163 include, for example, copper.

In the high-frequency module 100*k*, in a plan view from the thickness direction D0 of the mounting substrate 9, the first conductor pattern portion 161 disposed on the fourth main surface 52 of the second chip 5 and the second conductor pattern portion 162 disposed on the third main surface 51 of the second chip 5 overlap each other. In the high-frequency module 100*k*, a part of the first conductor pattern portion 161 and a part of the second conductor pattern portion 162 overlap each other, but the present disclosure is not limited thereto. A part of the first conductor pattern portion 161 may overlap the entire second conductor pattern portion 162, the entire first conductor pattern portion 161 may overlap a part of the second conductor pattern portion 162, or the entire first conductor pattern portion 161 may overlap the entire second conductor pattern portion 162. The first conductor pattern portion 161 is covered with the insulating layer 7. In the high-frequency module 100*k*, the plurality of third terminal electrodes T3 included in the second chip 5 include the third input/output terminal 25, the fourth input/output terminal 26, the second ground terminal 27A, the second ground terminal 27B, and the second connection terminal 28A. The second connection terminal 28A is a terminal to which two series arm resonators S23 and S24 and one parallel arm resonator P23 are connected. In addition, in the high-frequency module 100*k*, the plurality of fourth terminal electrodes T4 included in the second chip 5 include the first connection electrode 29A to which the first end of the inductor L20 is connected. The second chip 5 has a through-wiring portion 59A that connects the second connection terminal 28A and the first connection electrode 29A to each other.

In a plan view from the thickness direction D0 of the mounting substrate 9, the inductor L20 does not overlap any of the plurality of second acoustic wave resonators 24 as illustrated in FIG. 25.

(2) Effects

In the high-frequency module 100*k* according to Embodiment 12, since the second circuit element includes the first conductor pattern portion 161 that is a part of the inductor L20 and the remaining portion of the inductor L20 includes the second conductor pattern portion 162 and the conductor portion 163, it is possible to further increase the inductance of the inductor L20.

In addition, in the high-frequency module 100*k* according to Embodiment 12, the first conductor pattern portion 161 and the second conductor pattern portion 162 overlap each other in a plan view from the thickness direction D0 of the mounting substrate 9, so that it is possible to increase the inductance of the inductor L20 while achieving reduction in size.

Embodiment 13

A high-frequency module 100*m* according to Embodiment 13 will be described with reference to FIGS. 27, 28A, and 28B. Regarding the high-frequency module 100*m* according to Embodiment 13, the same components as the high-frequency module 100*a* (see FIG. 7) according to Embodiment 2 are attached with the same reference numerals, and the description thereof will be omitted.

(1) Configuration

Figure 28A:
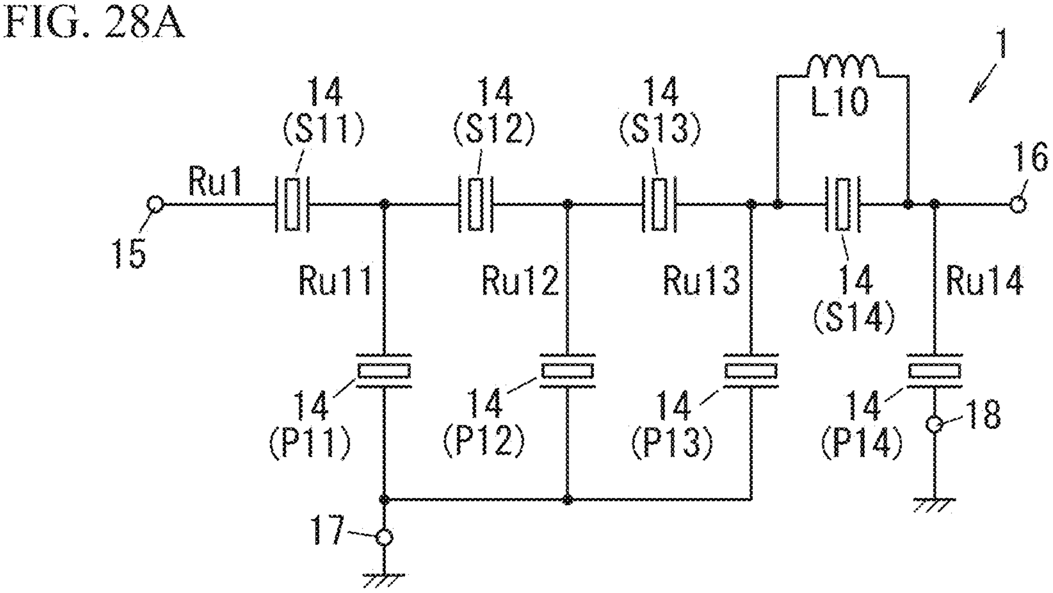
FIG. 28A is a circuit diagram of a first filter in the high-frequency module.

The high-frequency module 100*m* according to Embodiment 13 is different from the high-frequency module 100*a* according to Embodiment 2 in that the inductor L1 of the first filter 1 (see FIG. 4A) in the high-frequency module 100 according to Embodiment 1 is not provided and an inductor L10 connected in parallel to the series arm resonator S14 is provided, as illustrated in FIG. 28A.

Figure 27:
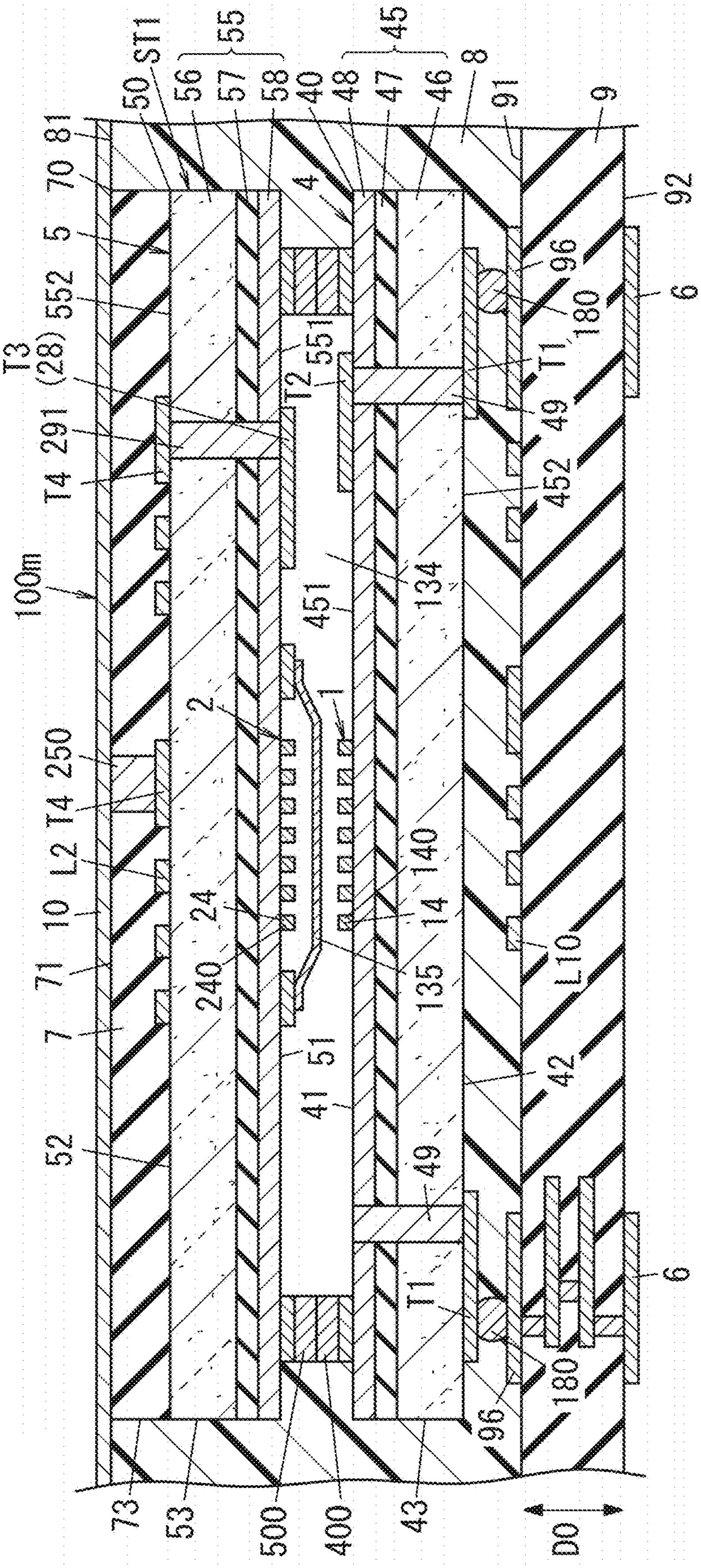
FIG. 27 is a cross-sectional view of a high-frequency module according to Embodiment 13.
Figure 28B:
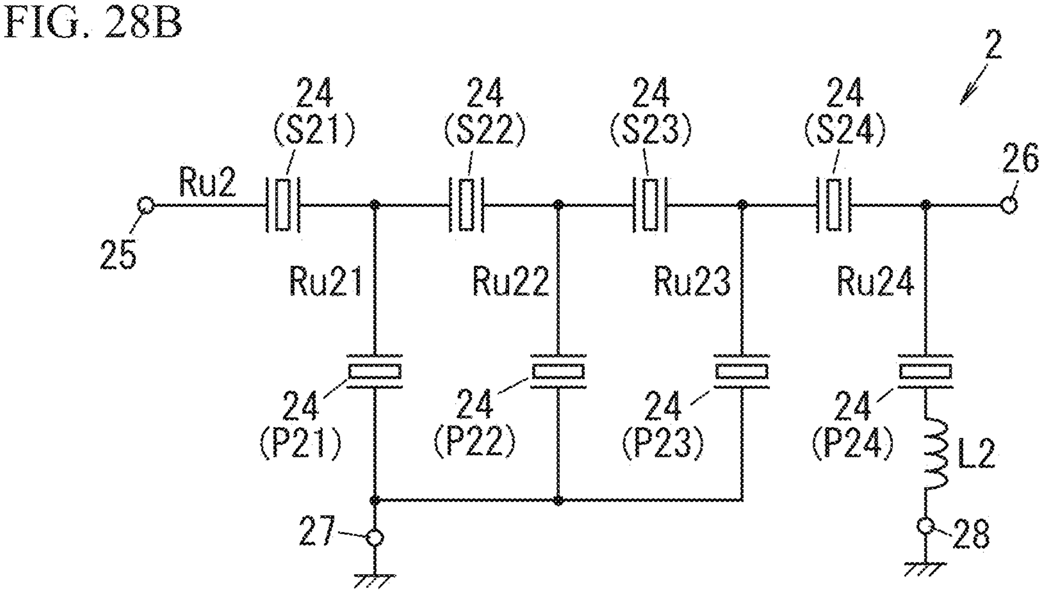
FIG. 28B is a circuit diagram of a second filter in the high-frequency module.

In the high-frequency module 100*m*, as illustrated in FIG. 27, the inductor L10 is included in a first circuit element related to the first filter 1 (see FIG. 28A) and is disposed on the second main surface 42 side of the first chip 4. The inductor L10 is provided on the mounting substrate 9, but the present disclosure is not limited thereto, and the inductor L10 may be disposed on the second main surface 42 of the first chip 4.

In the high-frequency module 100*m*, the inductor L2 is included in a second circuit element related to the second filter 2 (see FIG. 28B), and is disposed on the fourth main surface 52 of the second chip 5.

(2) Effects

In the high-frequency module 100*m* according to Embodiment 13, since the inductor L10, which is the first circuit element related to the first filter 1, is disposed on the second main surface 42 side of the first chip 4, and the inductor L2, which is the second circuit element related to the second filter 2, is disposed on the fourth main surface 52 of the second chip 5, it is possible to suppress the deterioration of the characteristics while achieving reduction in size. More specifically, according to the high-frequency module 100*m*, the second chip 5 is disposed on a side of the first chip 4 opposite to the mounting substrate 9 side, so that the size can be reduced. In addition, according to the high-frequency module 100*m*, it is possible to shorten the wiring length between the inductor L2 and the second acoustic wave resonator 24 to which the inductor L2 is connected in the second chip 5, and it is possible to suppress the deterioration of the characteristics of the second filter 2. In addition, according to the high-frequency module 100*m*, since the inductor L10 related to the first filter 1 is disposed on the second main surface 42 side of the first chip 4 and the inductor L2 included in the second filter 2 is disposed on the fourth main surface 52 of the second chip 5, isolation between the inductor L10 and the inductor L2 can be improved. Accordingly, the high-frequency module 100*m* can suppress the deterioration of the characteristics of each of the first filter 1 and the second filter 2.

Modification Example of Embodiment 13

Figure 29:
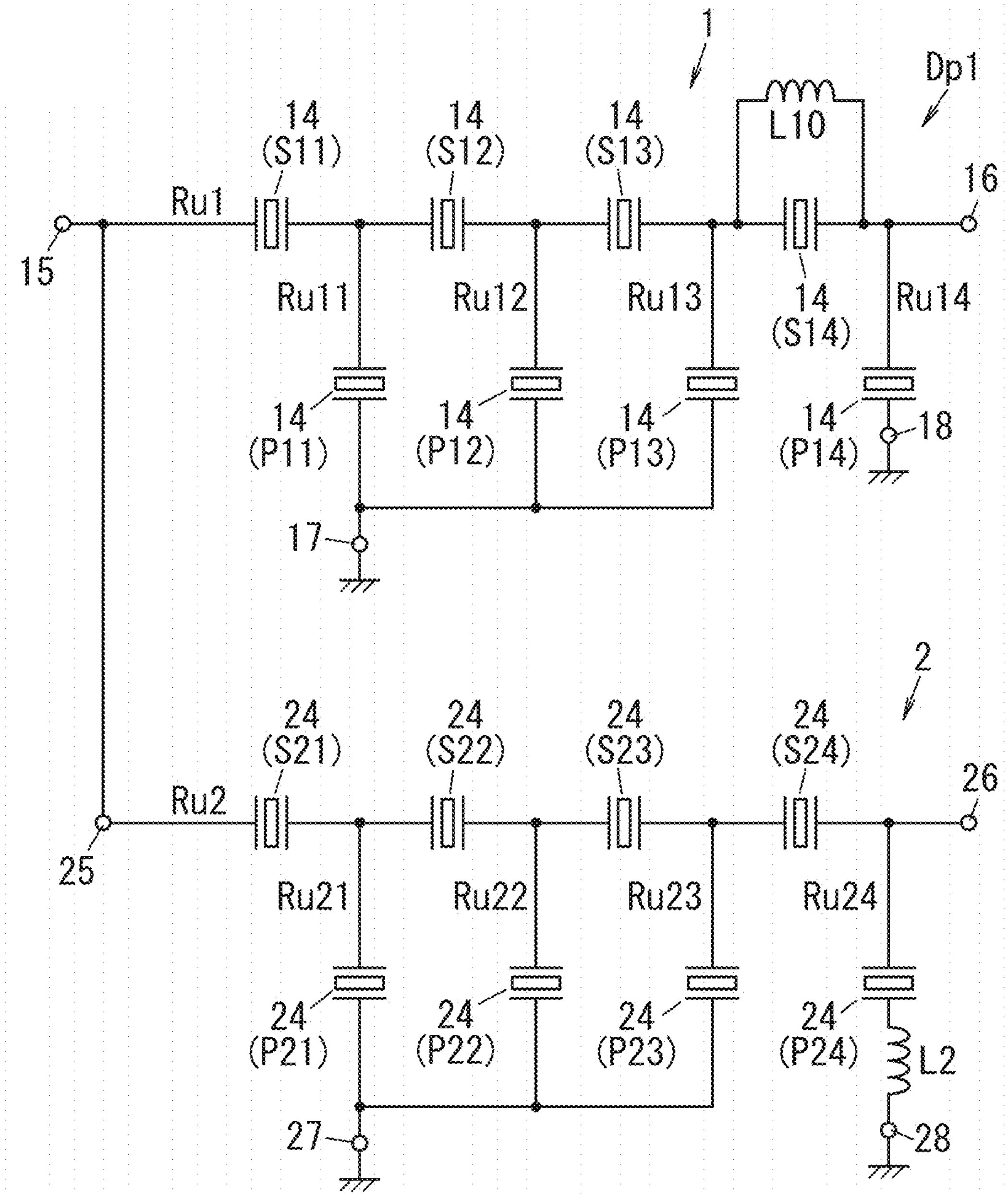
FIG. 29 is a circuit diagram of a main portion of a high-frequency module according to Modification Example of Embodiment 13.

The high-frequency module 100*m* according to the modification example of Embodiment 13 is different from the high-frequency module 100*m* according to Embodiment 13 in that the third input/output terminal 25 of the second filter 2 is connected to the first input/output terminal 15 of the first filter 1, and a duplexer Dp1 including the first filter 1 and the second filter 2 is provided, as illustrated in FIG. 29.

Embodiment 14

A high-frequency module 100*n* according to Embodiment 14 will be described with reference to FIGS. 30 and 31. Regarding the high-frequency module 100*n* according to Embodiment 14, the same components as the high-frequency module 100 (see FIGS. 1 to 4B) according to Embodiment 1 are attached with the same reference numerals, and the description thereof will be omitted.

(1) Configuration

Figure 31:
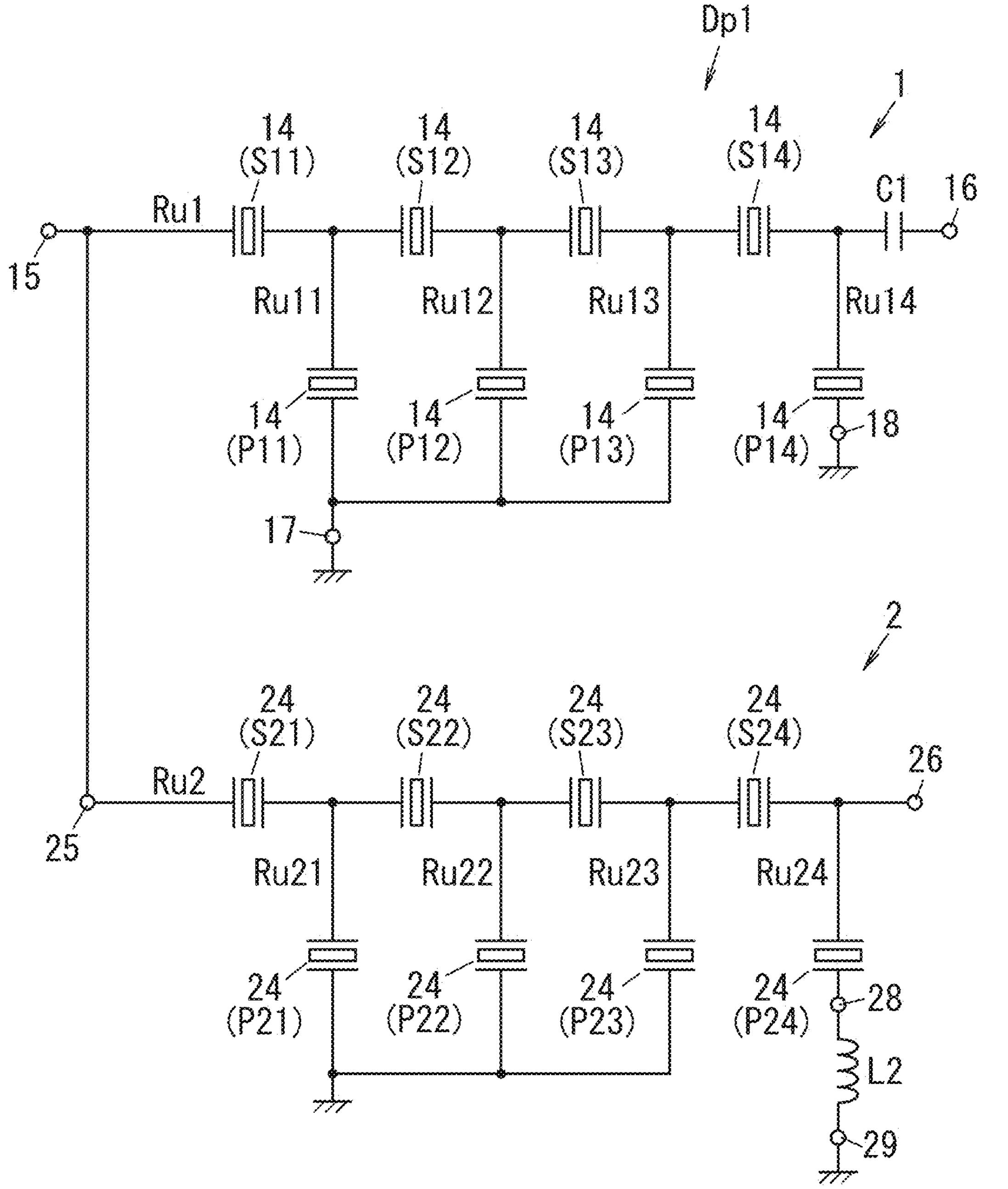
FIG. 31 is a circuit diagram of a main portion of the high-frequency module.

The high-frequency module 100*n* according to Embodiment 14 is different from the high-frequency module 100 according to Embodiment 1 in that the inductor L1 of the first filter 1 in the high-frequency module 100 according to Embodiment 1 is not provided, as illustrated in FIG. 31. In addition, the high-frequency module 100*n* according to Embodiment 14 is different from the high-frequency module 100 according to Embodiment 1 in that a capacitor C1 is provided, the capacitor C1 being connected between the series arm resonator S14 closest to the second input/output terminal 16 in the first signal path Ru1 and the second input/output terminal 16. In addition, the high-frequency module 100*n* includes a duplexer Dp1 in which the third input/output terminal 25 of the second filter 2 is connected to the first input/output terminal 15 of the first filter 1 and which includes the first filter 1 and the second filter 2.

Figure 30:
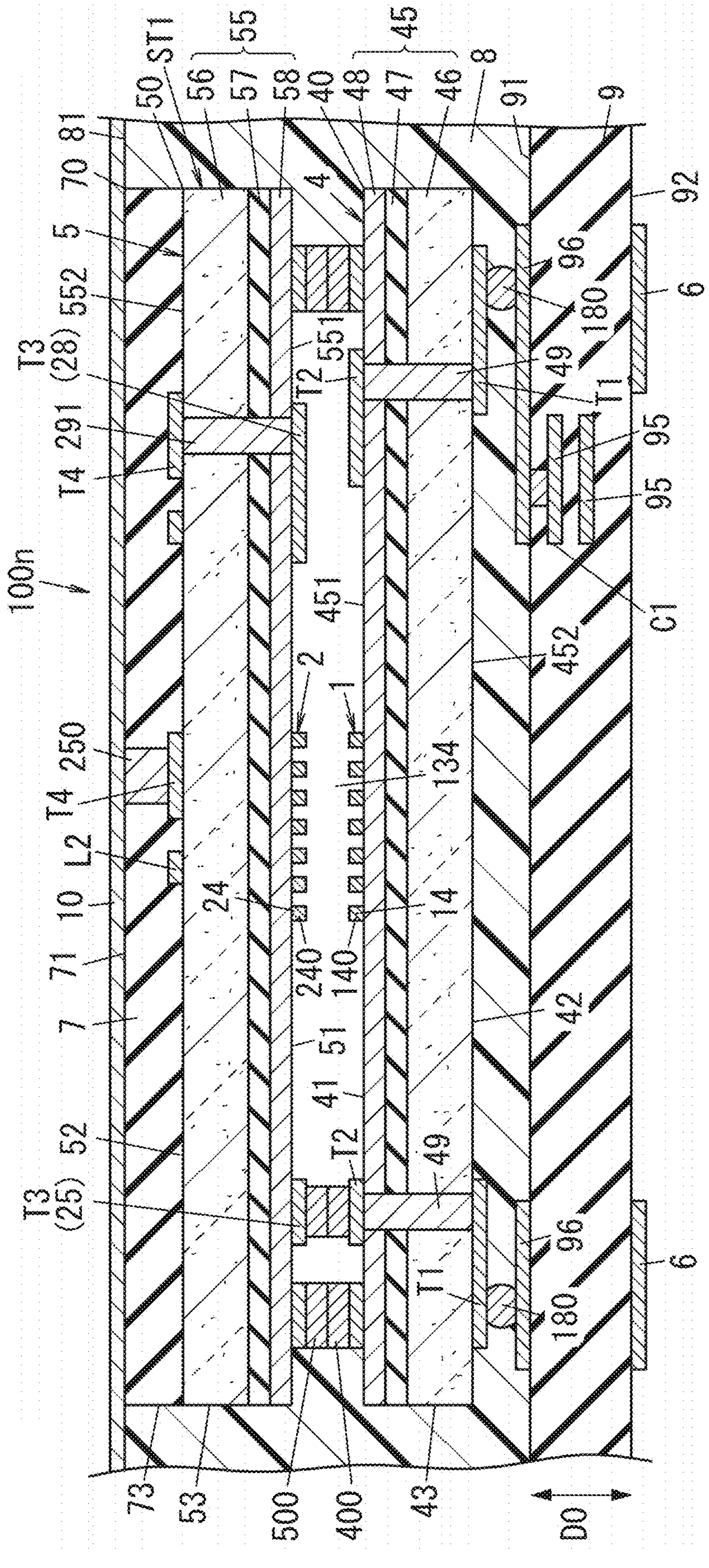
FIG. 30 is a cross-sectional view of a high-frequency module according to Embodiment 14.

The capacitor C1 is provided on the mounting substrate 9, for example, as illustrated in FIG. 30. More specifically, the capacitor C1 is incorporated in the mounting substrate 9. The capacitor C1 is a capacitor including two conductor pattern portions 95 formed in the mounting substrate 9. Here, the two conductor pattern portions 95 overlap each other in the thickness direction D0 of the mounting substrate 9 and are separated from each other.

In the high-frequency module 100*n*, the capacitor C1 is included in the first circuit element related to the first filter 1 and is disposed on the second main surface 42 side of the first chip 4. The capacitor C1 is provided on the mounting substrate 9, but the present disclosure is not limited thereto, and the capacitor C1 may be disposed on the second main surface 42 of the first chip 4.

In the high-frequency module 100*n*, the inductor L2 is included in the second circuit element related to the second filter 2 and is disposed on the fourth main surface 52 of the second chip 5.

(2) Effects

In the high-frequency module 100*n* according to Embodiment 14, since the capacitor C1, which is the first circuit element related to the first filter 1, is disposed on the second main surface 42 side of the first chip 4, and the inductor L2, which is the second circuit element related to the second filter 2, is disposed on the fourth main surface 52 of the second chip 5, it is possible to suppress the deterioration of the characteristics while achieving the reduction in size. More specifically, according to the high-frequency module 100*n*, since the second chip 5 is disposed on a side of the first chip 4 opposite to the mounting substrate 9 side, it is possible to achieve reduction in size. In addition, according to the high-frequency module 100*n*, it is possible to shorten the wiring length between the second inductor L2 and the second acoustic wave resonator 24 to which the second inductor L2 is connected in the second chip 5, and it is possible to suppress the deterioration of the characteristics of the second filter 2. In addition, according to the high-frequency module 100*n*, since the capacitor C1 related to the first filter 1 is disposed on the second main surface 42 side of the first chip 4 and the inductor L2 included in the second filter 2 is disposed on the fourth main surface 52 of the second chip 5, isolation between the capacitor C1 and the inductor L2 can be improved. Accordingly, the high-frequency module 100*n* can suppress the deterioration of the characteristics of each of the first filter 1 and the second filter 2.

Modification Example 1 of Embodiment 14

In Modification Example 1 of Embodiment 14, the circuit configurations of the first filter 1 and the second filter 2 of the high-frequency module 100*n* according to Embodiment 14 are different, and the first circuit element is an inductor and the second circuit element is a capacitor.

Embodiment 15

Figure 32:
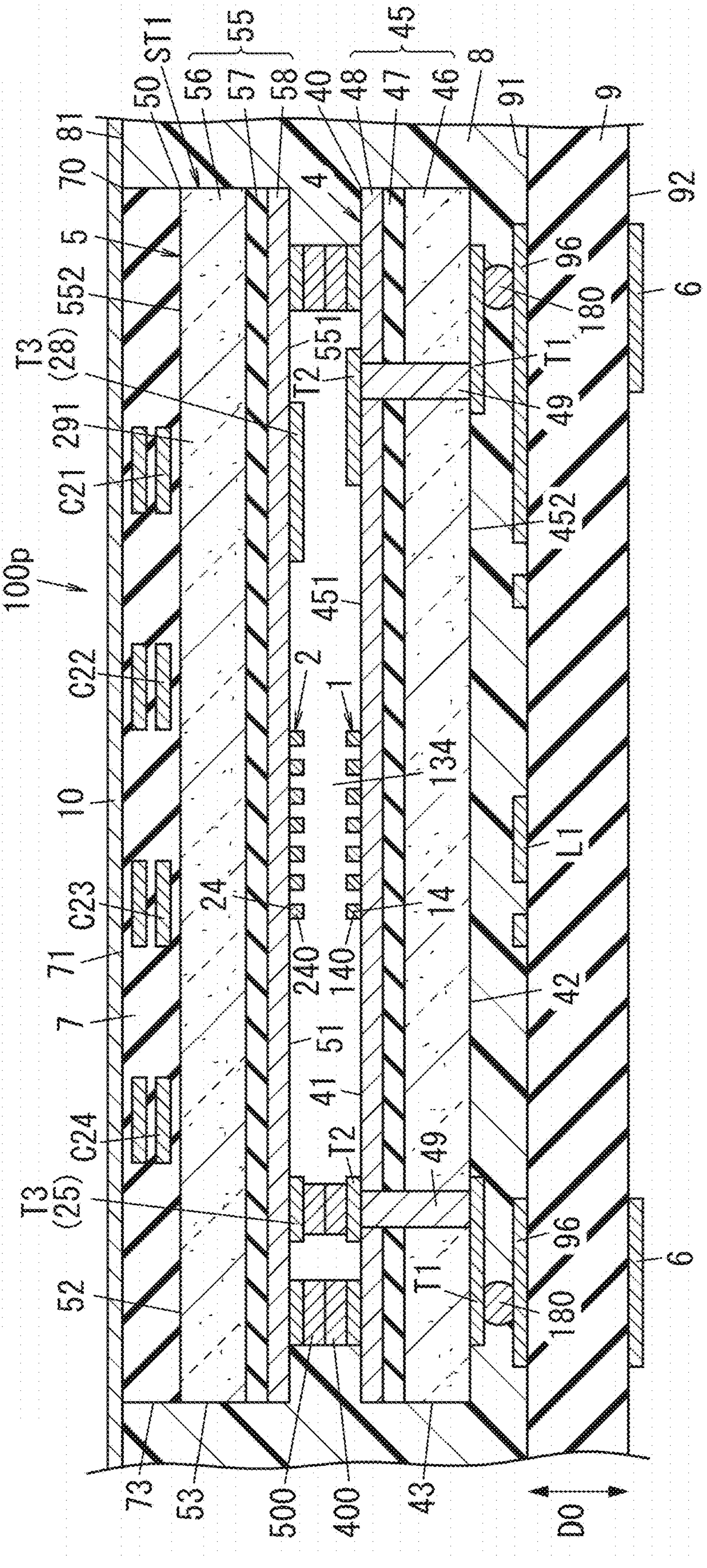
FIG. 32 is a cross-sectional view of a high-frequency module according to Embodiment 15.

A high-frequency module 100*p* according to Embodiment 15 will be described with reference to FIGS. 32 and 33. Regarding the high-frequency module 100*p* according to Embodiment 15, the same components as the high-frequency module 100 (see FIGS. 1 to 4B) according to Embodiment 1 are attached with the same reference numerals, and the description thereof will be omitted.

(1) Configuration

Figure 33:
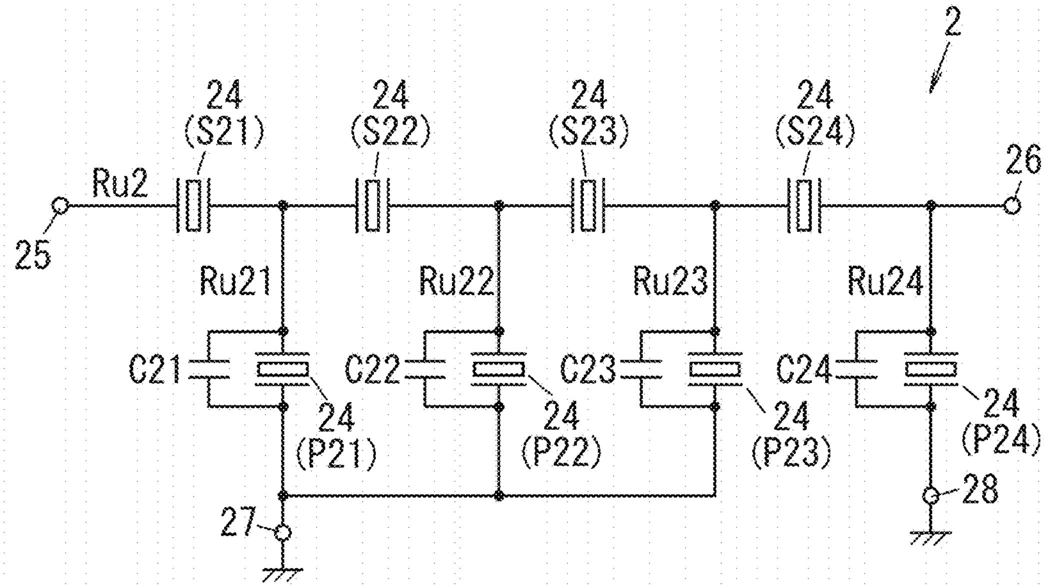
FIG. 33 is a circuit diagram of a second filter in the same high-frequency module.

In the high-frequency module 100*p* according to Embodiment 15, the second filter 2 has a circuit configuration as illustrated in FIG. 33. In the high-frequency module 100*p*, the second filter 2 further includes a capacitor C21 connected in parallel to the parallel arm resonator P21, a capacitor C22 connected in parallel to the parallel arm resonator P22, a capacitor C23 connected in parallel to the parallel arm resonator P23, and a capacitor C24 connected in parallel to the parallel arm resonator P24. Since the second filter 2 includes the capacitors C21 to C24, the pass band of the second filter 2 can be narrowed, and the second filter 2 can be employed as a filter having a pass band corresponding to, for example, a frequency band of Band 30 of the 3GPP LTE standard.

The plurality of capacitors C21 to C24 of the second filter 2 are disposed on the fourth main surface 52 side of the second chip 5. Each of the plurality of capacitors C21 to C24 is a capacitor including two conductor pattern portions. In the high-frequency module 100*p* according to Embodiment 15, the plurality of capacitors C21 to C24 of the second filter 2 are second circuit elements of the second filter 2.

In the high-frequency module 100*p* according to Embodiment 15, the inductor L1, which is the first circuit element related to the first filter, is disposed on the second main surface 42 side of the first chip 4, and the capacitors C21 to C24, which are the second circuit elements related to the second filter 2, are disposed on the fourth main surface 52 side of the second chip 5. Accordingly, in the high-frequency module 100*p* according to Embodiment 15, it is possible to suppress the deterioration of the characteristics of the second filter 2 while narrowing the pass band of the second filter 2. The second filter 2 may have at least one of the plurality of capacitors C21 to C24.

Embodiment 16

Figure 34:
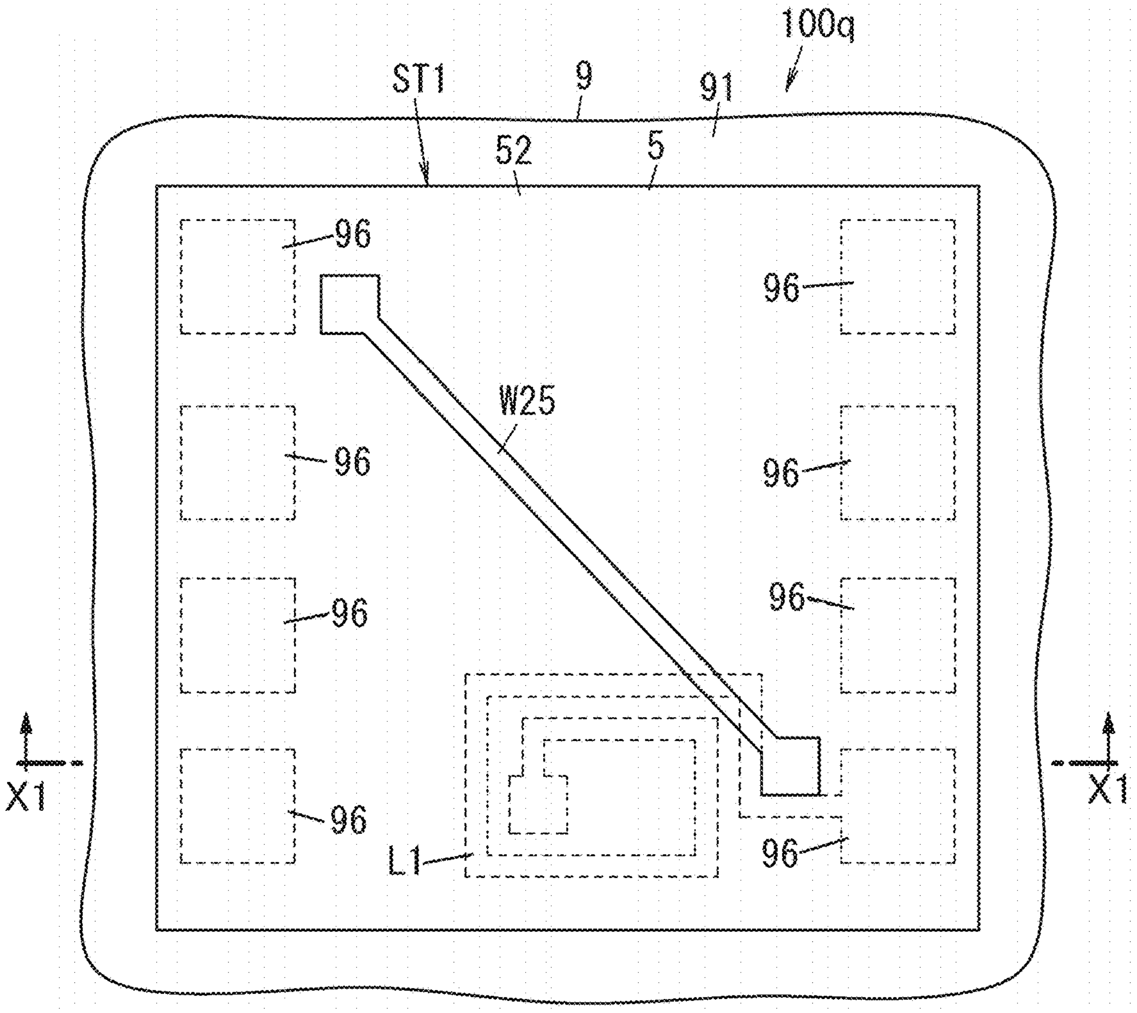
FIG. 34 is a plan view of a high-frequency module according to Embodiment 16.
Figure 35:
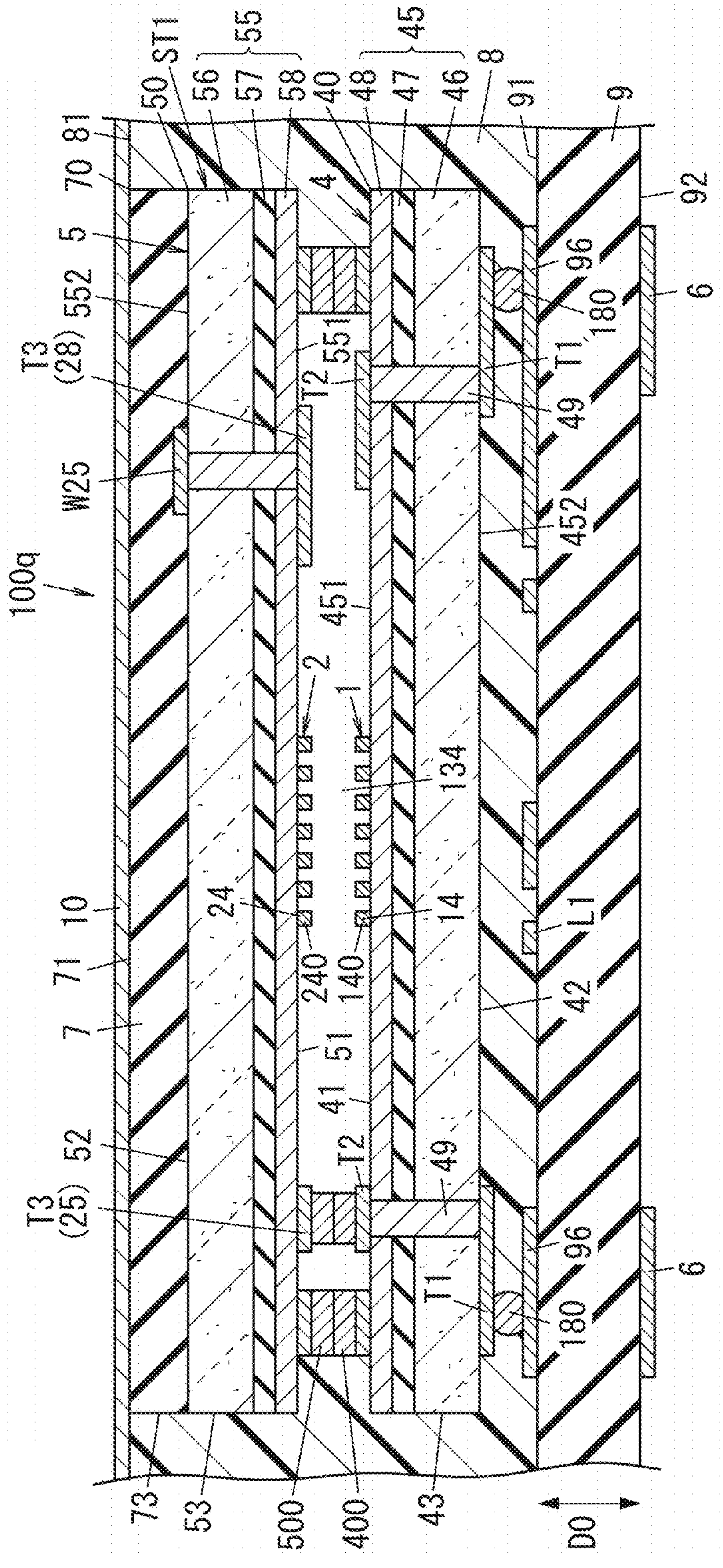
FIG. 35 is a cross-sectional view of the high-frequency module.

A high-frequency module 100*q* according to Embodiment 16 will be described with reference to FIGS. 34 to 36. Regarding the high-frequency module 100*q* according to Embodiment 16, the same components as the high-frequency module 100 (see FIGS. 1 to 4B) according to Embodiment 1 are attached with the same reference numerals, and the description thereof will be omitted. FIG. 35 is a cross-sectional view corresponding to a cross section taken along line X1-X1 of FIG. 34. In FIG. 34, the insulating layer 7, the resin layer 8, and the metal electrode layer 10 are not illustrated.

(1) Configuration

Figure 36:
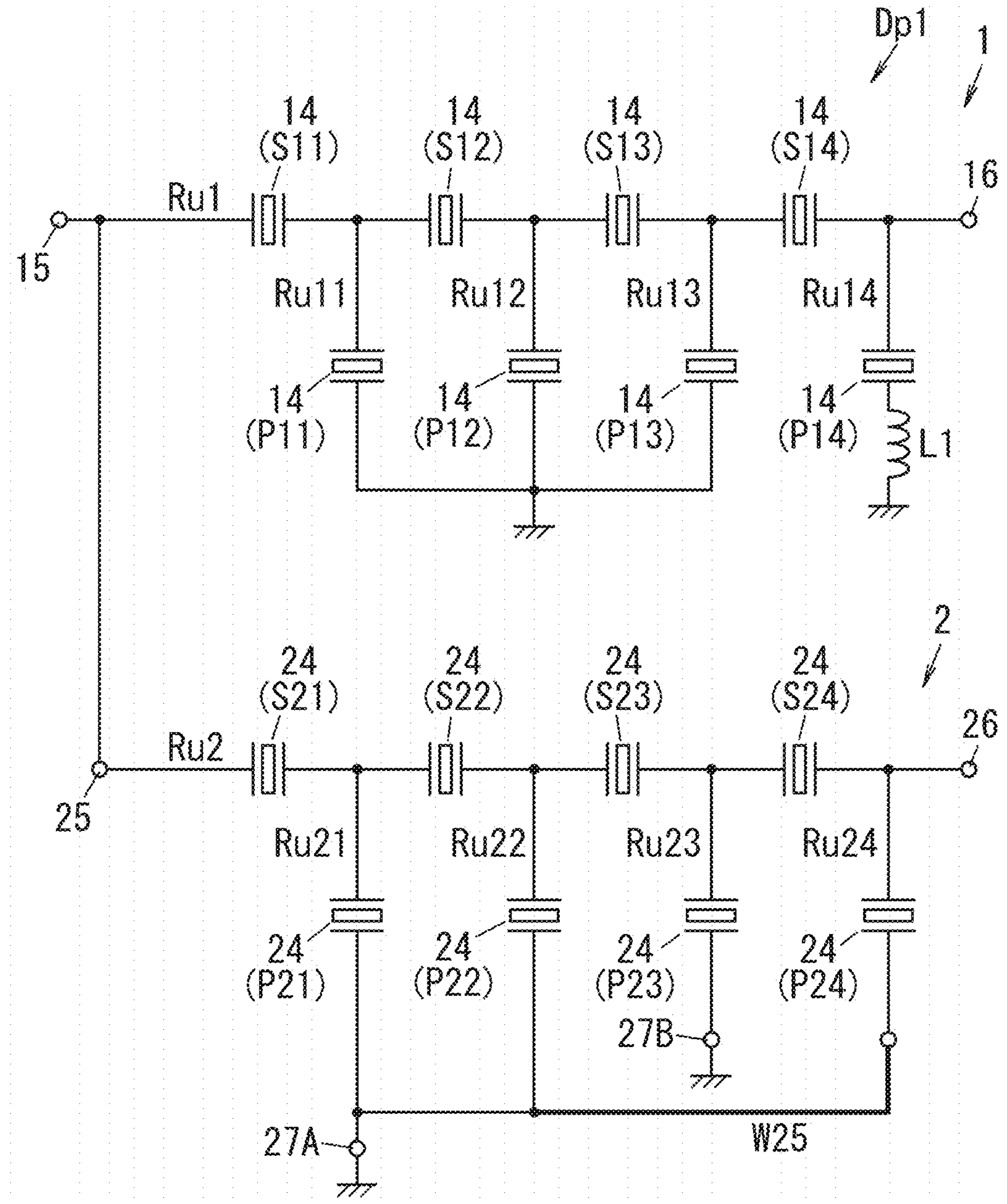
FIG. 36 is a circuit diagram of a main portion of the high-frequency module.

The high-frequency module 100*q* according to Embodiment 16 is different from the high-frequency module 100 according to Embodiment 1 in that the second filter 2 does not include the inductor L2 (see FIG. 4B) and the parallel arm resonator P24 is connected to the same second ground as the other three parallel arm resonators P21 to P23 as illustrated in FIG. 36.

In the second filter 2 of the high-frequency module 100*q*, as illustrated in FIG. 36, three parallel arm resonators P21, P22, and P24 among the plurality of parallel arm resonators P21 to P24 are connected to the same second ground terminal 27A, and the parallel arm resonator P23 is connected to a second ground terminal 27B different from the second ground terminal 27A. In addition, in the high-frequency module 100*q*, the first input/output terminal 15 of the first filter 1 and the third input/output terminal 25 of the second filter 2 are connected, and a duplexer Dp1 including the first filter 1 and the second filter 2 is provided.

In the high-frequency module 100*q*, a wiring portion W25 that connects one parallel arm resonator P24 among the plurality of parallel arm resonators P21 to P24 to a path between the parallel arm resonator P22 and the ground (second ground terminal 27A) is disposed on the fourth main surface 52 of the second chip 5. In the high-frequency module 100$q$, the wiring portion W25 constitutes the second circuit element related to the second filter 2.

In the high-frequency module 100$q$ according to Embodiment 16, since the second circuit element includes the wiring portion W25 that connects one parallel arm resonator P24 among the plurality of parallel arm resonators P21 to P24 to the path between the parallel arm resonator P22 and the ground, it is possible to suppress the deterioration of the characteristics while achieving reduction in size.

Embodiment 17

Figure 37:
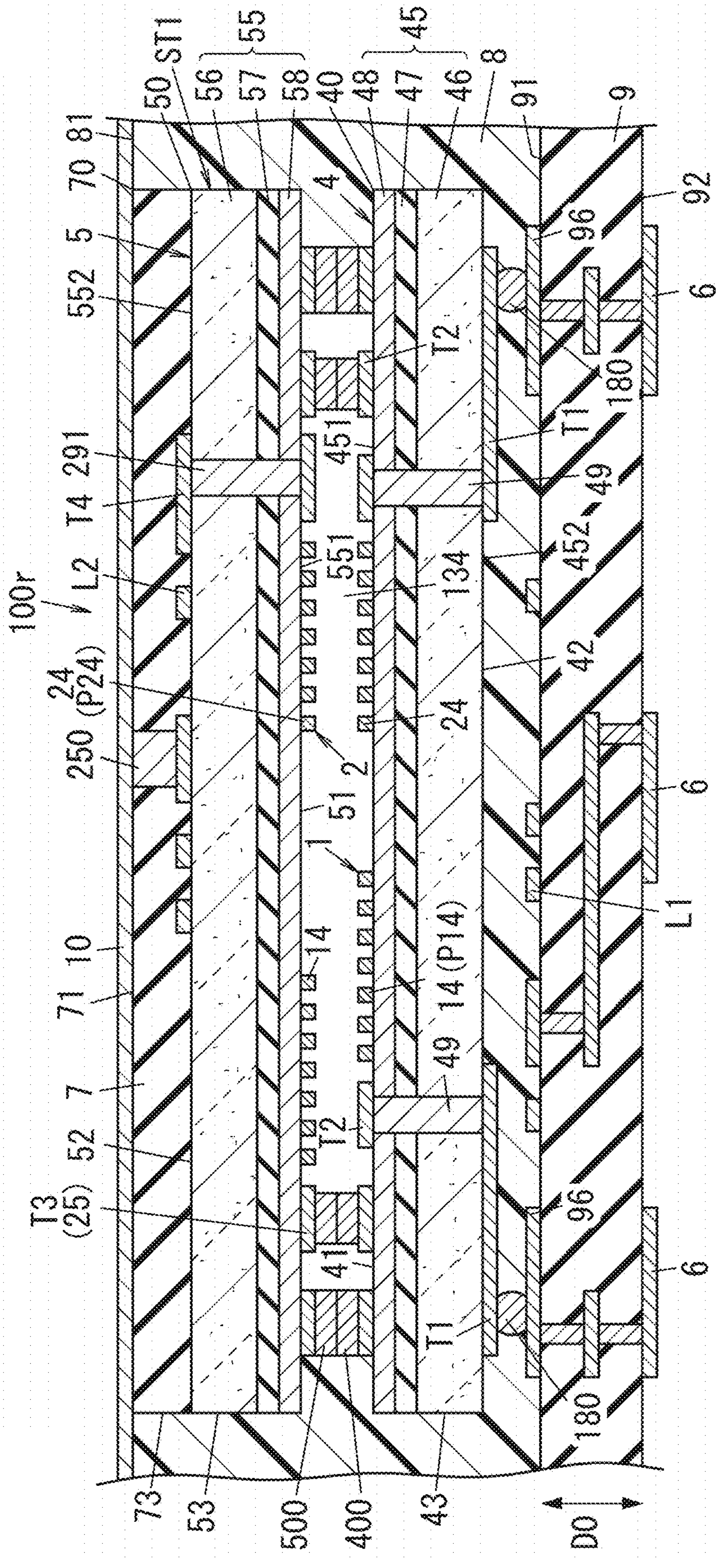
FIG. 37 is a cross-sectional view of a high-frequency module according to Embodiment 17.

A high-frequency module 100$r$ according to Embodiment 17 will be described with reference to FIG. 37. Regarding the high-frequency module 100$r$ according to Embodiment 17, the same components as the high-frequency module 100 (see FIGS. 1 to 4B) according to Embodiment 1 are attached with the same reference numerals, and the description thereof will be omitted.

(1) Configuration

In the high-frequency module 100$r$ according to Embodiment 17, the first chip 4 includes one or more second acoustic wave resonators 24 different from at least one second acoustic wave resonator 24 (parallel arm resonator P24) of the second chip 5 among the plurality of second acoustic wave resonators 24. In short, in the high-frequency module 100$r$, the plurality of second acoustic wave resonators 24 are formed by being divided into the first chip 4 and the second chip 5.

In addition, in the high-frequency module 100$r$, the second chip 5 includes one or more first acoustic wave resonators 14 different from at least one first acoustic wave resonator 14 (parallel arm resonator P14) among the plurality of first acoustic wave resonators 14. In short, in the high-frequency module 100$r$, the plurality of first acoustic wave resonators 14 are formed separately in the first chip 4 and the second chip 5.

In a plan view from the thickness direction D0 of the mounting substrate 9, the second parallel arm resonator P24 to which the second inductor L2 is connected among the plurality of second acoustic wave resonators 24 and the first parallel arm resonator P14 to which the first inductor L1 is connected among the plurality of first acoustic wave resonators 14 do not overlap each other. In addition, in a plan view from the thickness direction D0 of the mounting substrate 9, a part of the second inductor L2 overlaps a part of the second parallel arm resonator P24, and a part of the first inductor L1 overlaps a part of the first parallel arm resonator P14.

The second inductor L2 and the first inductor L1 do not overlap each other in a plan view from the thickness direction D0 of the mounting substrate 9.

The first inductor L1, which is the first circuit element, is disposed on the second main surface 42 side of the first chip 4. In addition, the second inductor L2, which is the second circuit element, is disposed on the fourth main surface 52 of the second chip 5.

(2) Effects

In the high-frequency module 100$r$ according to Embodiment 17, since the first chip 4 includes one or more second acoustic wave resonators 24 other than the second parallel arm resonator P24 among the plurality of second acoustic wave resonators 24, and the second chip 5 includes one or more first acoustic wave resonators 14 other than the first parallel arm resonator P14 among the plurality of first acoustic wave resonators 14, it is possible to suppress deterioration in characteristics while achieving reduction in size.

Embodiment 18

Figure 38:
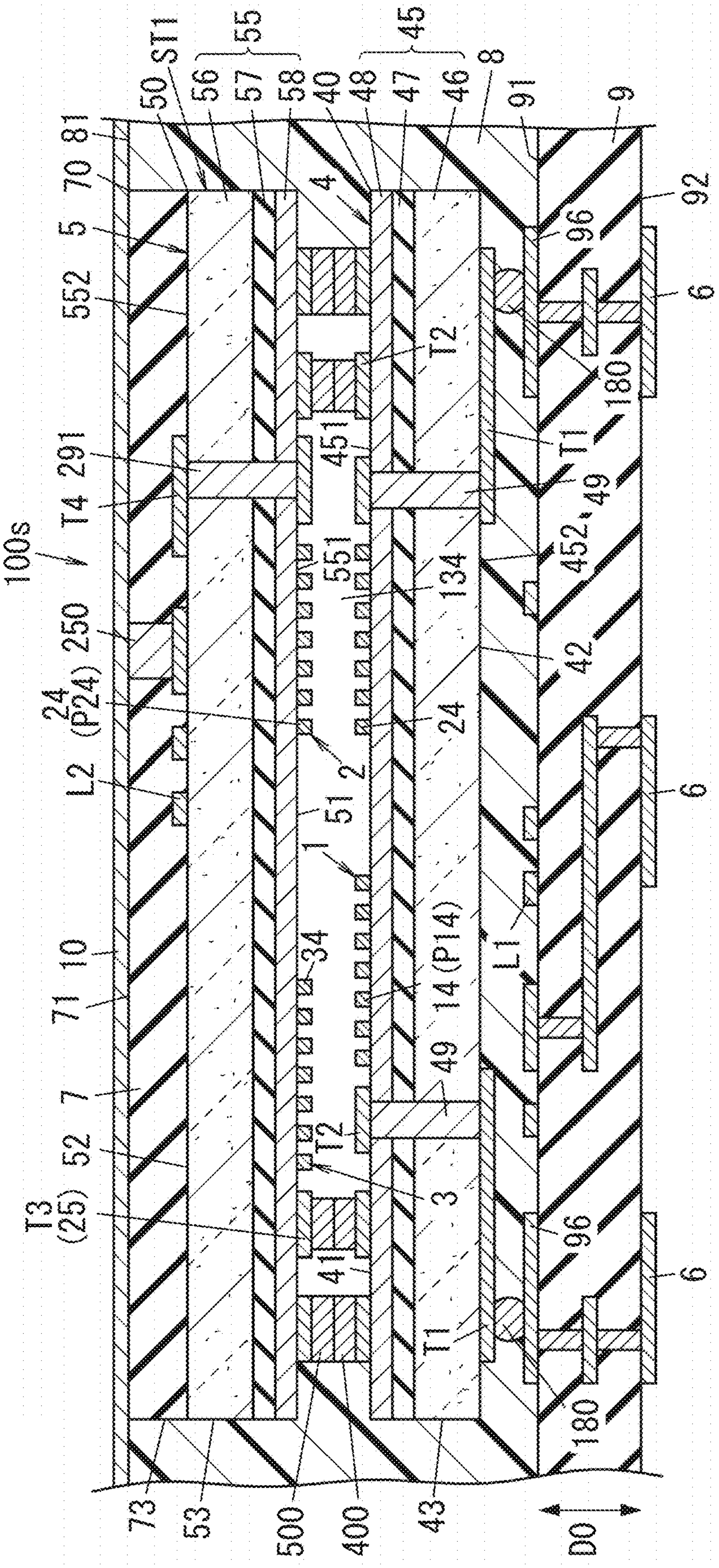
FIG. 38 is a cross-sectional view of a high-frequency module according to Embodiment 18.

A high-frequency module 100$s$ according to Embodiment 18 will be described with reference to FIG. 38. Regarding the high-frequency module 100$s$ according to Embodiment 18, the same components as the high-frequency module 100 (see FIGS. 1 to 4B) according to Embodiment 1 are attached with the same reference numerals, and the description thereof will be omitted.

(1) Configuration

In the high-frequency module 100$s$ according to Embodiment 18, the first chip 4 includes one or more second acoustic wave resonators 24 different from at least one second acoustic wave resonator 24 (parallel arm resonator P24) of the second chip 5 among the plurality of second acoustic wave resonators 24. In short, in the high-frequency module 100$s$, the plurality of second acoustic wave resonators 24 are formed by being divided into the first chip 4 and the second chip 5. In addition, in the high-frequency module 100$s$, the second chip 5 includes a plurality of third acoustic wave resonators 34 of the third filter 3. The third filter 3 is a ladder filter. In addition, in FIG. 38, only one third acoustic wave resonator 34 among the plurality of third acoustic wave resonators 34 is seen for the third filter 3.

In a plan view from the thickness direction D0 of the mounting substrate 9, the second parallel arm resonator P24 to which the second inductor L2 is connected among the plurality of second acoustic wave resonators 24 and the first parallel arm resonator P14 to which the first inductor L1 is connected among the plurality of first acoustic wave resonators 14 do not overlap each other. In addition, in a plan view from the thickness direction D0 of the mounting substrate 9, a part of the second inductor L2 overlaps a part of the second parallel arm resonator P24, and a part of the first inductor L1 overlaps a part of the first parallel arm resonator P14.

The second inductor L2 and the first inductor L1 do not overlap each other in a plan view from the thickness direction D0 of the mounting substrate 9.

The first inductor L1, which is the first circuit element, is disposed on the second main surface 42 side of the first chip 4. In addition, the second inductor L2, which is the second circuit element, is disposed on the fourth main surface 52 of the second chip 5.

(2) Effects

In the high-frequency module 100$s$ according to Embodiment 18, since the first chip 4 includes one or more second acoustic wave resonators 24 other than the second parallel arm resonator P24 among the plurality of second acoustic wave resonators 24, and the second chip 5 includes a plurality of third acoustic wave resonators 34 of the third filter 3, it is possible to suppress the deterioration of the characteristics while achieving the reduction in size in the configuration in which the third filter 3 is provided.

Embodiment 19

Hereinafter, a high-frequency module 100$t$ according to Embodiment 19 will be described with reference to FIGS. 39 and 40. Regarding the high-frequency module **100*t* according to Embodiment 19, the same components as the high-frequency module 100 (see FIGS. 1 to 4**B) according to Embodiment 1 are attached with the same reference numerals, and the description thereof will be omitted.

(1) Outline

Figure 39:
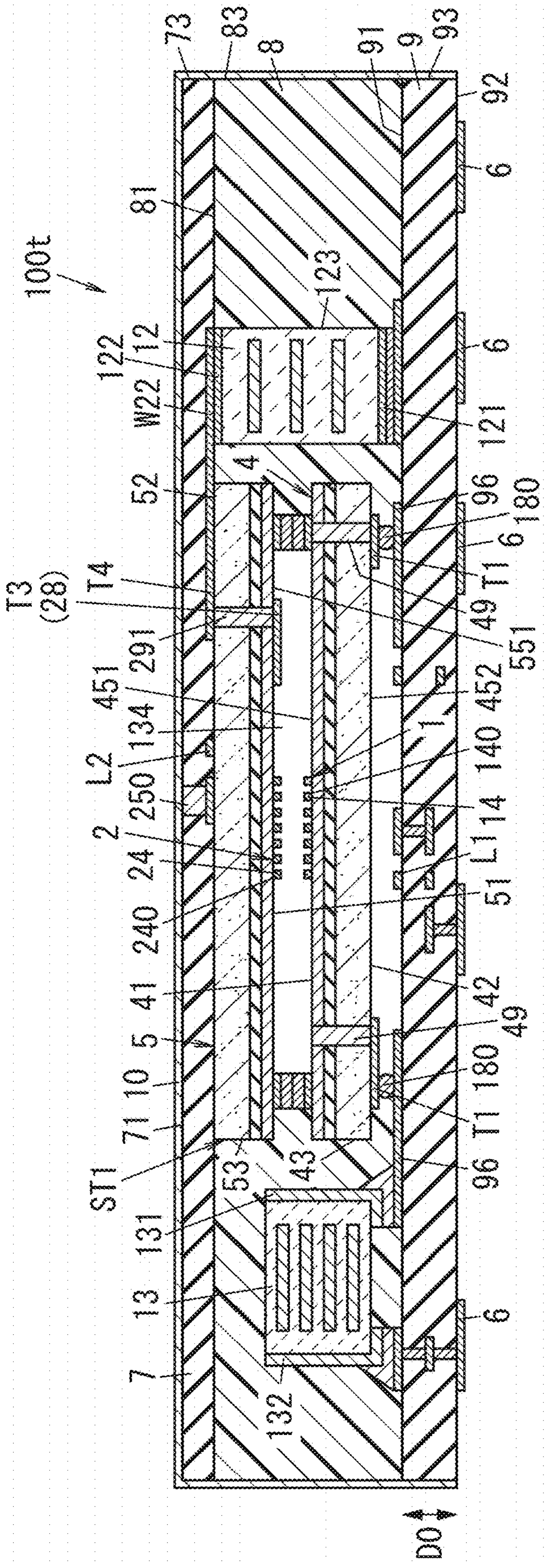
FIG. 39 is a cross-sectional view of a high-frequency module according to Embodiment 19.

As illustrated in FIG. 39, the high-frequency module **100*t* according to Embodiment 19 includes a mounting substrate 9, a first chip 4, a second chip 5, an electronic component 11 (see FIG. 40), an electronic component 12, an electronic component 13, a wiring portion W22, a resin layer 8, an insulating layer 7, a metal electrode layer 10, and a plurality of external connection terminals 6. The mounting substrate 9 has a main surface 91. The first chip 4 includes a plurality (for example, eight) of first acoustic wave resonators 14 (see FIG. 4A) of the first filter 1 (see FIG. 40). The first chip 4 is disposed on the main surface 91 of the mounting substrate 9. The second chip 5 includes a plurality (for example, eight) of second acoustic wave resonators 24 (see FIG. 4B) of a second filter 2 (see FIG. 40) different from the first filter 1. The second chip 5 is disposed on a side of the first chip 4 opposite to the mounting substrate 9 side. That is, the high-frequency module 100*t* has the stack structure ST1 including the first chip 4 and the second chip 5 stacked on the first chip 4. The first chip 4 has a first main surface 41 on the second chip 5 side and a second main surface 42 on the mounting substrate 9 side. The second chip 5 has a third main surface 51 on the first chip 4 side and a fourth main surface 52 on a side opposite to the first chip 4 side. The first filter 1 and the second filter 2 are filters having different frequency bands as pass bands. Each of the first filter 1 and the second filter 2 is a transmission filter, a reception filter, or a transmission/reception filter. The pass band of the first filter 1 corresponds to a first communication band, and the pass band of the second filter 2 corresponds to a second communication band. The electronic component 11, the electronic component 12, and the electronic component 13 are disposed on the main surface 91 of the mounting substrate 9. The wiring portion W22 connects the second filter 2 and the electronic component 12** to each other.

(2) Details

Figure 40:
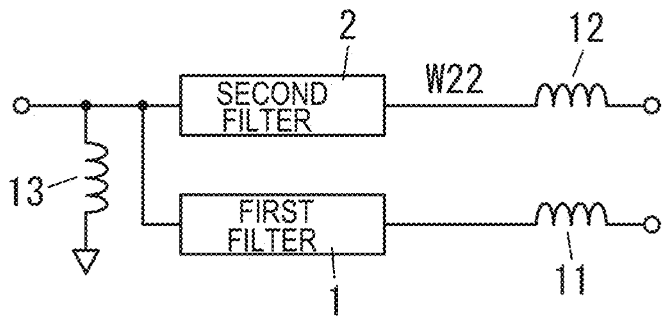
FIG. 40 is a circuit diagram of a main portion of the high-frequency module.

Hereinafter, the high-frequency module **100*t* according to Embodiment 19 will be described in more detail with reference to FIGS. 39 and 40**.

An inductor L1, which is a circuit element related to the first filter 1, is disposed on the second main surface 42 side of the first chip 4. The inductor L1 is provided on the mounting substrate 9, but the present disclosure is not limited thereto, and the inductor L1 may be disposed on the second main surface 42 of the first chip 4.

The electronic component 11 is, for example, an inductor included in a matching circuit connected to the first filter 1. The inductor included in the matching circuit connected to the first filter 1 is a chip inductor disposed on the main surface 91 of the mounting substrate 9, but is not limited thereto, and may be an inner layer inductor composed of a conductor pattern portion in the mounting substrate 9.

The electronic component 12 is, for example, an inductor included in a matching circuit connected to the second filter 2. The electronic component 12 has a first electrode 121 located on the main surface 91 side of the mounting substrate 9 and a second electrode 122 located on a side opposite to the main surface 91 side.

The electronic component 13 is, for example, an inductor included in a matching circuit connected to the first filter 1 and the second filter 2. The electronic component 13 has a first electrode 131 and a second electrode 132. The first electrode 131 is connected to a series arm resonator S21 (see FIG. 4B) of the second chip 5 with the conductor portion 96 and the first chip 4 of the mounting substrate 9 interposed therebetween. The second electrode 132 is connected to an external ground terminal disposed on the second main surface 92 of the mounting substrate 9.

The resin layer 8 is disposed on the main surface 91 of the mounting substrate 9. The resin layer 8 covers at least a part of the outer peripheral surface 43 of the first chip 4, at least a part of the outer peripheral surface 53 of the second chip 5, and at least a part of the outer peripheral surface 123 of the electronic component 12.

The wiring portion W22 is a conductor pattern portion. The conductor pattern portion constituting the wiring portion W22 is provided on the fourth main surface 52 of the second chip 5, the main surface 81 of the resin layer 8 opposite to the mounting substrate 9 side, and the second electrode 122 of the electronic component 12.

The insulating layer 7 is disposed on the fourth main surface 52 of the second chip 5. The insulating layer 7 covers the fourth main surface 52 of the second chip 5, the second inductor L2, the wiring portion W22, and the main surface 81 of the resin layer 8.

The metal electrode layer 10 covers the main surface 71 and the outer peripheral surface 73 of the insulating layer 7, the outer peripheral surface 83 of the resin layer 8, and the outer peripheral surface 93 of the mounting substrate 9.

(3) Effect

According to the high-frequency module **100*t* of Embodiment 19, it is possible to suppress the deterioration of the characteristics while achieving reduction in size. More specifically, in the high-frequency module 100*t*, since the second chip 5 is disposed on the side of the first chip 4 opposite to the mounting substrate 9 side, it is possible to achieve reduction in size. In addition, according to the high-frequency module 100*t*, since the wiring portion W22 that connects the second filter 2 and the electronic component 12 is provided on the fourth main surface 52 of the second chip 5, the main surface 81 of the resin layer 8 opposite to the mounting substrate 9 side, and the second electrode 122 of the electronic component 12, the wiring length between the second filter 2 and the second circuit element (the electronic component 12 included in the matching circuit) related to the second filter 2 can be shortened, and the deterioration of the characteristics of the second filter 2** can be suppressed.

In addition, according to the high-frequency module **100*t*, since the first inductor L1 related to the first filter 1 is disposed on the second main surface 42 side of the first chip 4 and the second inductor L2 related to the second filter 2 is disposed on the fourth main surface 52 of the second chip 5, isolation between the first inductor L1 and the second inductor L2 can be improved. Accordingly, the high-frequency module 100*t* can suppress the deterioration of the characteristics of each of the first filter 1 and the second filter 2**.

Modification Examples of Embodiment 19

Figure 41:
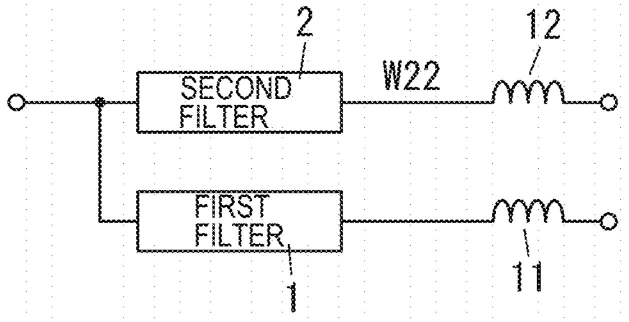
FIG. 41 is a circuit diagram of a main portion of the high-frequency module according to Modification Example of Embodiment 19.

In a modification example of the high-frequency module of Embodiment 19, as illustrated in FIG. 41, the electronic component 13 (see FIG. 40) of Embodiment 19 is not provided, the electronic component 11 is disposed on the main surface 91 of the mounting substrate 9 as with the electronic component 13, and is connected to the first filter 1 with the conductor pattern portion of the mounting substrate 9 interposed therebetween.

Other Modification Examples

Embodiments 1 to 19 and the like described above are merely one of various embodiments of the present disclosure. Embodiments 1 and 19 and the like may be variously changed according to a design and the like as long as the possible benefits of the present disclosure can be achieved, and different constituent elements of different embodiments may be combined as appropriate.

For example, in the first filter 1, at least one first acoustic wave resonator 14 of the plurality of first acoustic wave resonators 14 may be composed of a plurality of (for example, two or three) divided resonators. The plurality of divided resonators are resonators in which one first acoustic wave resonator 14 is divided, and are connected in series without interposing another first acoustic wave resonator 14 between the divided resonators and without interposing a connection node to a path including another first acoustic wave resonator 14.

In addition, in the second filter 2, at least one second acoustic wave resonator 24 of the plurality of second acoustic wave resonators 24 may be composed of, for example, a plurality of (for example, two or three) divided resonators. The plurality of divided resonators are resonators in which one second acoustic wave resonator 24 is divided, and are connected in series without interposing another second acoustic wave resonator 24 between the divided resonators and without interposing a connection node to a path including another second acoustic wave resonator 24.

In the high-frequency module 100*a*, the shield electrode 135 is disposed to overlap the second acoustic wave resonator 24 and the first acoustic wave resonator 14 in a plan view from the thickness direction D0 of the mounting substrate 9, but the present disclosure is not limited thereto. For example, the shield electrode 135 may be disposed to overlap only the second acoustic wave resonator 24 of the second acoustic wave resonator 24 and the first acoustic wave resonator 14 in a plan view from the thickness direction D0 of the mounting substrate 9, or may be disposed to overlap only the first acoustic wave resonator 14. In addition, the shield electrode 135 is not limited to a configuration in which the shield electrode 135 is supported by the second chip 5, and a configuration in which the shield electrode 135 is supported by the first chip 4 may be adopted.

In addition, the first circuit element related to the first filter 1 may be an inductor or a capacitor included in a matching circuit connected to the first filter 1.

In addition, the second circuit element related to the second filter 2 may be an inductor or a capacitor included in a matching circuit connected to the second filter.

For example, the first substrate 45 in the first chip 4 may have a configuration including a first support substrate and a first high acoustic velocity film interposed between the first support substrate and the first low acoustic velocity film 47, instead of the first high acoustic velocity member 46. The first high acoustic velocity film is a film in which the acoustic velocity of a bulk wave propagating through the first high acoustic velocity film is faster than the acoustic velocity of an acoustic wave propagating through the first piezoelectric layer 48. In addition, the second substrate 55 in the second chip 5 may have, for example, a configuration including a second support substrate and a second high acoustic velocity film interposed between the second support substrate and the second low acoustic velocity film 57, instead of the second high acoustic velocity member 56. The second high acoustic velocity film is a film in which the acoustic velocity of a bulk wave propagating through the second high acoustic velocity film is faster than the acoustic velocity of an acoustic wave propagating through the second piezoelectric layer 58. A material of each of the first high acoustic velocity film and the second high acoustic velocity film is, for example, silicon nitride, but is not limited to silicon nitride, and may be at least one type of material selected from a group made up of diamond-like carbon, aluminum nitride, silicon carbide, silicon oxynitride, silicon, sapphire, lithium tantalate, lithium niobate, crystal, zirconia, cordierite, mullite, steatite, forsterite, magnesia, and diamond.

In addition, the first substrate 45 may include, for example, a first close contact layer interposed between the first low acoustic velocity film 47 and the first piezoelectric layer 48. The first close contact layer is formed of, for example, a resin (epoxy resin, polyimide resin). In addition, the first substrate 45 may include a first dielectric film at any one of a position between the first low acoustic velocity film 47 and the first piezoelectric layer 48, a position above the first piezoelectric layer 48, and a position below the first low acoustic velocity film 47. In addition, the second substrate 55 may include, for example, a second close contact layer interposed between the second low acoustic velocity film 57 and the second piezoelectric layer 58. The second close contact layer is formed of, for example, a resin (epoxy resin, polyimide resin). In addition, the second substrate 55 may include a second dielectric film at any one of a position between the second low acoustic velocity film 57 and the second piezoelectric layer 58, a position above the second piezoelectric layer 58, and a position below the second low acoustic velocity film 57. In addition, the first chip 4 may further include a first protective film that is provided on the first piezoelectric layer 48 and covers the plurality of first functional electrodes 140. A material of the first protective film is, for example, silicon oxide. In addition, the second chip 5 may further include a second protective film that is provided on the second piezoelectric layer 58 and covers the plurality of second functional electrodes 240. A material of the second protective film is, for example, silicon oxide.

In addition, in the first chip 4, the first substrate 45 may include a first piezoelectric substrate instead of the laminated substrate including the first high acoustic velocity member 46, the first low acoustic velocity film 47, and the first piezoelectric layer 48. The first piezoelectric substrate is, for example, a lithium tantalate substrate or a lithium niobate substrate. In addition, in the second chip 5, the second substrate 55 may include a second piezoelectric substrate instead of the laminated substrate including the second high acoustic velocity member 56, the second low acoustic velocity film 57, and the second piezoelectric layer 58. The second piezoelectric substrate is, for example, a lithium tantalate substrate or a lithium niobate substrate.

In addition, the plurality of first acoustic wave resonators 14 are not limited to SAW resonators and may be bulk acoustic wave (BAW) resonators. In a case where the plurality of first acoustic wave resonators 14 are BAW resonators, the first substrate 45 of the first chip 4 is, for example, a silicon substrate or a spinel substrate. The BAW resonator constituting the first acoustic wave resonator 14 includes a first lower electrode provided on the first main surface 451 side of the first substrate 45, a first piezoelectric film on the first lower electrode, and a first upper electrode on the first piezoelectric film. In the first chip 4, the first upper electrode of the first acoustic wave resonator 14 constitutes the first functional electrode 140. Examples of the material of the first piezoelectric film include AlN, ScAlN, $LiTaO_3$, $LiNbO_3$, and lead zirconate titanate (PZT). The BAW resonator constituting the first acoustic wave resonator 14 has a cavity on a side opposite to the first piezoelectric film side in the first lower electrode. The BAW resonator constituting the first acoustic wave resonator 14 is a film bulk acoustic resonator (FBAR), but is not limited thereto, and may be a solidly mounted resonator (SMR).

In addition, the plurality of second acoustic wave resonators 24 are not limited to SAW resonators and may be BAW resonators. In a case where the plurality of second acoustic wave resonators 24 are BAW resonators, the second substrate 55 of the second chip 5 is, for example, a silicon substrate or a spinel substrate. The BAW resonators constituting the second acoustic wave resonator 24 include a second lower electrode provided on the third main surface 551 side of the second substrate 55, a second piezoelectric film on the second lower electrode, and a second upper electrode on the second piezoelectric film. In the second chip 5, the second upper electrode of the second acoustic wave resonator 24 constitutes the second functional electrode 240. Examples of the material of the second piezoelectric film include AlN, ScAlN, $LiTaO_3$, $LiNbO_3$, and lead zirconate titanate (PZT). The BAW resonator constituting the second acoustic wave resonator 24 has a cavity on a side opposite to the second piezoelectric film side in the second lower electrode. The BAW resonator constituting the second acoustic wave resonator 24 is an FBAR, but is not limited thereto, and may be an SMR.

In addition, the high-frequency modules 100, 100*j*, 100*k*, and the like may have a configuration in which the metal electrode layer 10 covering the resin layer 8 is not provided.

In addition, the high-frequency modules 100, 100*b*, 100*c*, 100*f*, 100*g*, 100*f*, 100*g*, 100*i*, 100*j*, 100*k*, 100*n*, 100*p*, 100*q*, 100*r*, 100*s*, and 100*t* other than the high-frequency module 100*a* may include the shield electrode 135 of the high-frequency module 100*a*.

In addition, the high-frequency modules 100, 100*a*, 100*b*, 100*c*, 100*d*, 100*e*, 100*f*, 100*g*, 100*f*, 100*g*, 100*h*, 100*i*, 100*j*, 100*k*, 100*m*, 100*n*, 100*p*, 100*q*, 100*r*, 100*s*, and 100*t* may include electronic components disposed on the second main surface 92 of the mounting substrate 9. In this case, each of the plurality of external connection terminals 6 is, for example, a columnar electrode (for example, a cylindrical electrode) or a ball bump. The material of the columnar electrode includes, for example, copper. The material of the ball bump is, for example, gold, copper, solder, or the like.

Aspects

The following aspects are disclosed in the present specification.

A high-frequency module (100; 100*a*; 100*b*; 100*c*; 100*d*; 100*e*; 100*f*; 100*g*; 100*h*; 100*i*; 100*j*; 100*k*; 100*m*; 100*n*; 100*p*; 100*q*; 100*r*; 100*s*) according to a first aspect includes a mounting substrate (9), a first chip (4), and a second chip (5). The mounting substrate (9) has a main surface (91). The first chip (4) includes at least one of a plurality of first acoustic wave resonators (14) of the first filter (1). The first chip (4) is disposed on the mounting substrate (9). A second chip (5) includes at least one of a plurality of second acoustic wave resonators (24) of a second filter (2). The second chip (5) is disposed on a side of the first chip (4) opposite to the mounting substrate (9). The first chip (4) has a first main surface (41) on the second chip (5) side and a second main surface (42) on the mounting substrate (9) side. The second chip (5) includes a third main surface (51) on the first chip (4) side and a fourth main surface (52) on a side opposite to the first chip (4) side. The first circuit element (the inductor L1; the inductor L10; the capacitor C1) related to the first filter (1) is disposed on the second main surface (42) side of the first chip (4). The second circuit element (the inductor L2; the inductor L20, the capacitors C21 to C24; the wiring portion W25) related to the second filter (2) is disposed on the fourth main surface (52) side of the second chip (5).

According to the high-frequency module (100; 100*a*; 100*b*; 100*c*; 100*d*; 100*e*; 100*f*; 100*g*; 100*h*; 100*i*; 100*j*; 100*k*; 100*m*; 100*n*; 100*p*; 100*q*; 100*r*; 100*s*) according to the first aspect, it is possible to suppress a deterioration in characteristics while achieving reduction in size.

In the high-frequency module (100; 100*a*; 100*b*; 100*c*; 100*d*; 100*e*; 100*f*; 100*g*; 100*h*; 100*i*; 100*r*; 100*s*) according to a second aspect, in the first aspect, the first filter (1) is a ladder filter having a plurality of first acoustic wave resonators (14). The first filter (1) has a first input/output terminal (15) and a second input/output terminal (16). The plurality of first acoustic wave resonators (14) include a plurality of first series arm resonators (S11 to S14) provided on a first signal path (Ru1) between the first input/output terminal (15) and the second input/output terminal (16), and a plurality of first parallel arm resonators (P11 to P14) connected between the first signal path (Ru1) and a first ground. The second filter (2) is a ladder filter having the plurality of second acoustic wave resonators (24). The second filter (2) further includes a third input/output terminal (25) and a fourth input/output terminal (26). The plurality of second acoustic wave resonators (24) include a plurality of second series arm resonators (S21 to S24) provided on a second signal path (Ru2) between the third input/output terminal (25) and the fourth input/output terminal (26), and a plurality of second parallel arm resonators (P21 to P24) connected between the second signal path (Ru2) and a second ground. The first circuit element includes a first inductor (L1) connected between one of the plurality of first parallel arm resonators (P11 to P14) and the first ground. The second circuit element includes a second inductor (L2) connected between one of the plurality of second parallel arm resonators (P21 to P24) and the second ground.

According to the high-frequency module (100; 100*a*; 100*b*; 100*c*; 100*d*; 100*e*; 100*f*; 100*g*; 100*h*; 100*i*; 100*k*; 100*r*; 100*s*) according to the second aspect, isolation between the first inductor (L1) included in the first filter (1) and the second inductor (L2) included in the second filter (2) can be improved, and deterioration in the characteristics of each of the first filter (1) and the second filter (2) can be suppressed.

A high-frequency module (100; 100*a*; 100*b*; 100*c*; 100*d*; 100*e*; 100*f*; 100*g*; 100*h*; 100*i*; 100*k*; 100*r*; 100*s*) according to a third aspect further includes a resin layer (8) and a metal electrode layer (10) in the second aspect. The resin layer (8) is disposed on the main surface (91) of the mounting substrate (9). The resin layer (8) covers at least a part of an outer peripheral surface (43) of the first chip (4) and at least a part of an outer peripheral surface (53) of the second chip (5). The metal electrode layer (10) covers at least a part of the resin layer (8). The second inductor (L2) is connected to the second ground with a metal electrode layer (10) interposed therebetween.

According to the high-frequency module (100; 100*a*; 100*b*; 100*c*; 100*d*; 100*e*; 100*f*; 100*g*; 100*h*; 100*i*; 100*k*; 100*r*; 100*s*) of the third aspect, it is possible to reduce a parasitic inductance between the second inductor (L2) and the second ground.

In the high-frequency module (100; 100*a*; 100*b*; 100*c*; 100*d*; 100*e*; 100*f*; 100*g*; 100*h*; 100*i*; 100*k*; 100*m*; 100*n*; 100*r*; 100*s*) according to a fourth aspect, in the first aspect, the second filter (2) is a ladder filter having the plurality of second acoustic wave resonators (24). The second filter (2) further has a pair of input/output terminals (a third input/output terminal 25 and a fourth input/output terminal 26). The plurality of second acoustic wave resonators (24) include a plurality of series arm resonators (S21 to S24) provided on a signal path (Ru2) between the pair of input/output terminals, and a plurality of parallel arm resonators (P21 to P24) connected between the signal path (Ru2) and a ground. The second circuit element includes an inductor (L2) connected between one of the plurality of parallel arm resonators (P21 to P24) and the ground. In a plan view from a thickness direction (D0) of the mounting substrate (9), the inductor (L2) overlaps one or more parallel arm resonators among the plurality of parallel arm resonators (P21 to P24) and does not overlap any of the plurality of series arm resonators (S21 to S24).

According to the high-frequency module (100; 100*a*; 100*b*; 100*c*; 100*d*; 100*e*; 100*f*; 100*g*; 100*h*; 100*i*; 100*k*; 100*m*; 100*n*; 100*r*; 100*s*) according to the fourth aspect, it is possible to improve the attenuation characteristics of the second filter (2) as compared with a case where the second inductor (L2) of the second filter (2) overlaps at least one of the plurality of series arm resonators (S21 to S24) in a plan view from the thickness direction (D0) of the mounting substrate (9).

The high-frequency module (100*a*) according to a fifth aspect further includes a shield electrode (135) in the first aspect. The shield electrode (135) is disposed between the first chip (4) and the second chip (5). The first circuit element includes a first inductor (L1). The second circuit element includes a second inductor (L2). The first inductor (L1) and the second inductor (L2) overlap the shield electrode (135) in the thickness direction (D0) of the mounting substrate (9).

According to the high-frequency module (100*a*) of the fifth aspect, it is possible to improve the isolation between the first inductor (L1) and the second inductor (L2).

The high-frequency module (100*b*; 100*c*) according to a sixth aspect further includes a metal member (150), an insulating layer (7), a resin layer (8), and a metal electrode layer (10) in any one of the first, second, fourth, and fifth aspects. The metal member (150) is disposed on the fourth main surface (52) of the second chip (5). The insulating layer (7) is disposed on the fourth main surface (52) of the second chip (5). The insulating layer (7) covers at least a part of an outer peripheral surface (153) of the metal member (150) and at least a part of the second circuit element (inductor L2; capacitors C21 to C24; wiring portion W25). The resin layer (8) is disposed on the main surface (91) of the mounting substrate (9). The resin layer (8) covers at least a part of an outer peripheral surface (43) of the first chip (4), at least a part of an outer peripheral surface (53) of the second chip (5), and at least a part of an outer peripheral surface (73) of the insulating layer (7). The metal electrode layer (10) covers at least a part of the insulating layer (7) and at least a part of the resin layer (8). A metal member (150) is in contact with the metal electrode layer (10).

According to the high-frequency module (100*b*; 100*c*) of the sixth aspect, it is possible to improve the heat dissipation properties.

The high-frequency module (100*c*) according to a seventh aspect further includes a metal member (150), an insulating layer (7), a resin layer (8), and a metal electrode layer (10) in any one of the first, second, fourth, and fifth aspects. The metal member (150) is disposed on the fourth main surface (52) of the second chip (5). The insulating layer (7) is disposed on the fourth main surface (52) of the second chip (5). The insulating layer (7) covers at least a part of an outer peripheral surface (153) of the metal member (150) and at least a part of the second circuit element (inductor L2; capacitors C21 to C24; wiring portion W25). The resin layer (8) is disposed on the main surface (91) of the mounting substrate (9). The resin layer (8) covers at least a part of an outer peripheral surface (43) of the first chip (4), at least a part of an outer peripheral surface (53) of the second chip (5), and at least a part of an outer peripheral surface (73) of the insulating layer (7). The metal electrode layer (10) covers at least a part of the insulating layer (7) and at least a part of the resin layer (8). A metal member (150) is in contact with the metal electrode layer (10). The first chip (4) has a plurality of first terminal electrodes (T1) connected to the mounting substrate (9) and a plurality of second terminal electrodes (T2) connected to the second chip (5). The second chip (5) has a plurality of third terminal electrodes (T3) connected to a plurality of second terminal electrodes (T2). In a plan view from the thickness direction (D0) of the mounting substrate (9), the metal member (150) is larger than each of the plurality of third terminal electrodes (T3).

According to the high-frequency module (100*c*) of the seventh aspect, it is possible to improve the heat dissipation properties.

In the high-frequency module (100*f*) according to an eighth aspect, in the first aspect, the second circuit element includes an inductor (L2) disposed on the fourth main surface (52) of the second chip (5). A winding axis (A2) of the inductor (L2) is parallel to the fourth main surface (52) of the second chip (5).

According to the high-frequency module (100*f*) of the eighth aspect, it is possible to suppress deterioration in a Q value of the second inductor (L2), and it is possible to suppress a deterioration in the characteristics of the second filter (2).

The high-frequency module (100*d*) according to a ninth aspect further includes a resin layer (8) and a metal electrode layer (10) in the first aspect. The resin layer (8) is disposed on the main surface (91) of the mounting substrate (9). The resin layer (8) covers at least a part of an outer peripheral surface (43) of the first chip (4) and at least a part of an outer peripheral surface (53) of the second chip (5). The metal electrode layer (10) covers at least a part of the resin layer (8) and at least a part of the fourth main surface (52) of the second chip (5). The second filter (2) is a ladder filter having the plurality of second acoustic wave resonators (24). The second filter (2) further has a pair of input/output terminals (a third input/output terminal 25 and a fourth input/output terminal 26). The plurality of second acoustic wave resonators (24) include a plurality of series arm resonators (S21 to S24) provided on a signal path (Ru2) between the pair of input/output terminals, and a plurality of parallel arm resonators (P21 to P24) connected between the signal path (Ru2) and a ground. The second circuit element includes an inductor (L2) connected between one of the plurality of parallel arm resonators (P21 to P24) and the ground. The metal electrode layer (10) is in contact with a part of the fourth main surface (52) of the second chip (5). The inductor (L2) is disposed on a fourth main surface (52) of the second chip (5) and is connected to the ground with the metal electrode layer (10) interposed therebetween.

According to the high-frequency module (100*d*) of the ninth aspect, since the metal electrode layer (10) is in contact with a part of the fourth main surface (52) of the second chip (5), the heat dissipation properties can be improved, and the deterioration of the characteristics can be suppressed. In addition, in the high-frequency module (100*d*), since the second inductor (L2) is disposed on the fourth main surface (52) of the second chip (5) and is connected to the ground with the metal electrode layer (10) interposed therebetween, the parasitic inductance can be reduced, and the deterioration of the characteristics can be suppressed.

The high-frequency module (100*h*) according to a tenth aspect further includes an insulating layer (7), a via conductor (250), a resin layer (8), and a metal electrode layer (10) in the first aspect. The insulating layer (7) is disposed on the fourth main surface (52) of the second chip (5) and covers at least a part of the second circuit elements. The via conductor (250) penetrates the insulating layer (7) and is connected to the second circuit element. The resin layer (8) is disposed on the main surface (91) of the mounting substrate (9). The resin layer (8) covers at least a part of an outer peripheral surface (43) of the first chip (4), at least a part of an outer peripheral surface (53) of the second chip (5), and at least a part of an outer peripheral surface (73) of the insulating layer (7). The metal electrode layer (10) covers at least a part of the insulating layer (7), a part of the via conductor (250), and at least a part of the resin layer (8). The second filter (2) is a ladder filter having the plurality of second acoustic wave resonators (24). The second filter (2) further has a pair of input/output terminals (a third input/output terminal 25 and a fourth input/output terminal 26). The plurality of second acoustic wave resonators (24) include a plurality of series arm resonators (S21 to S24) provided on a signal path (Ru2) between the pair of input/output terminals, and a plurality of parallel arm resonators (P21 to P24) connected between the signal path (Ru2) and a ground. The second circuit element includes an inductor (L2) connected between one of the plurality of parallel arm resonators (P21 to P24) and the ground. The second circuit element is disposed in a recess portion (54) formed in a fourth main surface (52) of the second chip (5).

According to the high-frequency module (100*h*) of the tenth aspect, it is possible to achieve reduction in height.

In the high-frequency module (100*j*) according to an eleventh aspect, in the first aspect, the second filter (2) is a ladder filter having the plurality of second acoustic wave resonators (24). The second filter (2) further has a pair of input/output terminals (a third input/output terminal 25 and a fourth input/output terminal 26). The plurality of second acoustic wave resonators (24) include a plurality of series arm resonators (S21 to S24) provided on a signal path (Ru2) between the pair of input/output terminals, and a plurality of parallel arm resonators (P21 to P24) connected between the signal path (Ru2) and a ground. The second circuit element includes an inductor (L20) connected in parallel to one (the series arm resonator S24) of the plurality of series arm resonators (S21 to S24). In a plan view from a thickness direction (D0) of the mounting substrate (9), the inductor (L20) overlaps at least one of two parallel arm resonators (P23, P24) directly connected to the inductor (L20) among the plurality of parallel arm resonators (P21 to P24) and one (the series arm resonator S24) of the plurality of series arm resonators (S21 to S24) and does not overlap any of the remaining second acoustic wave resonators (24) among the plurality of second acoustic wave resonators (24).

According to the high-frequency module (100*j*) of the eleventh aspect, in the plan view from the thickness direction (D0) of the mounting substrate (9), the inductor (L20) overlaps at least one of the two parallel arm resonators (P23 and P24) and one (the series arm resonator S24) of the plurality of series arm resonators, and does not overlap any of the remaining second acoustic wave resonators (24) among the plurality of second acoustic wave resonators (24). Therefore, it is possible to suppress the deterioration of the attenuation while achieving reduction in size.

In the high-frequency module (100*k*) according to a twelfth aspect, in the first aspect, the second filter (2) is a ladder filter having the plurality of second acoustic wave resonators (24). The second filter (2) further has a pair of input/output terminals (a third input/output terminal 25 and a fourth input/output terminal 26). The plurality of second acoustic wave resonators (24) include a plurality of series arm resonators (S21 to S24) provided on a signal path (Ru2) between the pair of input/output terminals, and a plurality of parallel arm resonators (P21 to P24) connected between the signal path (Ru2) and a ground. The second circuit element includes a first conductor pattern portion (161) that is a part of an inductor (L20) connected in parallel to one of the plurality of series arm resonators (S21 to S24). The remaining portion of the inductor (L20) includes a second conductor pattern portion (162) that is disposed on the third main surface (51) of the second chip (5), and a conductor portion (163) that penetrates the second chip (5) in the thickness direction and connects the first conductor pattern portion (161) and the second conductor pattern portion (162).

According to the high-frequency module (100*k*) of the twelfth aspect, it is possible to further increase the inductance of the inductor (L20).

In the high-frequency module (100*m*) according to a thirteenth aspect, in the first aspect, the first filter (1) is a ladder filter having the plurality of first acoustic wave resonators (14). The first filter (1) further includes a first input/output terminal (15) and a second input/output terminal (16). The plurality of first acoustic wave resonators (14) include a plurality of first series arm resonators (S11 to S14) provided on a first signal path (Ru1) between the first input/output terminal (15) and the second input/output terminal (16), and a plurality of first parallel arm resonators (P11 to P14) connected between the first signal path (Ru1) and a first ground. The second filter (2) is a ladder filter having the plurality of second acoustic wave resonators (24). The second filter (2) further includes a third input/output terminal (25) and a fourth input/output terminal (26). The plurality of second acoustic wave resonators (24) include a plurality of second series arm resonators (S21 to S24) provided on a second signal path (Ru2) between the third input/output terminal (25) and the fourth input/output terminal (26), and a plurality of second parallel arm resonators (P21 to P24) connected between the second signal path (Ru2) and a second ground. The first circuit element includes a first inductor (inductor L10) that is connected in parallel to one of the plurality of first series arm resonators (S11 to S14). The second circuit element includes a second inductor (L2) connected between one of the plurality of second parallel arm resonators (P21 to P24) and the ground.

According to the high-frequency module (100*m*) of the thirteenth aspect, isolation between the first inductor (inductor L10) and the second inductor (L2) can be improved, and deterioration in the characteristics of each of the first filter (1) and the second filter (2) can be suppressed.

In the high-frequency module (100*n*) according to a fourteenth aspect, in the first aspect, the first filter (1) is a ladder filter having the plurality of first acoustic wave resonators (14). The first filter (1) further includes a first input/output terminal (15) and a second input/output terminal (16). The plurality of first acoustic wave resonators (14) include a plurality of first series arm resonators (S11 to S14) provided on a first signal path (Ru1) between the first input/output terminal (15) and the second input/output terminal (16), and a plurality of first parallel arm resonators (P11 to P14) connected between the first signal path (Ru1) and a first ground. The second filter (2) is a ladder filter having the plurality of second acoustic wave resonators (24). The second filter (2) further includes a third input/output terminal (25) and a fourth input/output terminal (26). The plurality of second acoustic wave resonators (24) include a plurality of second series arm resonators (S21 to S24) provided on a second signal path (Ru2) between the third input/output terminal (25) and the fourth input/output terminal (26), and a plurality of second parallel arm resonators (P21 to P24) connected between the second signal path (Ru2) and a second ground. The first circuit element includes a capacitor (C1) connected between a first series arm resonator (S14) closest to the second input/output terminal (16) among the plurality of first series arm resonators (S11 to S14) and the second input/output terminal (16). The second circuit element includes an inductor (L2) connected between one of the plurality of second parallel arm resonators (P21 to P24) and the second ground.

According to the high-frequency module (100*n*) of the fourteenth aspect, isolation between the capacitor (C1) and the inductor (L2) can be improved.

In the high-frequency module (100*p*) according to a fifteenth aspect, in the first aspect, the second filter (2) is a ladder filter having the plurality of second acoustic wave resonators (24). The second filter (2) further has a pair of input/output terminals (a third input/output terminal 25 and a fourth input/output terminal 26). The plurality of second acoustic wave resonators (24) include a plurality of series arm resonators (S21 to S24) provided on a signal path (Ru2) between the pair of input/output terminals, and a plurality of parallel arm resonators (P21 to P24) connected between the signal path (Ru2) and a ground. The second circuit element includes a capacitor connected in parallel to one of the plurality of parallel arm resonators (P21 to P24).

According to the high-frequency module (100*p*) of the fifteenth aspect, it is possible to suppress the deterioration of the characteristics of the second filter (2) while narrowing the pass band of the second filter (2).

In the high-frequency module (100*q*) according to a sixteenth aspect, in the first aspect, the second filter (2) is a ladder filter having the plurality of second acoustic wave resonators (24). The second filter (2) further has a pair of input/output terminals (a third input/output terminal 25 and a fourth input/output terminal 26). The plurality of second acoustic wave resonators (24) include a plurality of series arm resonators (S21 to S24) provided on a signal path (Ru2) between the pair of input/output terminals, and a plurality of parallel arm resonators (P21 to P24) connected between the signal path (Ru2) and a ground. The second circuit element includes a wiring portion (W25) that connects one of the plurality of parallel arm resonators (P21 to P24) to a path between another parallel arm resonator of the plurality of parallel arm resonators (P21 to P24) and a ground (second ground terminal 27A).

According to the high-frequency module (100*q*) of the sixteenth aspect, it is possible to suppress the deterioration of the characteristics while achieving reduction in size.

In the high-frequency module (100*r*) according to a seventeenth aspect, in any one of the first to sixteenth aspects, the first chip (4) includes one or more second acoustic wave resonators (24) different from the at least one of the plurality of second acoustic wave resonators (24). The second chip (5) includes one or more first acoustic wave resonators (14) different from the at least one of the plurality of first acoustic wave resonators (14).

According to the high-frequency module (100*r*) of the seventeenth aspect, it is possible to suppress the deterioration of the characteristics of the first filter (1) and the second filter (2) while achieving reduction in size.

In the high-frequency module (100*s*) according to an eighteenth aspect, in any one of the first to sixteenth aspects, the first chip (4) includes one or more second acoustic wave resonators (24) different from the at least one of the plurality of second acoustic wave resonators (24). The second chip (5) includes a plurality of third acoustic wave resonators (34) of the third filter (3).

According to the high-frequency module (100*s*) of the eighteenth aspect, it is possible to suppress the deterioration of the characteristics while achieving reduction in size.

In the high-frequency module (100; 100*a*; 100*b*; 100*c*; 100*d*; 100*e*; 100*f*; 100*g*; 100*h*; 100*j*; 100*k*; 100*m*; 100*n*; 100*p*; 100*q*; 100*r*; 100*s*) according to the nineteenth aspect, in any one of the first to eighteenth aspects, the first circuit element (the inductor L1; the inductor L10; the capacitor C1) is provided on the mounting substrate (9).

According to the high-frequency module (100; 100*a*; 100*b*; 100*c*; 100*d*; 100*e*; 100*f*; 100*g*; 100*h*; 100*j*; 100*k*; 100*m*; 100*n*; 100*p*; 100*q*; 100*r*; 100*s*) according to the nineteenth aspect, it is possible to further improve isolation between the first circuit element (inductor L1; inductor L10; capacitor C1) and the second circuit element (inductor L2; inductor L20, capacitors C21 to C24; wiring portion W25).

A high-frequency module (100*t*) according to a twentieth aspect includes a mounting substrate (9), a first chip (4), a second chip (5), an electronic component (12), a wiring portion (W22), and a resin layer (8). The mounting substrate (9) has a main surface (91). The first chip (4) includes at least one of a plurality of first acoustic wave resonators (14) of the first filter (1). The first chip (4) is disposed on the main surface (91) of the mounting substrate (9). A second chip (5) includes at least one of a plurality of second acoustic wave resonators (24) of a second filter (2). The second chip (5) is disposed on a side of the first chip (4) opposite to the mounting substrate (9). The electronic component (12) is disposed on the main surface (91) of the mounting substrate (9). The electronic component (12) has a first electrode (121) that is located on a main surface (91) side of the mounting substrate (9) and a second electrode (122) that is located on a side opposite to the main surface (91) side. The wiring portion (W22) connects the second filter (2) and the electronic component (12) to each other. The first chip (4) has a first main surface (41) on the second chip (5) side and a second main surface (42) on the mounting substrate (9) side. The second chip (5) includes a third main surface (51) on the first chip (4) side and a fourth main surface (52) on a side opposite to the first chip (4) side. A circuit element (inductor L1) related to the first filter (1) is disposed on the second main surface (42) side of the first chip (4). The resin layer (8) is disposed on the main surface (91) of the mounting substrate (9). The resin layer (8) covers at least a part of an outer peripheral surface (43) of the first chip (4), at least a part of an outer peripheral surface (53) of the second chip (5), and at least a part of an outer peripheral surface (123) of the electronic component (12). The wiring portion (W22) is a conductor pattern portion. The wiring portion (W22) is provided over the fourth main surface (52) of the second chip (5), the main surface (81) of the resin layer (8) on a side opposite to the mounting substrate (9) side, and the second electrode (122) of the electronic component (12).

According to the high-frequency module (100*t*) of the twentieth aspect, it is possible to suppress the deterioration of the characteristics while achieving reduction in size.

1 FIRST FILTER
14 FIRST ACOUSTIC WAVE RESONATOR
140 FIRST FUNCTIONAL ELECTRODE
15 FIRST INPUT/OUTPUT TERMINAL
16 SECOND INPUT/OUTPUT TERMINAL
17 FIRST GROUND TERMINAL
18 FIRST CONNECTION TERMINAL
19 TERMINAL
2 SECOND FILTER
24 SECOND ACOUSTIC WAVE RESONATOR
240 SECOND FUNCTIONAL ELECTRODE
25 THIRD INPUT/OUTPUT TERMINAL
26 FOURTH INPUT/OUTPUT TERMINAL
27 SECOND GROUND TERMINAL
27A SECOND GROUND TERMINAL
27B SECOND GROUND TERMINAL
28 SECOND CONNECTION TERMINAL
28A SECOND CONNECTION TERMINAL
28B SECOND CONNECTION TERMINAL
29 CONNECTION TERMINAL
29A FIRST CONNECTION ELECTRODE
29B SECOND CONNECTION ELECTRODE
3 THIRD FILTER
34 THIRD ACOUSTIC WAVE RESONATOR
4 FIRST CHIP
40 OUTER EDGE
41 FIRST MAIN SURFACE
42 SECOND MAIN SURFACE
43 OUTER PERIPHERAL SURFACE
45 FIRST SUBSTRATE
451 FIRST MAIN SURFACE
452 SECOND MAIN SURFACE
46 FIRST HIGH ACOUSTIC VELOCITY MEMBER
47 FIRST LOW ACOUSTIC VELOCITY FILM
48 FIRST PIEZOELECTRIC LAYER
49 THROUGH-WIRING PORTION
400 FIRST JOINING METAL LAYER
5 SECOND CHIP
50 OUTER EDGE
51 THIRD MAIN SURFACE
52 FOURTH MAIN SURFACE
53 OUTER PERIPHERAL SURFACE
54 RECESS PORTION
55 SECOND SUBSTRATE
551 THIRD MAIN SURFACE
552 FOURTH MAIN SURFACE
56 SECOND HIGH ACOUSTIC VELOCITY MEMBER
57 SECOND LOW ACOUSTIC VELOCITY FILM
58 SECOND PIEZOELECTRIC LAYER
59A THROUGH-WIRING PORTION
59B THROUGH-WIRING PORTION
500 SECOND JOINING METAL LAYER
6 EXTERNAL CONNECTION TERMINAL
7 INSULATING LAYER
70 OUTER EDGE
71 MAIN SURFACE
73 OUTER PERIPHERAL SURFACE
75 CAVITY
7A INSULATING LAYER
8 RESIN LAYER
81 MAIN SURFACE
83 OUTER PERIPHERAL SURFACE
9 MOUNTING SUBSTRATE
91 MAIN SURFACE (FIRST MAIN SURFACE)
92 SECOND MAIN SURFACE
93 OUTER PERIPHERAL SURFACE
95 CONDUCTOR PATTERN PORTION
96 CONDUCTOR PORTION
10 METAL ELECTRODE LAYER
111 CAVITY
112 OPENING EDGE
113 CAVITY
114 OPENING EDGE
11 ELECTRONIC COMPONENT
12 ELECTRONIC COMPONENT
121 FIRST ELECTRODE
122 SECOND ELECTRODE
123 OUTER PERIPHERAL SURFACE
13 ELECTRONIC COMPONENT
131 FIRST ELECTRODE
132 SECOND ELECTRODE
100, 100*a*, 100*b*, 100*c*, 100*d*, 100*e*, 100*f*, 100*g*, 100*h*, 100*i*, 100*j*, 100*k*, 100*m*, 100*n*, 100*p*, 100*q*, 100*r*, 100*s* HIGH-FREQUENCY MODULE
134 HOLLOW SPACE
135 SHIELD ELECTRODE
1351 FIRST SHIELD PORTION
1352 SECOND SHIELD PORTION
138 CAVITY
150 METAL MEMBER
151 FIRST END FACE
152 SECOND END FACE
153 OUTER PERIPHERAL SURFACE
155 OUTER EDGE
160 CONDUCTOR PATTERN PORTION
161 FIRST CONDUCTOR PATTERN PORTION
162 SECOND CONDUCTOR PATTERN PORTION
163 CONDUCTOR PORTION
170 CONDUCTOR PATTERN PORTION
175 OUTER EDGE
180 JOINING PORTION
211 THROUGH-WIRING PORTION
221 to 227 VIA CONDUCTOR
231 to 234 FIRST CONDUCTOR PORTION
241 to 244 SECOND CONDUCTOR PORTION
250 VIA CONDUCTOR
251 CONNECTION VIA CONDUCTOR
291 THROUGH-WIRING PORTION
A2 WINDING AXIS
C1 CAPACITOR
C21 CAPACITOR (SECOND CIRCUIT ELEMENT)
C22 CAPACITOR (SECOND CIRCUIT ELEMENT)
C23 CAPACITOR (SECOND CIRCUIT ELEMENT)
C24 CAPACITOR (SECOND CIRCUIT ELEMENT)
D0 THICKNESS DIRECTION
D1 FIRST DIRECTION
D2 SECOND DIRECTION
Dp1 DUPLEXER
L1 INDUCTOR (FIRST INDUCTOR, FIRST CIRCUIT ELEMENT)
L2 INDUCTOR (SECOND INDUCTOR, SECOND CIRCUIT ELEMENT)
L10 INDUCTOR (FIRST CIRCUIT ELEMENT)

L20 INDUCTOR (SECOND CIRCUIT ELEMENT)
P11 to P14 PARALLEL ARM RESONATOR (FIRST PARALLEL ARM RESONATOR)
P21 to P24 PARALLEL ARM RESONATOR (SECOND PARALLEL ARM RESONATOR)
Ru1 SIGNAL PATH (FIRST SIGNAL PATH)
Ru11 PARALLEL ARM PATH
Ru12 PARALLEL ARM PATH
Ru13 PARALLEL ARM PATH
Ru14 PARALLEL ARM PATH
Ru2 SIGNAL PATH (SECOND SIGNAL PATH)
Ru21 PARALLEL ARM PATH
Ru22 PARALLEL ARM PATH
Ru23 PARALLEL ARM PATH
Ru24 PARALLEL ARM PATH
S11 to S14 SERIES ARM RESONATOR (FIRST SERIES ARM RESONATOR)
S21 to S24 SERIES ARM RESONATOR (SECOND SERIES ARM RESONATOR)
ST1 STACK STRUCTURE
T1 FIRST TERMINAL ELECTRODE
T2 SECOND TERMINAL ELECTRODE
T3 THIRD TERMINAL ELECTRODE
T4 FOURTH TERMINAL ELECTRODE
W20 WIRING PORTION
W22 WIRING PORTION
W25 WIRING PORTION

The invention claimed is:

1. A high-frequency module comprising:
a mounting substrate having a main surface;
a first chip including at least one of a plurality of first acoustic wave resonators of a first filter and disposed on the mounting substrate; and
a second chip including at least one of a plurality of second acoustic wave resonators of a second filter and disposed as facing a surface of the first chip opposite to the mounting substrate,
wherein the first chip has a first main surface facing the second chip and a second main surface facing the mounting substrate,
the second chip has a third main surface facing the first chip and a fourth main surface opposite to the first chip,
a first circuit element related to the first filter is disposed as facing the second main surface of the first chip, and
a second circuit element related to the second filter is disposed as facing the fourth main surface of the second chip.

2. The high-frequency module according to claim 1,
wherein the first filter is a ladder filter having the plurality of first acoustic wave resonators,
the first filter further includes a first input/output terminal and a second input/output terminal,
the plurality of first acoustic wave resonators includes a plurality of first series arm resonators provided on a first signal path between the first input/output terminal and the second input/output terminal, and a plurality of first parallel arm resonators connected between the first signal path and a first ground,
the second filter is a ladder filter having the plurality of second acoustic wave resonators,
the second filter further includes a third input/output terminal and a fourth input/output terminal,
the plurality of second acoustic wave resonators includes a plurality of second series arm resonators provided on a second signal path between the third input/output terminal and the fourth input/output terminal, and a plurality of second parallel arm resonators connected between the second signal path and a second ground,
the first circuit element includes a first inductor connected between one of the plurality of first parallel arm resonators and the first ground, and
the second circuit element includes a second inductor connected between one of the plurality of second parallel arm resonators and the second ground.

3. The high-frequency module according to claim 2, further comprising:
a resin layer disposed on the main surface of the mounting substrate and covering at least a part of an outer peripheral surface of the first chip and at least a part of an outer peripheral surface of the second chip; and
a metal electrode layer covering at least a part of the resin layer,
wherein the second inductor is connected to the second ground with the metal electrode layer interposed therebetween.

4. The high-frequency module according to claim 1,
wherein the second filter is a ladder filter having the plurality of second acoustic wave resonators,
the second filter further has a pair of input/output terminals,
the plurality of second acoustic wave resonators includes a plurality of series arm resonators provided on a signal path between the pair of input/output terminals, and a plurality of parallel arm resonators connected between the signal path and a ground,
the second circuit element includes an inductor connected between one of the plurality of parallel arm resonators and the ground, and
in a plan view from a thickness direction of the mounting substrate, the inductor overlaps one or more parallel arm resonators of the plurality of parallel arm resonators and does not overlap any of the plurality of series arm resonators.

5. The high-frequency module according to claim 1, further comprising:
a shield electrode disposed between the first chip and the second chip,
wherein the first circuit element includes a first inductor,
the second circuit element includes a second inductor, and
the first inductor and the second inductor overlap the shield electrode in a thickness direction of the mounting substrate.

6. The high-frequency module according to claim 1, further comprising:
a metal member disposed on the fourth main surface of the second chip;
an insulating layer disposed on the fourth main surface of the second chip and covering at least a part of an outer peripheral surface of the metal member and at least a part of the second circuit element;
a resin layer disposed on the main surface of the mounting substrate and covering at least a part of an outer peripheral surface of the first chip, at least a part of an outer peripheral surface of the second chip, and at least a part of an outer peripheral surface of the insulating layer; and
a metal electrode layer covering at least a part of the insulating layer and at least a part of the resin layer,
wherein the metal member is in contact with the metal electrode layer.

7. The high-frequency module according to claim 1, further comprising:

a metal member disposed on the fourth main surface of the second chip;

an insulating layer disposed on the fourth main surface of the second chip and covering at least a part of an outer peripheral surface of the metal member and at least a part of the second circuit element;

a resin layer disposed on the main surface of the mounting substrate and covering at least a part of an outer peripheral surface of the first chip, at least a part of an outer peripheral surface of the second chip, and at least a part of an outer peripheral surface of the insulating layer; and a metal electrode layer covering at least a part of the insulating layer and at least a part of the resin layer, wherein the metal member is in contact with the metal electrode layer, the first chip further includes a plurality of first terminal electrodes connected to the mounting substrate and a plurality of second terminal electrodes connected to the second chip, the second chip further includes a plurality of third terminal electrodes connected to the plurality of second terminal electrodes, and in a plan view from a thickness direction of the mounting substrate, the metal member is larger than each of the plurality of third terminal electrodes.

8. The high-frequency module according to claim 1, wherein the second circuit element includes an inductor disposed on the fourth main surface of the second chip, and a winding axis of the inductor is parallel to the fourth main surface of the second chip.

9. The high-frequency module according to claim 1, further comprising:

a resin layer disposed on the main surface of the mounting substrate and covering at least a part of an outer peripheral surface of the first chip and at least a part of an outer peripheral surface of the second chip; and a metal electrode layer covering at least a part of the resin layer and at least a part of the fourth main surface of the second chip, wherein the second filter is a ladder filter having the plurality of second acoustic wave resonators, the second filter further includes a pair of input/output terminals, the plurality of second acoustic wave resonators includes a plurality of series arm resonators provided on a signal path between the pair of input/output terminals and a plurality of parallel arm resonators connected between the signal path and a ground, the second circuit element includes an inductor connected between one of the plurality of parallel arm resonators and the ground, the metal electrode layer is in contact with a part of the fourth main surface of the second chip, and the inductor is disposed on the fourth main surface of the second chip and is connected to the ground with the metal electrode layer interposed therebetween.

10. The high-frequency module according to claim 1, further comprising:

an insulating layer disposed on the fourth main surface of the second chip and covering at least a part of the second circuit element;

a via conductor penetrating the insulating layer and connected to the second circuit element;

a resin layer disposed on the main surface of the mounting substrate and covering at least a part of an outer peripheral surface of the first chip, at least a part of an outer peripheral surface of the second chip, and at least a part of an outer peripheral surface of the insulating layer; and a metal electrode layer covering at least a part of the insulating layer, a part of the via conductor, and at least a part of the resin layer, wherein the second filter is a ladder filter having the plurality of second acoustic wave resonators, the second filter further includes a pair of input/output terminals, the plurality of second acoustic wave resonators includes a plurality of series arm resonators provided on a signal path between the pair of input/output terminals and a plurality of parallel arm resonators connected between the signal path and the ground, the second circuit element includes an inductor connected between one of the plurality of parallel arm resonators and the ground, and the second circuit element is disposed in a recess portion provided on the fourth main surface of the second chip.

11. The high-frequency module according to claim 1, wherein the second filter is a ladder filter having the plurality of second acoustic wave resonators, the second filter further includes a pair of input/output terminals, the plurality of second acoustic wave resonators includes a plurality of series arm resonators provided on a signal path between the pair of input/output terminals and a plurality of parallel arm resonators connected between the signal path and a ground, the second circuit element includes an inductor connected in parallel to one of the plurality of series arm resonators, and in a plan view from a thickness direction of the mounting substrate, the inductor overlaps at least one of two parallel arm resonators directly connected to the inductor among the plurality of parallel arm resonators and also overlaps the one of the plurality of series arm resonators, and does not overlap any of remaining second acoustic wave resonators among the plurality of second acoustic wave resonators.

12. The high-frequency module according to claim 1, wherein the second filter is a ladder filter having the plurality of second acoustic wave resonators, the second filter further includes a pair of input/output terminals, the plurality of second acoustic wave resonators includes a plurality of series arm resonators provided on a signal path between the pair of input/output terminals, and a plurality of parallel arm resonators connected between the signal path and a ground, the second circuit element includes a first conductor pattern portion being a part of an inductor connected in parallel to one of the plurality of series arm resonators, and a remaining portion of the inductor includes a second conductor pattern portion disposed on the third main surface of the second chip, and a conductor portion penetrating in a thickness direction of the second chip and connecting the first conductor pattern portion and the second conductor pattern portion to each other.

13. The high-frequency module according to claim 1, wherein the first filter is a ladder filter having the plurality of first acoustic wave resonators, the first filter further includes a first input/output terminal and a second input/output terminal, the plurality of first acoustic wave resonators includes a plurality of first series arm resonators provided on a first signal path between the first input/output terminal and the second input/output terminal, and a plurality of first parallel arm resonators connected between the first signal path and a first ground, the second filter is a ladder filter having the plurality of second acoustic wave resonators, the second filter further includes a third input/output terminal and a fourth input/output terminal, the plurality of second acoustic wave resonators includes a plurality of second series arm resonators provided on a second signal path between the third input/output terminal and the fourth input/output terminal, and a plurality of second parallel arm resonators connected between the second signal path and a second ground, the first circuit element includes a first inductor connected in parallel to one of the plurality of first series arm resonators, and the second circuit element includes a second inductor connected between one of the plurality of second parallel arm resonators and the ground.

14. The high-frequency module according to claim 1, wherein the first filter is a ladder filter having the plurality of first acoustic wave resonators, the first filter further includes a first input/output terminal and a second input/output terminal, the plurality of first acoustic wave resonators includes a plurality of first series arm resonators provided on a first signal path between the first input/output terminal and the second input/output terminal, and a plurality of first parallel arm resonators connected between the first signal path and a first ground, the second filter is a ladder filter having the plurality of second acoustic wave resonators, the second filter further includes a third input/output terminal and a fourth input/output terminal, the plurality of second acoustic wave resonators includes a plurality of second series arm resonators provided on a second signal path between the third input/output terminal and the fourth input/output terminal, and a plurality of second parallel arm resonators connected between the second signal path and a second ground, the first circuit element includes a capacitor connected between a first series arm resonator closest to the second input/output terminal among the plurality of first series arm resonators and the second input/output terminal, and the second circuit element includes an inductor connected between one of the plurality of second parallel arm resonators and the second ground.

15. The high-frequency module according to claim 1, wherein the second filter is a ladder filter having the plurality of second acoustic wave resonators, the second filter further includes a pair of input/output terminals, the plurality of second acoustic wave resonators includes a plurality of series arm resonators provided on a signal path between the pair of input/output terminals, and a plurality of parallel arm resonators connected between the signal path and a ground, and the second circuit element includes a capacitor connected in parallel to one of the plurality of parallel arm resonators.

16. The high-frequency module according to claim 1, wherein the second filter is a ladder filter having the plurality of second acoustic wave resonators, the second filter further includes a pair of input/output terminals, the plurality of second acoustic wave resonators includes a plurality of series arm resonators provided on a signal path between the pair of input/output terminals, and a plurality of parallel arm resonators connected between the signal path and a ground, and the second circuit element includes a wiring portion connecting one of the plurality of parallel arm resonators to a path between another parallel arm resonator of the plurality of parallel arm resonators and the ground.

17. The high-frequency module according to claim 1, wherein the first chip includes one or more second acoustic wave resonators different from the at least one of the plurality of second acoustic wave resonators, and the second chip includes one or more first acoustic wave resonators different from the at least one of the plurality of first acoustic wave resonators.

18. The high-frequency module according to claim 1, wherein the first chip includes one or more second acoustic wave resonators different from the at least one of the plurality of second acoustic wave resonators, and the second chip further includes a plurality of third acoustic wave resonators of the third filter.

19. The high-frequency module according to claim 1, wherein the first circuit element is provided on the mounting substrate.

20. A high-frequency module comprising:

a mounting substrate having a main surface;

a first chip including at least one of a plurality of first acoustic wave resonators of a first filter and disposed on the main surface of the mounting substrate;

a second chip including at least one of a plurality of second acoustic wave resonators of a second filter and disposed as facing a surface of the first chip opposite to the mounting substrate;

an electronic component disposed on the main surface of the mounting substrate and including a first electrode facing the main surface of the mounting substrate and a second electrode facing a surface of the mounting substrate opposite to the main surface;

a wiring portion connecting the second filter to the electronic component; and a resin layer, wherein the first chip has a first main surface facing the second chip and a second main surface facing the mounting substrate, the second chip has a third main surface facing the first chip and a fourth main surface opposite to the first chip, a circuit element related to the first filter is disposed as facing the second main surface of the first chip, the resin layer is disposed on the main surface of the mounting substrate and covers at least a part of an outer peripheral surface of the first chip, at least a part of an outer peripheral surface of the second chip, and at least a part of an outer peripheral surface of the electronic component, and the wiring portion includes a conductor pattern portion provided across the fourth main surface of the second chip, a main surface of the resin layer opposite to the mounting substrate, and the second electrode of the electronic component.

* * * * *